United States Patent [19]

Sennenbara et al.

[11] Patent Number: 5,574,297
[45] Date of Patent: Nov. 12, 1996

[54] GATE TURNOFF THYRISTOR WITH REDUCED GATE TRIGGER CURRENT

[75] Inventors: Nozomu Sennenbara; Kouji Niinobu; Kazuhiko Niwayama; Futoshi Tokunoh, all of Fukuoka, Japan

[73] Assignee: Mitsubishi Denki Kabushiki Kaisha, Tokyo, Japan

[21] Appl. No.: 407,650

[22] Filed: Mar. 21, 1995

[30] Foreign Application Priority Data

Apr. 4, 1994 [JP] Japan ................................... 6-065949

[51] Int. Cl.$^6$ ............................ H01L 29/74; H01L 31/111
[52] U.S. Cl. .......................... 257/135; 257/138; 257/147; 257/149; 257/154
[58] Field of Search ........................ 257/135, 138, 257/147, 148, 149, 154

[56] References Cited

U.S. PATENT DOCUMENTS

| | | | |
|---|---|---|---|
| 5,028,974 | 7/1991 | Kitagawa et al. | 357/38 |
| 5,146,305 | 9/1992 | Bernier | 357/38 |
| 5,459,338 | 1/1995 | Takayanagi et al. | 257/119 |

FOREIGN PATENT DOCUMENTS 1-171272  7/1989  Japan ................................. 257/149

Primary Examiner—Ngân V. Ngô
Attorney, Agent, or Firm—Oblon, Spivak, McClelland, Maier & Neustadt, P.C.

[57] ABSTRACT

In order to compatibly implement improvement in withstand voltage and ON-state resistance as well as reduction in turnon loss and improvement in di/dt resistance, an n buffer layer (12) is locally exposed on a lower surface of a semiconductor substrate (160), while a polysilicon additional resistive layer (104) is formed to cover the exposed surface. An anode electrode (101) covering the lower surface of the semiconductor substrate (160) is connected to a p emitter layer (11) and the additional resistive layer (104). Thus, the n buffer layer (12) and the anode electrode (101) are connected with each other through the additional resistive layer (104), whereby a gate trigger current is reduced. Thus, turnon loss is reduced and di/dt resistance is increased. At the same time, the withstand voltage and the ON-state resistance are excellent due to provision of the n buffer layer (12). Thus, the turnon loss is reduced and the di/dt resistance is improved without deteriorating the withstand voltage and the ON-state resistance.

17 Claims, 55 Drawing Sheets

180

F/G.7

1201

1201

1201

1201

360

160

560

560

F I G. 5 2
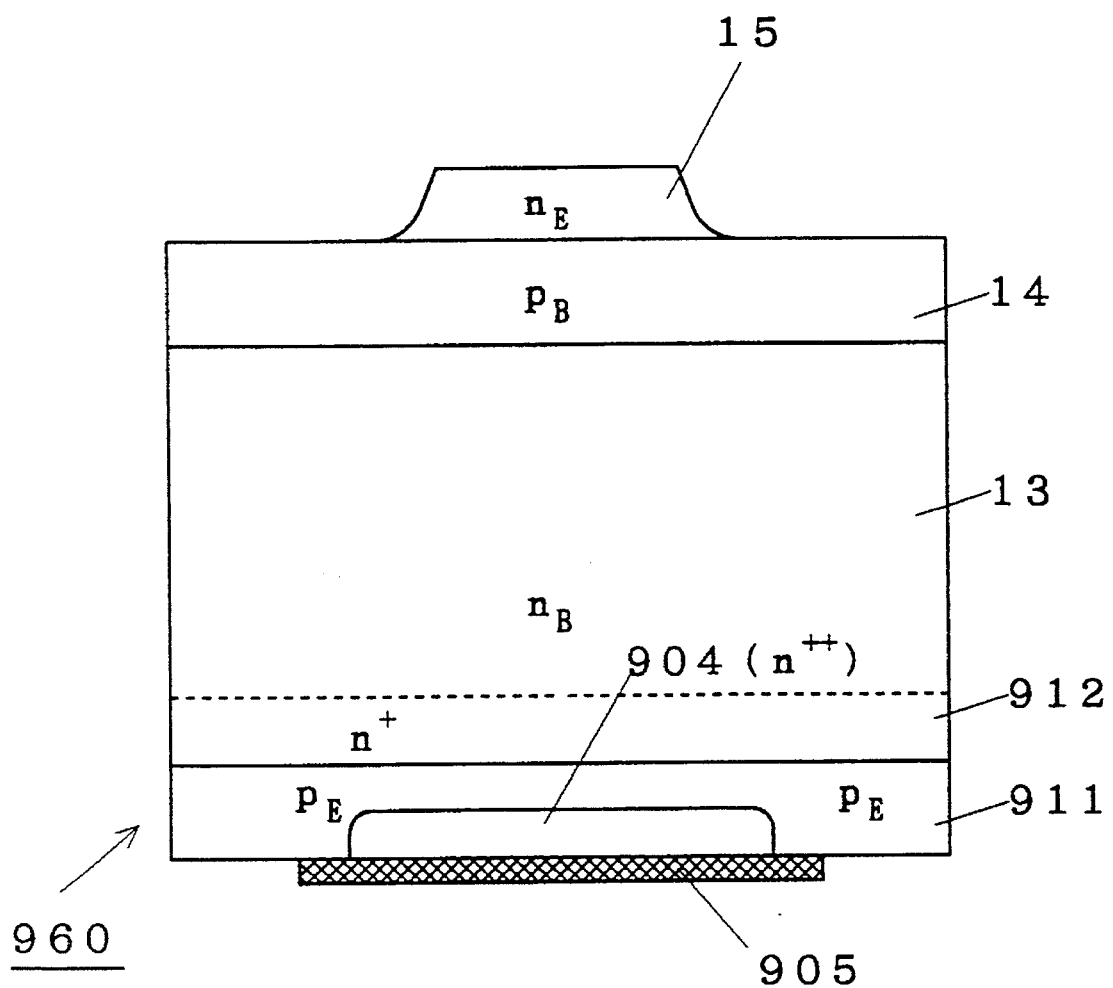

GATE TURNOFF THYRISTOR WITH REDUCED GATE TRIGGER CURRENT

BACKGROUND OF THE INVENTION

1. Field of the Invention

The present invention relates to a gate turnoff thyristor and a method of fabricating the same, and more particularly, it relates to an improvement for reducing a gate trigger current while maintaining a withstand voltage.

2. Background of the Invention

A gate turnoff thyristor (hereinafter referred to as a GTO) is a thyristor which can be not only turned on but turned off by proper application of a gate current. FIG. 54 illustrates a sectional structure of a conventional GTO 50. In this GTO 50, five semiconductor layers are formed in a substantially flat plate type silicon semiconductor substrate 60. Namely, a p emitter layer 11 containing a p-type impurity, an n buffer layer 12 containing an n-type impurity in high concentration, an n base layer 13 containing an n-type impurity in low concentration, a p base layer 14 containing a p-type impurity, and an n emitter layer 15 containing an n-type impurity are successively stacked from a lower major surface toward an upper major surface of the semiconductor substrate 60, thereby forming the so-called pnvpn structure.

The p emitter layer 11 is exposed on the lower major surface of the semiconductor substrate 60, while the n buffer layer 12 which is stacked on the p emitter layer 11 is selectively exposed on a portion immediately under the n emitter layer 15. An anode electrode 1 which is one of main electrodes serving as paths for the main current of the device is formed on the lower major surface of the semiconductor substrate 60, and this anode electrode 1 is in ohmic contact with the p emitter layer 11 as well as with the exposed surface of the n buffer layer 12. Namely, this GTO 50 is an exemplary GTO having the so-called anode short structure provided with an n+ buffer.

On the other hand, an upper surface of the p base layer 14 is exposed on the upper major surface of the semiconductor substrate 60, while the n emitter layer 15 which is selectively formed on the p base layer 14 upwardly projects from the upper major surface of the semiconductor substrate 60. A cathode electrode 2 which is another major electrode paired with the anode electrode 1 is formed on an upper surface of the n emitter layer 15, to be in ohmic contact with the n emitter layer 15. Further, gate electrodes 3 serving as paths for the gate current are formed on the exposed surface of the p base layer 14, to be in ohmic contact with the p base layer 14.

This GTO 50 can be equivalently expressed in a circuit diagram shown in FIG. 55. Namely, the GTO 50 has such a structure that a pnp transistor and an npn transistor are coupled with each other. Reflecting that a part of the n buffer layer 12 is connected to the anode electrode 1, a base and an emitter of the pnp transistor is short-circuited by a resistance corresponding to a sheet resistance $R_0$ of the n buffer layer 12. With reference to the equivalent circuit diagram shown in FIG. 55, the operation of the GTO 50 is now described.

In order to use the GTO 50, an external power source is first connected to apply a bias voltage across the anode electrode 1 and the cathode electrode 2 in a positive direction. In this state, a positive gate current $I_G$ is supplied from the gate electrode 3. At this time, the gate current $I_G$ serves as a base current of the npn transistor which is formed by the n buffer layer 12 and the n base layer 13, the p base layer 14 and the n emitter layer 15 until the same reaches a sufficiently high level, whereby a collector current $I_C$ of this npn transistor flows from the anode electrode 1 to the cathode electrode 2.

This collector current $I_C$ directly flows in the n buffer layer 12 from the anode electrode 1 through the contact surface with the n buffer layer 12. Thus, a voltage $E_0$ corresponding to a voltage drop which is developed in the sheet resistance $R_0$ through the flow of the collector current $I_C$ is applied across the p emitter layer 11 and the n buffer layer 12.

This voltage $E_0$ serves as a base-to-emitter voltage of the pnp transistor which is formed by the p emitter layer 11, the n buffer layer 12 and the n base layer 13, and the p base layer 14. When the gate current $I_G$ reaches a sufficiently high level and hence the base-to-emitter voltage $E_0$ exceeds a forward voltage which is specific to the junction between the p emitter layer 11 and the n buffer layer 12, therefore, an anode current $I_A$ flows from the anode electrode 1 to the p emitter layer 11.

This anode current $I_A$ increases the base current of the npn transistor, whereby the collector current $I_C$ of the npn transistor is increased. Consequently, a base current of the pnp transistor is increased, to further increase the anode current $I_A$. Namely, the anode current $I_A$ is steadily increased by a positive feedback action of the two transistors, whereby the GTO 50 finally conducts. Namely, the GTO 50 is turned on.

In this GTO 50, the n buffer layer 12 prevents a depletion layer from reaching the anode electrode 1, thereby increasing the withstand voltage of the GTO 50. The n buffer layer 12 also reduces the resistance upon such conduction of the GTO 50, i.e., an ON-state resistance, thereby advantageously reducing stationary loss. These effects further remarkably appear as the impurity concentration in the n buffer layer 12 is increased.

When the n buffer layer 12 has high impurity concentration, however, the aforementioned sheet resistance $R_0$ is reduced and hence the base-to-emitter voltage $E_0$ across the p emitter layer 11 and the n buffer layer 12 is reduced in response thereto. Consequently, the gate current $I_G$ which is required for turning on the GTO 50, i.e., a gate trigger current $I_{GT}$, is disadvantageously increased. When the gate trigger current $I_{GT}$ is thus increased, an initial turnon region in a process of turning on the GTO 50, i.e., a region implementing conduction in an initial turnon time, is reduced and hence a resistance, called a di/dt resistance, against an abruptly rising ON-state current which is generated in the initial turnon time is reduced. If the initial turnon region is reduced, further, power loss is increased in this region and the turnon time is increased, to increase turnon loss.

In the conventional GTO 50, as hereinabove described, it is difficult to compatibly implement improvement in withstand voltage and ON-state resistance as well as reduction in turnon loss and improvement in di/dt resistance.

SUMMARY OF THE INVENTION

According to a first aspect of the present invention, a gate turnoff thyristor comprises a semiconductor substrate having upper and lower surfaces, including a first emitter layer, a first base layer, a second base layer and a second emitter layer which are successively stacked from the lower surface side with conductivity types which are different from each other, and further includes a buffer layer, which is located between the first emitter layer and the first base layer, containing an impurity of the same conductivity type as the first base layer in higher concentration than the first base layer, and a first main electrode which is connected to the lower surface of the semiconductor substrate, a second main electrode which is connected to the upper surface of the semiconductor substrate, and a gate electrode which is connected to the second base layer, while the semiconductor substrate further includes a resistive layer, and the buffer layer is locally connected with the first main electrode through the resistive layer.

The GTO according to the first aspect of the present invention is provided with the buffer layer, whereby the GTO has a high withstand voltage and a low ON-state resistance. On the other hand, the buffer layer is connected with the first main electrode through the resistive layer, whereby the voltage across the first emitter layer and the buffer layer exceeds the forward voltage which is specific to the junction therebetween due to a low gate current. Namely, the value of the gate trigger current is reduced. Consequently, turnon loss is reduced and a di/dt resistance is improved. Namely, improvement in withstand voltage and ON-state resistance as well as reduction in turnon loss and improvement in di/dt resistance are compatibly implemented in the GTO according to the first aspect of the present invention.

Preferably, the resistance value of the resistive layer across the buffer layer and the first main electrode is about several 10 Å.

Preferably, the gate turnoff thyristor further comprises a first thermal compensator which is in contact with the first main electrode, a second thermal compensator which is in contact with the second main electrode, a first external electrode which is in contact with the first thermal compensator, a second external electrode which is in contact with the second thermal compensator, an envelope supporting the first and second external electrodes for outwardly exposing outer end surfaces of the first and second external electrodes and storing the semiconductor substrate and the first and second thermal compensators, and an external gate electrode having an end which is outwardly exposed from the envelope and another end which is connected to the gate electrode, while the first and second external electrodes substantially consist of copper, and the first and second thermal compensators substantially consist of conductors having thermal expansion coefficients which are at intermediate values of those of the semiconductor substrate and the first and second external electrodes.

Preferably, the ratio of a resistance in the resistive layer to a sheet resistance in the buffer layer is in the range of 1 to 5.

The resistance ratio is set at a value exceeding 1, whereby the gate trigger current is at a value which is not more than that in a GTO having no buffer layer. Further, the resistance ratio is further limited at a value which is not more than 5, whereby turnoff loss is suppressed in a practically allowable range. Namely, turnon loss is sufficiently reduced and a di/dt resistance is sufficiently improved with suppression of turnoff loss in a practical range in the GTO according to the first aspect of the present invention.

Preferably, the buffer layer and the resistive layer are connected with each other around a portion immediately under a central portion of the second emitter layer.

The buffer layer and the resistive layer are connected with each other in the portion immediately under that around the central portion of the second emitter layer, whereby concentration of the main current to the central portion of the second emitter layer is relaxed in a turnoff time. Thus, turnoff loss is reduced.

Preferably, the gate electrode is arranged to be opposed to the first main electrode, while the buffer layer and the resistive layer are connected with each other in a portion immediately under the gate electrode.

The buffer layer and the resistive layer are connected with each other in the poriton immediately under the gate electrode, whereby carriers can be readily injected from a portion of the first emitter layer corresponding to that immediately under the second emitter layer. Consequently, the turnon time is reduced, whereby turnon loss is further reduced.

Preferably, the resistive layer substantially consists of a polycrystalline semiconductor containing an impurity.

The resistive layer substantially consists of a polycrystalline semiconductor containing the impurity, whereby it is possible to readily adjust resistivity and set the thickness and the shape. Namely, it is possible to set the resistance value in the resistive layer at a desired level.

Preferably, the resistive layer extends over the junction between the buffer layer and the first emitter layer to be connected to a partial region of the first emitter layer which is adjacent to the junction, while the first main electrode is connected with the resistive layer in a portion which is retracted from the junction toward the first emitter layer.

The resistive layer extends over the junction between the buffer layer and the first emitter layer to be also connected to a partial region on the first emitter layer side which is adjacent to the junction while the first main electrode is connected with the resistive layer in a portion retracted from the junction toward the first emitter layer, whereby a resistance along the connection surface between the resistive layer and the first emitter layer, i.e., a transverse resistance, contributes to that across the first main electrode and the buffer layer. Therefore, it is possible to readily obtain a high resistance value by setting the resistive layer at a small thickness. Further, it is also possible to readily finely adjust the resistance value by adjusting the distance of retraction from the junction in the first main electrode. Namely, it is possible to readily obtain a resistance value of a desired level.

Preferably, the resistive layer contains an impurity in higher concentration than the buffer layer, and substantially consists of a semiconductor layer which is isometric with the semiconductor substrate.

The resistive layer substantially consists of an isometric semiconductor layer which is formed by diffusion of the impurity in the semiconductor substrate or by epitaxial growth on the surface of the semiconductor substrate, for example, and contains the impurity in higher concentration than the buffer layer, whereby resistivity in the resistive layer is lower than that in the buffer layer. Therefore, it is possible to set the resistive layer in a small thickness for obtaining a practically necessary resistance value.

Preferably, the surface of the first main electrode is not outwardly protrusive beyond a region which is connected to the first emitter layer in a portion connected to the resistive layer.

The surface of the first main electrode is not outwardly protrusive beyond the region connected to the first emitter layer in the portion connected to the resistive layer, whereby no protrusion is formed on the first main electrode. Thus, no stress concentration is caused when an external electrode or the like is pressed against the first main electrode, whereby the GTO is prevented from breakage caused by excessive stress. Due to formation of no protrusion, further, it is possible to attain excellent electric and thermal contact with the external electrode or the like.

Preferably, a connection surface between the resistive layer and the first main electrode is not protrusive from that between the first emitter layer and the first main electrode.

The connection surface between the resistive layer and the first main electrode is not protrusive from that between the first emitter layer and the first main electrode, whereby no protrusion is formed on the surface of the first main electrode and it is not necessary to vary the thickness of the first main electrode with its portions.

Preferably, the second emitter layer is formed in a shape unidirectionally extending along the upper surface of the semiconductor substrate, while the buffer layer and the resistive layer are connected with each other in a portion immediately under that around a central portion of the second emitter layer along a strip region which is perpendicular to the longitudinal direction of the second emitter layer.

The junction between the buffer layer and the resistive layer is located in the portion immediately under that around the central portion of the second emitter layer, whereby concentration of the main current to the central portion of the second emitter layer is relaxed in a turnoff time. Further, the strip-shaped junction intersects with the second emitter layer, whereby no high accuracy is required for alignment of mask patterns.

Preferably, an insulating film is formed over the junction between the buffer layer and the first emitter which is exposed on the surface of the semiconductor substrate and in the vicinity thereof, and a conductive layer is connected to a surface of the buffer layer to be separated from the first main electrode with a clearance on a surface of the insulating film, while the resistive layer is so formed as to connect the first main electrode and the conductive layer with each other in the clearance.

The resistive layer is formed in the clearance between the first main electrode and the conductive layer, whereby a high resistance value can be readily attained by forming the resistive layer with a small thickness. Further, it is also possible to readily finely adjust the resistance value by adjusting the width of the clearance. Namely, it is possible to readily obtain a resistance value of a desired level.

Preferably, the resistive layer contains an impurity of the same conductivity type with the buffer layer in higher concentration than the buffer layer and substantially consists of a semiconductor layer which is selectively formed on the lower surface of the semiconductor substrate in a unidirectionally extending shape, and the resistive layer is connected with the buffer layer only in its central portion while being connected with the first main electrode only in its both end portions.

The resistive layer has a unidirectionally extending shape to be connected with the buffer layer only in its central portion and connected with the first main electrode only in its both end portions, whereby a transverse resistance of the resistive layer contributes to the resistance across the first main electrode and the buffer layer. Thus, it is possible to readily obtain a high resistance value by setting the resistive layer in a small thickness. It is also possible to readily finely adjust the resistance value by adjusting the length of the resistive layer. Further, the resistive layer consists substantially of the semiconductor layer containing the impurity in higher concentration than the buffer layer, whereby the resistive layer can be set in a small thickness.

Preferably, the second emitter layer is formed in a shape unidirectionally extending along the upper surface of the semiconductor substrate, and the buffer layer is formed to be exposed on the lower surface of the semiconductor substrate in a portion immediately under that around a central portion of the second emitter layer along a strip region which is perpendicular to the longitudinal direction of the second emitter layer, while the resistive layer is formed in a portion which is immediately under the second emitter layer along the longitudinal direction of the second emitter layer.

The strip-shaped surface of the buffer layer intersects with the resistive layer in the portion immediately under that around the central portion of the second emitter layer, whereby the junction therebetween is located on this portion. Thus, concentration of the main current to the central portion of the second emitter layer is relaxed in a turnoff time. Further, the strip-shaped exposed surface of the buffer layer is formed to be perpendicular to the resistive layer, whereby no high accuracy is required for alignment of mask patterns for forming the same.

The present invention is also directed to a method of fabricating a gate turnoff thyristor. According to a second aspect of the present invention, a method of fabricating a gate turnoff thyristor having a first main electrode and a buffer layer which are connected with each other through a resistive layer comprises (a) a step of preparing a semiconductor substrate containing a first conductivity type impurity, (b) a step of introducing a second conductivity type impurity into an upper surface of the semiconductor substrate, thereby bringing the semiconductor substrate into a structure having a first conductivity type first base layer and a second conductivity type second base layer which is stacked thereon, (c) a step of introducing a first conductivity type impurity into a lower surface of the first base layer in high concentration, thereby forming the buffer layer, (d) a step of selectively introducing a first conductivity type impurity into an upper surface of the second base layer, thereby forming a second emitter layer, (e) a step of selectively introducing a second conductivity type impurity into a lower surface of the buffer layer, thereby forming a first emitter layer for locally exposing the buffer layer on a lower surface of the semiconductor substrate, (f) a step of depositing a polycrystalline semiconductor film containing a first conductivity type impurity on the lower surface of the semiconductor substrate by chemical vapor deposition, (g) a step of selectively removing the polycrystalline semiconductor film for selectively leaving the polycrystalline semiconductor film on an exposed surface of the buffer layer and a portion of the first emitter layer which is adjacent to its periphery as the result, thereby forming the resistive layer, (h) a step of connecting the first main electrode to cover the lower surface of the semiconductor substrate including the resistive layer, (i) a step of connecting a second main electrode to an upper surface of the second emitter layer, and (j) a step of connecting a gate electrode to the second base layer.

In the fabrication method according to the second aspect of the present invention, the polycrystalline semiconductor containing the impurity is deposited and thereafter selectively removed for forming the resistive layer, whereby it is possible to readily set the thickness and the shape of the resistive layer. Further, the polycrystalline semiconductor is deposited by chemical vapor deposition, whereby impurity concentration can be readily adjusted. Therefore, the resistivity of the resistive layer can be readily adjusted. Namely, it is possible to readily set the resistance value in the resistive layer at a desired level in this fabrication method.

According to a third aspect of the present invention, a method of fabricating a gate turnoff thyristor having a first main electrode and a buffer layer which are connected with each other through a resistive layer comprises (a) a step of preparing a semiconductor substrate containing a first conductivity type impurity, (b) a step of introducing a second conductivity type impurity into an upper surface of the semiconductor substrate, thereby bringing the semiconductor substrate into a structure having a first conductivity type first base layer and a second conductivity type second base layer which is stacked thereon, (c) a step of introducing a first conductivity type impurity into a lower surface of the first base layer in high concentration, thereby forming the buffer layer, (d) a step of selectively introducing a first conductivity type impurity into an upper surface of the second base layer, thereby forming a second emitter layer, (e) a step of selectively introducing a second conductivity type impurity into a lower surface of the buffer layer, thereby forming a first emitter layer for locally exposing the buffer layer on a lower surface of the semiconductor substrate, (f) a step of selectively making epitaxial growth on an exposed surface of the buffer layer and a portion of the first emitter layer which is adjacent to its periphery, thereby selectively forming a semiconductor film containing the first conductivity type impurity as the resistive layer, (g) a step of selectively forming the first main electrode to be connected to a portion of the resistive layer which is separated from the exposed surface of the buffer layer and an exposed surface of the first emitter layer, (h) a step of connecting a second main electrode to an upper surface of the second emitter layer, and (i) a step of connecting a gate electrode to the second base layer.

In the fabrication method according to the third aspect of the present invention, the resistive layer containing the impurity is formed by epitaxial growth. Therefore, it is possible to readily set impurity concentration in the resistive layer regardless of that in the buffer layer. Further, it is possible to adjust the impurity concentration in a wide range, whereby the resistance value in the resistive layer can be set in a wide range.

According to a fourth aspect of the present invention, a method of fabricating a gate turnoff thyristor having a first main electrode and a buffer layer which are connected with each other through a resistive layer comprises (a) a step of preparing a semiconductor substrate containing a first conductivity type impurity, (b) a step of introducing a second conductivity type impurity into an upper surface of the semiconductor substrate, thereby bringing the semiconductor substrate into a structure having a first conductivity type first base layer and a second conductivity type second base layer which is stacked thereon, (c) a step of introducing a first conductivity type impurity into a lower surface of the first base layer in high concentration, thereby forming the buffer layer, (d) a step of selectively introducing a first conductivity type impurity into an upper surface of the second base layer, thereby forming a second emitter layer, (e) a step of selectively introducing a second conductivity type impurity into a lower surface of the buffer layer, thereby forming a first emitter layer for locally exposing the buffer layer on a lower surface of the semiconductor substrate, (f) a step of selectively forming an oxide film as a screen film except a prescribed region which is defined by an exposed surface of the buffer layer and a portion of the first emitter layer adjacent to its periphery, (g) a step of performing chemical vapor deposition thereby selectively depositing an oxide film of a first conductivity type impurity on the prescribed region of the lower surface of the semiconductor substrate, (h) a step of selectively diffusing the first conductivity type impurity from the oxide film of the impurity into the lower surface of the semiconductor substrate, thereby selectively forming a first conductivity type semiconductor layer as the resistive layer, (i) a step of removing the screen film and the oxide film of the impurity, (j) a step of selectively forming a first main electrode to be connected to a part of a lower surface of the resistive layer and a lower surface of the first emitter layer so that an end portion thereof is retracted from that of the first emitter layer, (k) a step of connecting a second main electrode to an upper surface of the second emitter layer, and (l) a step of connecting a gate electrode to the second base layer.

In the fabrication method according to the fourth aspect of the present invention, the resistive layer containing the impurity diffuses the impurity in the semiconductor substrate after the oxide film of a first conductivity type impurity such as phosphorus, for example, is deposited. Therefore, it is possible to form the resistive layer in a small thickness at a practically required degree.

According to a fifth aspect of the present invention, a method of fabricating a gate turnoff thyristor having a first main electrode and a buffer layer which are connected with each other through a resistive layer comprises (a) a step of preparing a semiconductor substrate containing a first conductivity type impurity, (b) a step of introducing a second conductivity type impurity into an upper surface of the semiconductor substrate, thereby bringing the semiconductor substrate into a structure having a first conductivity type first base layer and a second conductivity type second base layer which is stacked thereon, (c) a step of introducing a first conductivity type impurity into a lower surface of the first base layer in high concentration, thereby forming the buffer layer, (d) a step of selectively introducing a first conductivity type impurity into an upper surface of the second base layer, thereby forming a second emitter layer in a shape unidirectionally extending along the upper surface of the second base layer, (e) a step of selectively introducing a second conductivity type impurity into a lower surface of the buffer layer, thereby selectively forming a first emitter layer for exposing the buffer layer on a lower surface of the semiconductor substrate in the form of a strip which is perpendicular to the longitudinal direction of the second emitter layer in a portion substantially immediately under a central portion of the second emitter layer, (f) a step of selectively forming the resistive layer to cover the strip-shaped exposed surface and a portion of the first emitter layer which is adjacent to its periphery, (g) a step of connecting the first main electrode to at least a part of a surface of the resistive layer and an exposed surface of the first emitter layer, (h) a step of connecting a second main electrode to an upper surface of the second emitter layer, and (i) a step of connecting a gate electrode to the second base layer.

In the fabrication method according to the fifth aspect of the present invention, the junction between the resistive layer and the buffer layer is formed to intersect with the second emitter layer, whereby it is possible to readily form the resistive layer in the portion immediately under the second emitter layer without precisely aligning a position for forming the second emitter layer with that for selectively forming the first emitter layer. No strict accuracy is required for alignment of mask patterns for forming the same, for example.

According to a sixth aspect of the present invention, a method of fabricating a gate turnoff thyristor having a first main electrode and a buffer layer which are connected with each other through a resistive layer comprises (a) a step of preparing a semiconductor substrate containing a first conductivity type impurity, (b) a step of introducing a second conductivity type impurity into an upper surface of the semiconductor substrate, thereby bringing the semiconductor substrate into a structure having a first conductivity type first base layer and a second conductivity type second base layer which is stacked thereon, (c) a step of introducing a first conductivity type impurity into a lower surface of the first base layer in high concentration, thereby forming the buffer layer, (d) a step of selectively introducing a first conductivity type impurity into an upper surface of the second base layer, thereby forming a second emitter layer in a shape unidirectionally extending along the upper surface of the second base layer, (e) a step of selectively introducing a second conductivity type impurity into a lower surface of the buffer layer, thereby selectively forming a first emitter layer for exposing the buffer layer on a lower surface of the semiconductor substrate with the form of a strip which is perpendicular to the longitudinal direction of the second emitter layer in a portion which is substantially immediately under a central portion of the second emitter layer, (f) a step of selectively introducing a first conductivity type impurity into a lower surface of the semiconductor substrate for forming a semiconductor layer which is selectively exposed on the lower surface with a shape extending along the longitudinal direction of the second emitter layer in a portion immediately under the second emitter layer as the resistive layer, thereby connecting the resistive layer with the buffer layer in a substantially central portion of the resistive layer, (g) a step of connecting the first main electrode to both end portions of an exposed surface of the resistive layer and an exposed surface of the first emitter layer, (h) a step of connecting a second main electrode to an upper surface of the second emitter layer, and (i) a step of connecting a gate electrode to the second base layer.

In the fabrication method according to the sixth aspect of the present invention, the first emitter layer is so formed that the buffer layer is exposed on the lower surface of the semiconductor substrate in the form of a strip which is perpendicular to the longitudinal direction of the second emitter layer in the portion substantially immediately under the central portion thereof while the resistive layer is formed immediately under the second emitter layer along its longitudinal direction, whereby it is possible to readily set the junction between the buffer layer and the resistive layer in the portion substantially immediately under the central portion of the second emitter layer without precisely aligning the position for forming the first emitter layer and that for forming the resistive layer.

Accordingly, an object of the present invention is to provide a gate turnoff thyristor which compatibly implements improvement in withstand voltage and ON-state resistance as well as reduction in turnon loss and improvement in di/dt resistance.

Another object of the present invention is to provide a method which is suitable for fabricating the aforementioned gate turnoff thyristor.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 52 illustrates a step of fabricating the GTO according to the ninth embodiment of the present invention;

DESCRIPTION OF THE PREFERRED EMBODIMENTS

1. Overall Structure of a Unit with a GTO Integrated Therein

Figure 2:
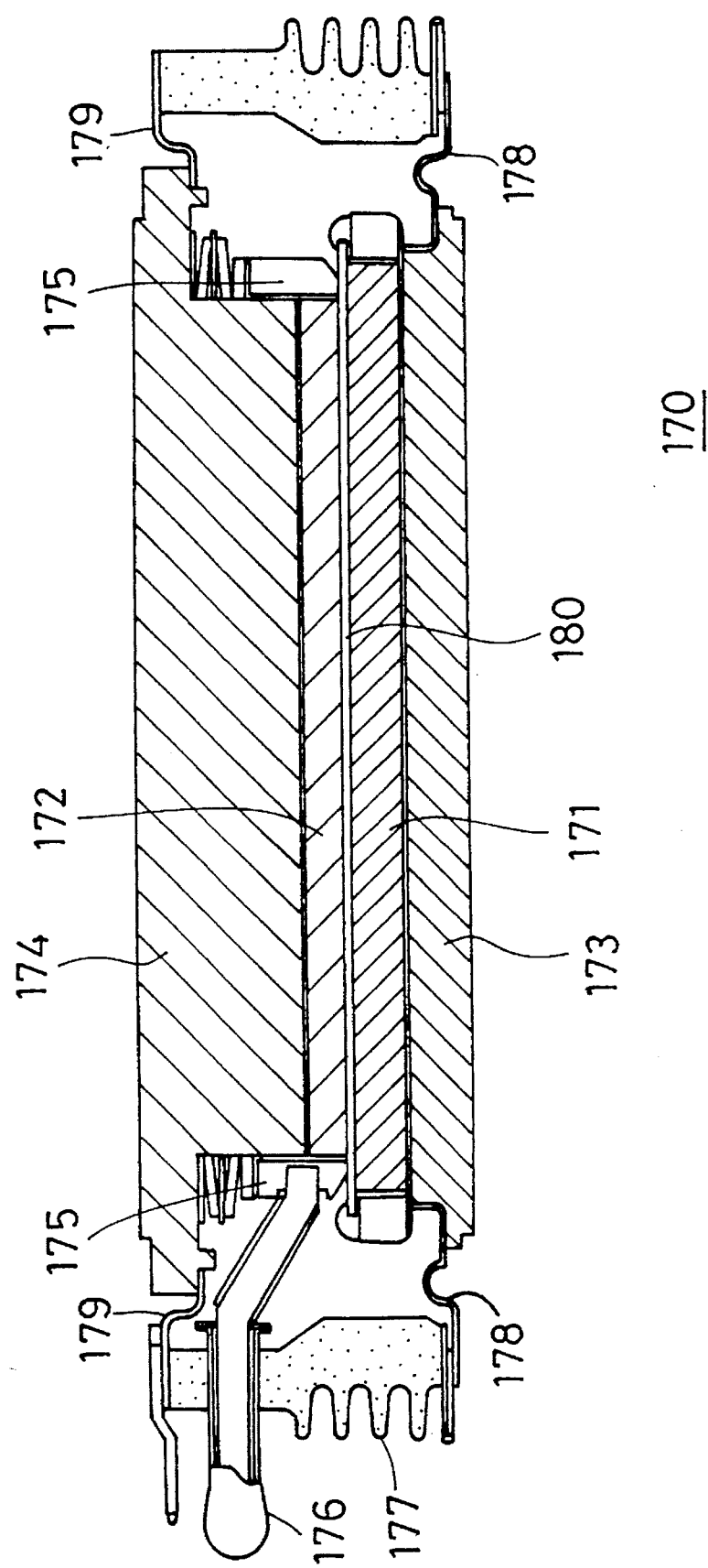
FIG. 2 is a sectional view showing a unit in which a GTO according to each embodiment of the present invention is integrated.

First, description is made on the overall structure of a product in which a GTO employed in each embodiment is integrated. FIG. 2 is a front sectional view showing a product in which a GTO 180 representing each embodiment is integrated. This unit 170 is the so-called pressure contact type unit, which is formed as a unit for high power.

The GTO 180 mainly consisting of a semiconductor substrate is substantially in the form of a disk, both major surfaces of which are in contact with two thermal buffer plates 171 and 172 mainly made of molybdenum, for example. Further, external anode and cathode electrodes 173 and 174 are in contact with outer sides thereof. The external anode and cathode electrodes 173 and 174 are electrically coupled with anode and cathode electrodes which are provided on the GTO 180 respectively as described later, so that a main current flowing in the GTO 180 is supplied from the exterior through these external electrodes 173 and 174.

The external anode and cathode electrodes 173 and 174 are fixed to both end surfaces of an envelope 177, which is a cylindrical insulator mainly made of ceramic, through annular metal flanges 178 and 179 which are coupled to outer peripheries thereof respectively. Namely, the unit 170 has such a structure that the GTO 180 is held under pressure by the external anode and cathode electrodes 173 and 174 through the thermal buffer plates 171 and 172. The thermal buffer plates 171 and 172 have thermal expansion coefficients which are by far closer to that of the GTO 180, mainly made of a semiconductor, as compared with the external electrodes 173 and 174, in order to absorb thermal distortion for preventing the GTO 180 from breakage caused by thermal distortion following heat generation.

Further, the GTO 180 is airtightly stored in a kind of chest which is formed by the envelope 177, the flanges 178 and 179 and the external electrodes 173 and 174, to be protected against the outside air. In addition, the chest is filled up with inert gas such as nitrogen gas, in order to prevent oxidation or deterioration of the GTO 180 and the thermal buffer plates 171 and 172.

An external gate electrode 175 is pressed against a gate electrode, described later, which is provided on the GTO 180, by elastic force of a spring. An external gate terminal 176 is connected to the external gate electrode 175, so that an end thereof is exposed to the exterior of the envelope 177. A gate current is supplied from the exterior through the external gate terminal 176. The gate current is inputted in the GTO 180 through the external gate electrode 175.

Figure 3:
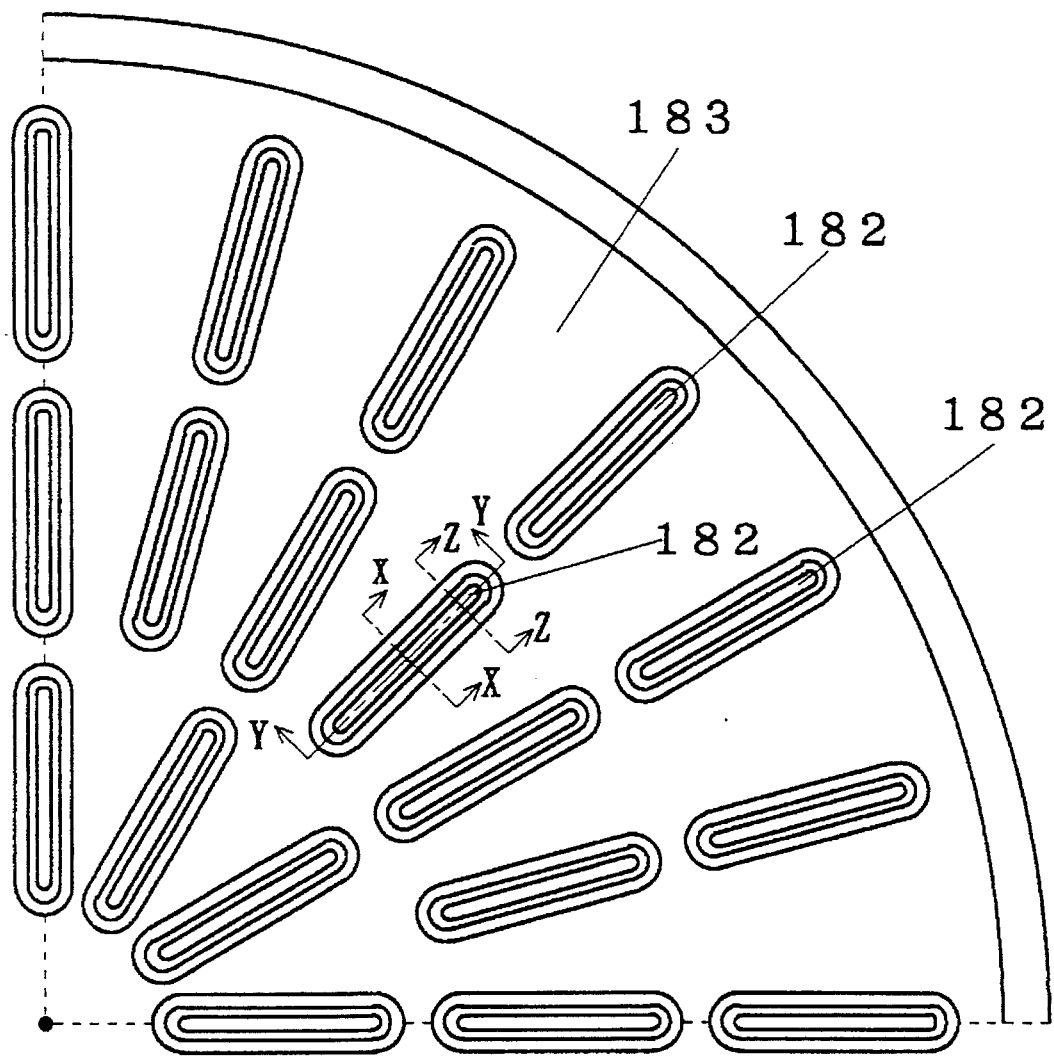
FIG. 3 is a partial plan view showing the GTO according to each embodiment of the present invention.

FIG. 3 is a partial plan view showing the structure of an upper surface of the GTO 180. This figure representatively shows a portion corresponding to a quarter of the overall upper surface of the substantially discoidal GTO 180. As shown in FIG. 3, cathode electrodes 182 and a gate electrode 183 which are insulated from each other are formed on the upper surface of the GTO 180. The cathode electrodes 182 which are enclosed with the gate electrode 183 and provided in a large number to be independent of each other are somewhat upwardly protrusive beyond the gate electrode 183 (toward this side in FIG. 3). Therefore, the thermal buffer plate 172 which is in contact with the upper surface of the GTO 180 comes into contact not with the gate electrode 183, but with the cathode electrodes 182. On the other hand, the external gate electrode 175 is provided to be selectively in contact with only the gate electrode 183.

An anode electrode (not shown) is formed substantially over the lower surface of the GTO 180, so that the thermal buffer plate 171 which is in contact with the lower surface of the GTO 180 comes into contact with this anode electrode. A sectional structure taken along the line X—X in FIG. 3 is illustrated in relation to each of the following embodiments.

2. First Embodiment

Figure 1:
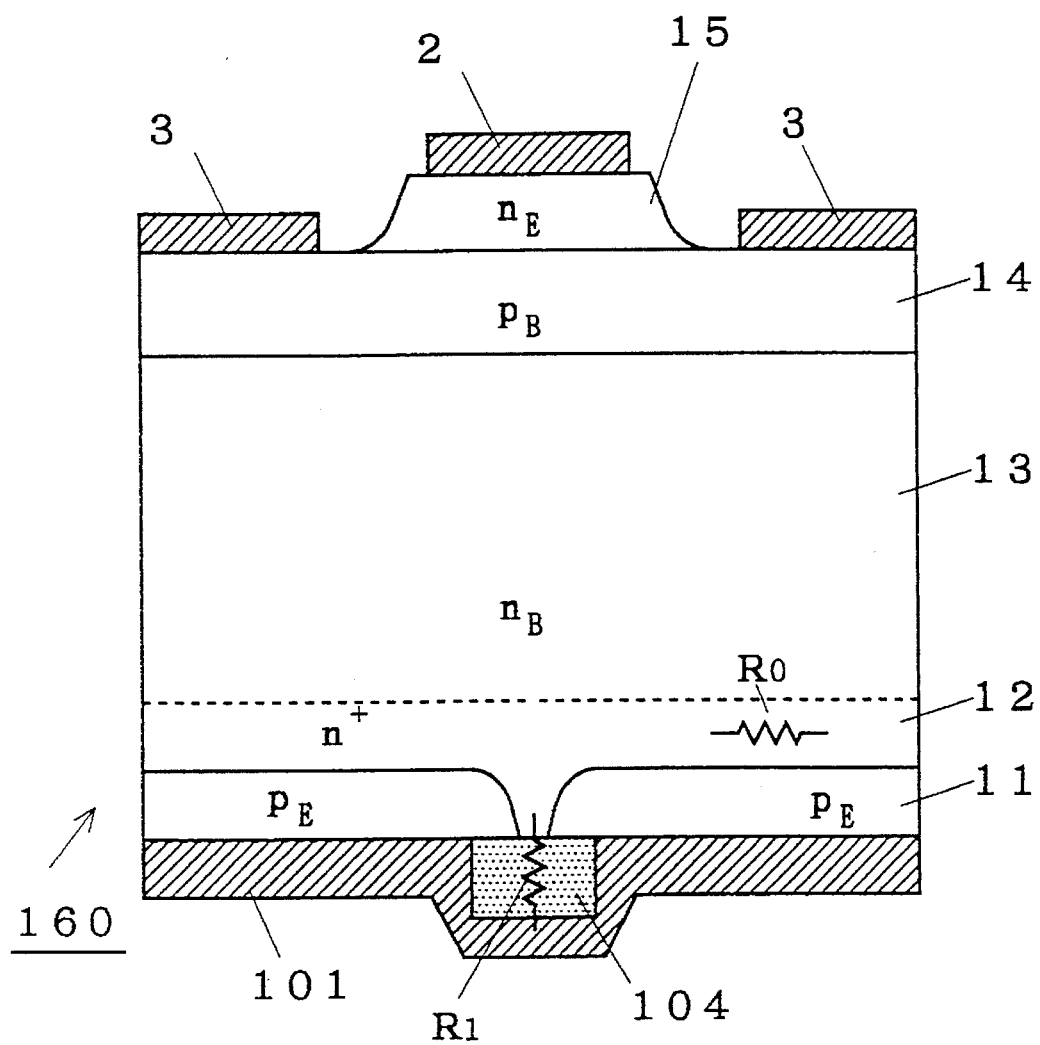
FIG. 1 is a sectional view showing a GTO according to a first embodiment of the present invention.
Figure 54:
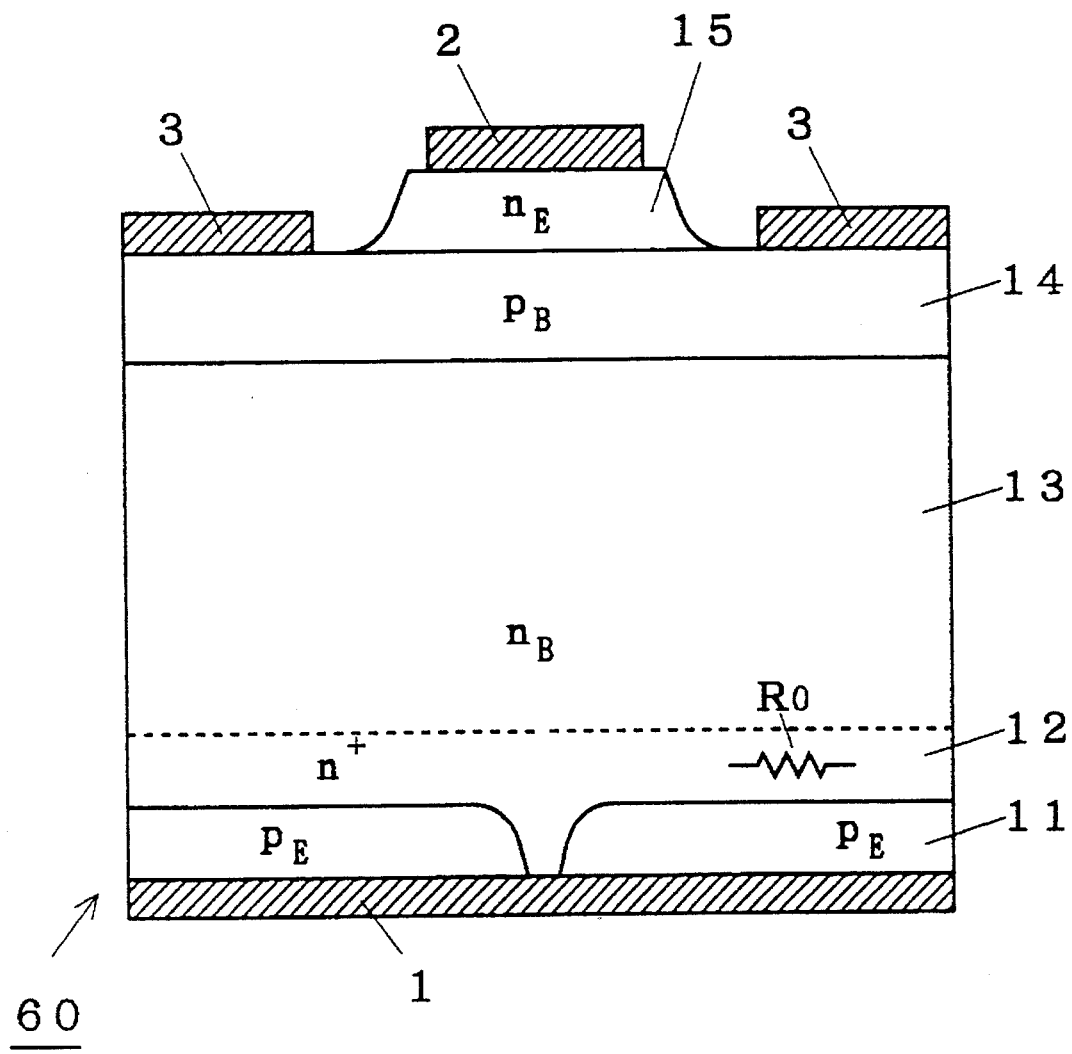
FIG. 54 is a sectional view showing a conventional GTO.
Figure 55:
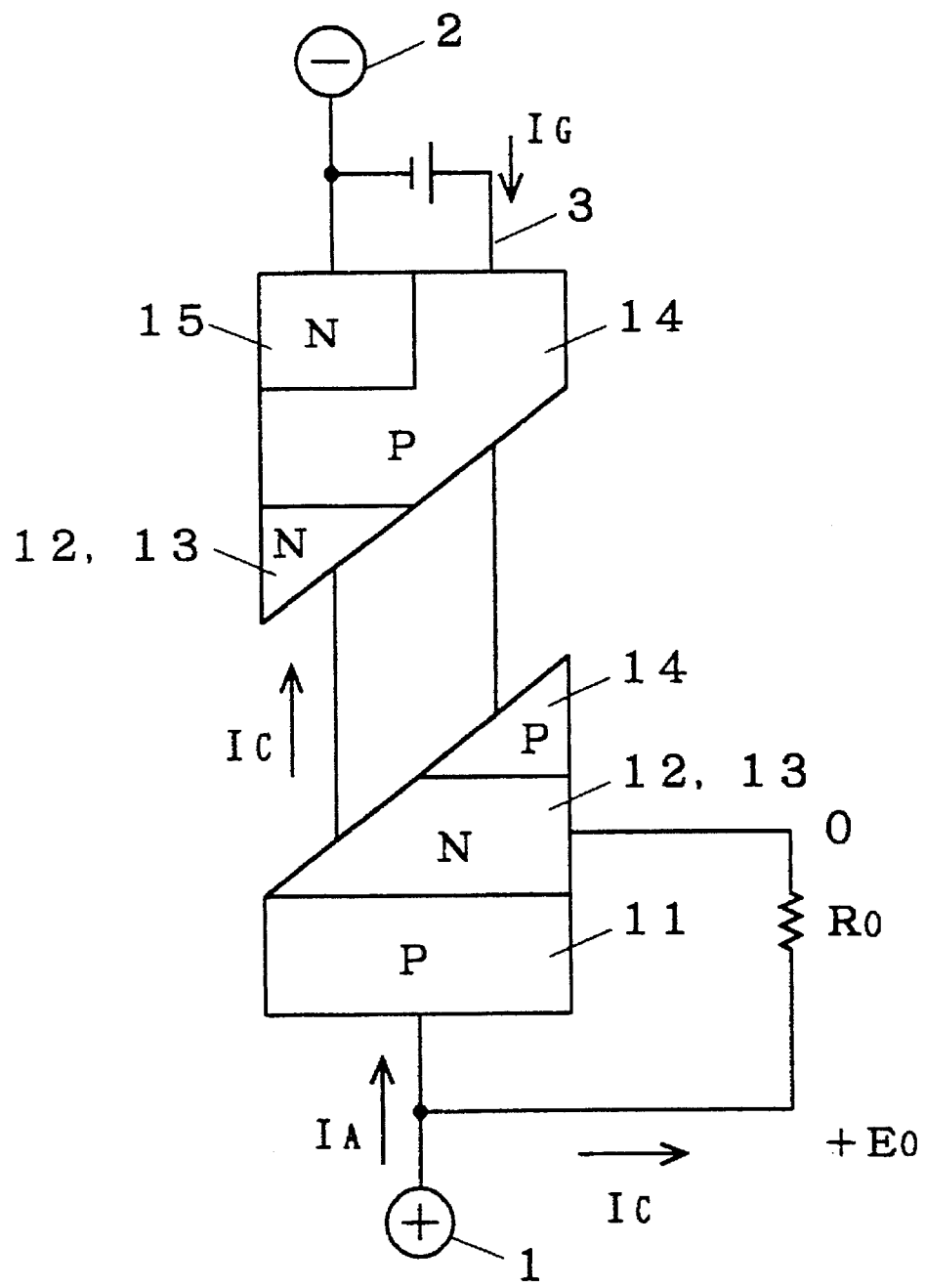
FIG. 55 is an equivalent circuit diagram of the conventional GTO.

A GTO according to a first embodiment of the present invention is now described. FIG. 1 is a sectional view taken along the line X—X showing the GTO according to this embodiment. In the following figures, portions identical to those of the prior art shown in FIGS. 54 and 55 are denoted by the same reference numerals, to omit redundant description.

1.1. Structure of Device

In this GTO 100, a p emitter layer 11 is exposed on a lower major surface of a substantially discoidal silicon semiconductor substrate 160, while an n buffer layer 12 which is stacked on the p emitter layer 11 is selectively exposed on a portion immediately under an n emitter layer 15. An additional resistive layer 104 which is a sixth semiconductor layer is additionally formed on the lower major surface of the semiconductor substrate 160. This additional resistive layer 104 is formed by a polysilicon film which is doped with an n-type impurity, and has an electric resistance of a proper value. Further, the additional resistive layer 104 is connected over the entire exposed surface of the n buffer layer 12 and lower surface parts of the p emitter layer 11 which are adjacent thereto.

An anode electrode 101 is connected to the lower surface of the p emitter layer 11 as well as to the additional resistive layer 104, while the n buffer layer 12 and the anode electrode 101 are connected with each other through the additional resistive layer 104. The connection between the anode electrode 101, the p emitter layer 11 and the additional resistive layer 104 is implemented by ohmic contact.

The value of an additional resistance $R_1$ which is the electric resistance of the additional resistive layer 104, i.e., the resistance across the n buffer layer 12 and the anode electrode 101, is expressed in $R_1 = \rho p \cdot t \cdot K/S$ through resistivity $\rho p$ of the additional resistive layer 104, its thickness t and a contact area S between the n buffer layer 12 and the additional resistive layer 104. The coefficient K is a correction value which depends on the shapes of the portions of the anode electrode 101 and the additional resistive layer 104 which are in contact with each other, and substantially equal to "1" if the thickness t of the additional resistive layer 104 is sufficiently small. In this case, the additional resistance $R_1$ is approximately expressed in $R_1 = \rho p \cdot t/S$.

Since the additional resistive layer 104 is made of polysilicon, it is possible to readily obtain desired resistivity $\rho p$ by adjusting the dosage of the n-type impurity. Further, it is possible to readily form the additional resistive layer 104 in a desired shape by CVD and photolithography, as hereinabove described. In addition, it is possible to vary the value of the additional resistance $R_1$ by adjusting the thickness t and the contact area S, as clearly understood from the above relational expression. Namely, it is advantageously possible to readily obtain the additional resistance $R_1$ of a desired value in the additional resistive layer 104 which is made of polysilicon. A desirable value of the additional resistance $R_1$ is about several 10 $\Omega$, for example, and this value can be readily implemented in the additional resistive layer 104 which is made of polysilicon.

Figure 4:
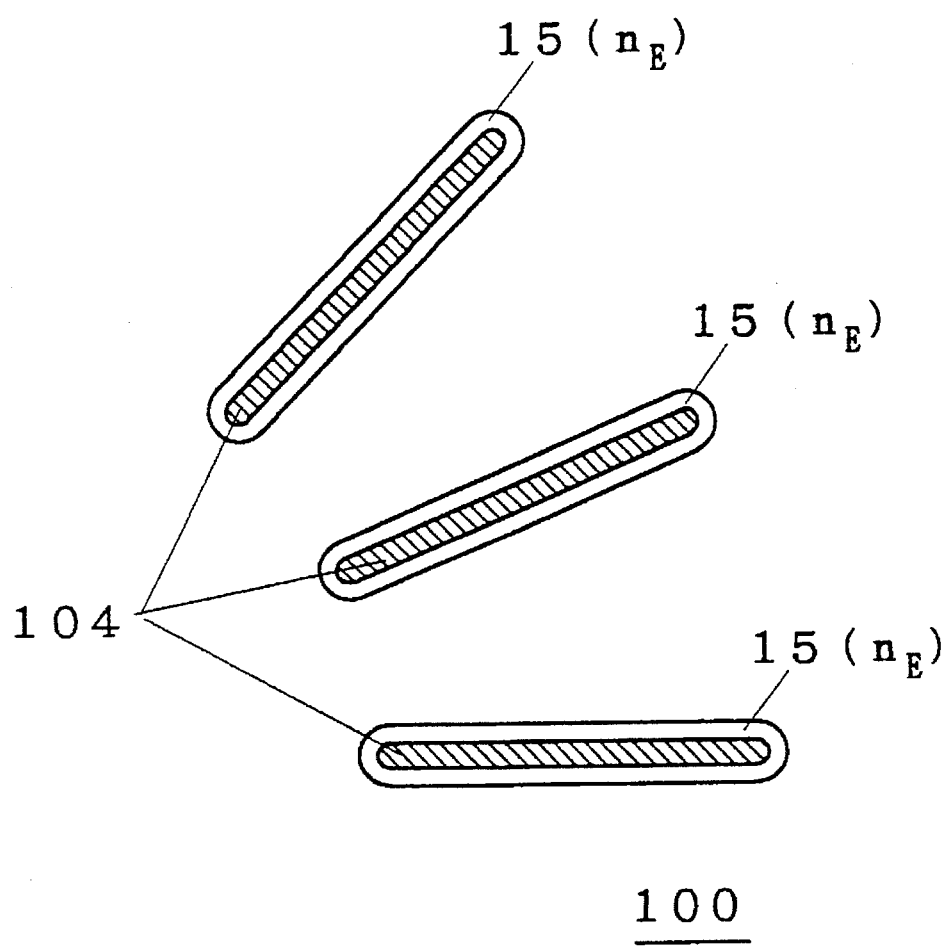
FIG. 4 is a partial plan view showing the GTO according to the first embodiment of the present invention.

Positions for implementing connection between the additional resistive layer 104 and the n buffer layer 12 are now described. FIG. 4 is a plan view of the GTO 100, illustrating each n emitter layer 15 and each additional resistive layer 104 in an overlapped manner in particular. As shown in FIG. 4, the additional resistive layer 104 is arranged in a portion immediately under the n emitter layer 15 to extend along the longitudinal direction of the n emitter layer 15. This prevents a main current from concentrating on a specific region when the GTO 100 is turned off. Thus, it is possible to advantageously reduce turnoff loss.

Figure 5:
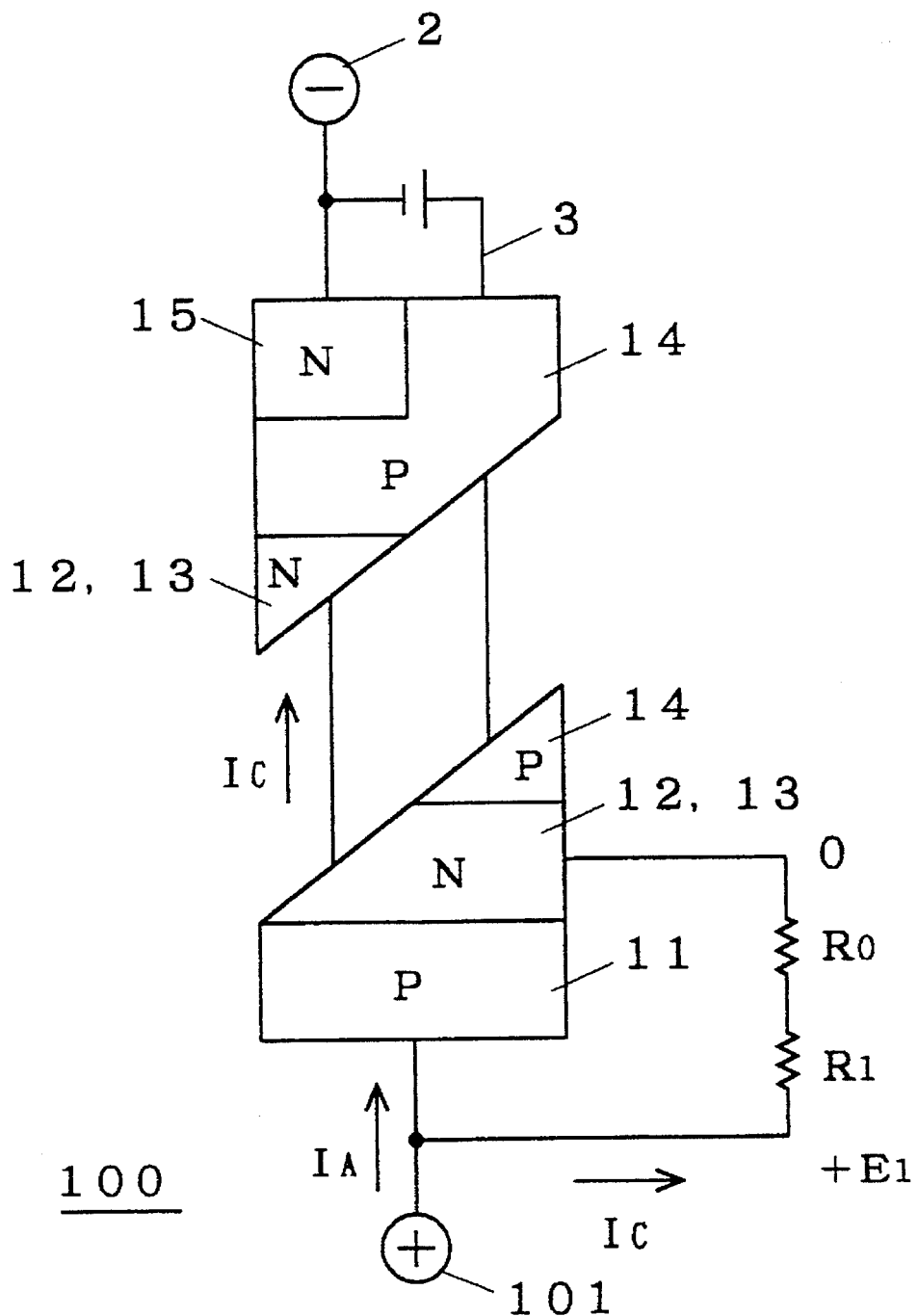
FIG. 5 is an equivalent circuit diagram of the GTO according to the first embodiment of the present invention.

The GTO 100 is equivalently expressed by a circuit diagram shown in FIG. 5. Similarly to the GTO 50, the GTO 100 has such a structure that a pnp transistor and an npn transistor are coupled with each other. Reflecting that the n buffer layer 12 is connected to the anode electrode 101 through the additional resistive layer 104, a base and an emitter of the pnp transistor is short-circuited by a resistance corresponding to a series combined resistance of a sheet resistance $R_0$ of the n buffer layer 12 and the additional resistance $R_1$ of the additional resistive layer 104. The sheet resistance $R_0$ is a transverse resistance which is developed in the n buffer layer 12 across the contact surface between the same and the additional resistive layer 104 and a portion close to the center of the p emitter layer 11. With reference to the equivalent circuit diagram shown in FIG. 5, the operation of the GTO 100 is now described.

2.1. Operation of Device

In order to use the GTO 100, an external power source is first connected to apply a bias voltage across the anode electrode 101 and a cathode electrode 2 in a positive direction. In this state, a positive gate current $I_G$ is supplied from gate electrodes 3. At this time, the gate current $I_G$ serves as a base current of the npn transistor which is formed by the n buffer 12 and the n base layer 13, the p base layer 14 and the n emitter layer 15 until the same reaches a sufficient value, whereby a collector current $I_C$ of this npn transistor flows from the anode electrode 101 to the cathode electrode 2 as the result.

This collector current $I_C$ flows from the anode electrode 101 into the n buffer layer 12 through the additional resistive layer 104. Thus, a voltage $E_1$ corresponding to a voltage drop which is developed in the series combined resistance of the sheet resistance $R_0$ and the additional resistance $R_1$ is applied across the p emitter layer 11 and the n buffer layer 12, due to the flow of the collector current $I_C$.

This voltage $E_1$ serves as a base-to-emitter voltage of the pnp transistor which is formed by the p emitter layer 11 and the n buffer layer 12, the n base layer 13 and the p base layer 14. When the gate current $I_G$ reaches a sufficiently high level and hence the base-to-emitter voltage $E_1$ exceeds a forward voltage which is specific to the junction between the p emitter layer 11 and the n buffer layer 12, therefore, an anode current $I_A$ flows from the anode electrode 101 to the p emitter layer 11.

This anode current $I_A$ increases the base current of the npn transistor, whereby the collector current $I_C$ of the npn transistor is increased. Consequently, the base current of the pnp transistor is increased, whereby the anode current $I_A$ is further increased. Namely, the anode current $I_A$ is steadily increased by a positive feedback action of the two transistors, whereby the GTO 100 finally conducts. Namely, the GTO 100 is turned on.

The GTO 100 has such a structure that the additional resistance $R_1$ is added to the GTO 50, and hence the base-to-emitter voltage $E_1$ is higher than the base-to-emitter voltage $E_0$ which is developed in the GTO 50 when the same is fed with the same collector current $I_C$. Namely, injection of holes from the p emitter layer 11 into the n buffer layer 12 is started by the collector current $I_C$ which is smaller than the collector current $I_C$ required for turning on the GTO 50 by a ratio $R_0/(R_0+R_1)$, whereby flowing of the anode current $I_A$ is started.

Therefore, the GTO 100 is turned on with the gate current $I_G$ which is smaller than that for the GTO 50 by the ratio $R_0/(R_0+R_1)$. Namely, a gate trigger current $I_{GT}$ is reduced in the GTO 100 as compared with the GTO 50 according to the prior art, due to the addition of the additional resistance $R_1$. When the additional resistance $R_1$ is set at a high level, the gate trigger current $I_{GT}$ is reduced in response thereto.

Thus, it is possible to suppress the gate trigger current $I_{GT}$ in the GTO 100 without changing the level of the sheet resistance $R_0$. In the GTO 100, therefore, improvement in withstand voltage and ON-state resistance as well as reduction in turnon loss and improvement in di/dt resistance are compatibly implemented.

2.3. Validation Test

As to the GTO 100, a test was made for validating the relation between the additional resistance $R_1$ and the gate trigger current $I_{GT}$. The GTO 100 as tested had a diameter of 86 mm, and the contact area S between the n buffer layer 12 and the additional resistive layer 104 was 21% of that between the p emitter layer 11 and the additional resistive layer 104. Samples having various levels of the additional resistances $R_1$ were prepared with additional resistive layers 104 of various thicknesses t.

Figure 6:
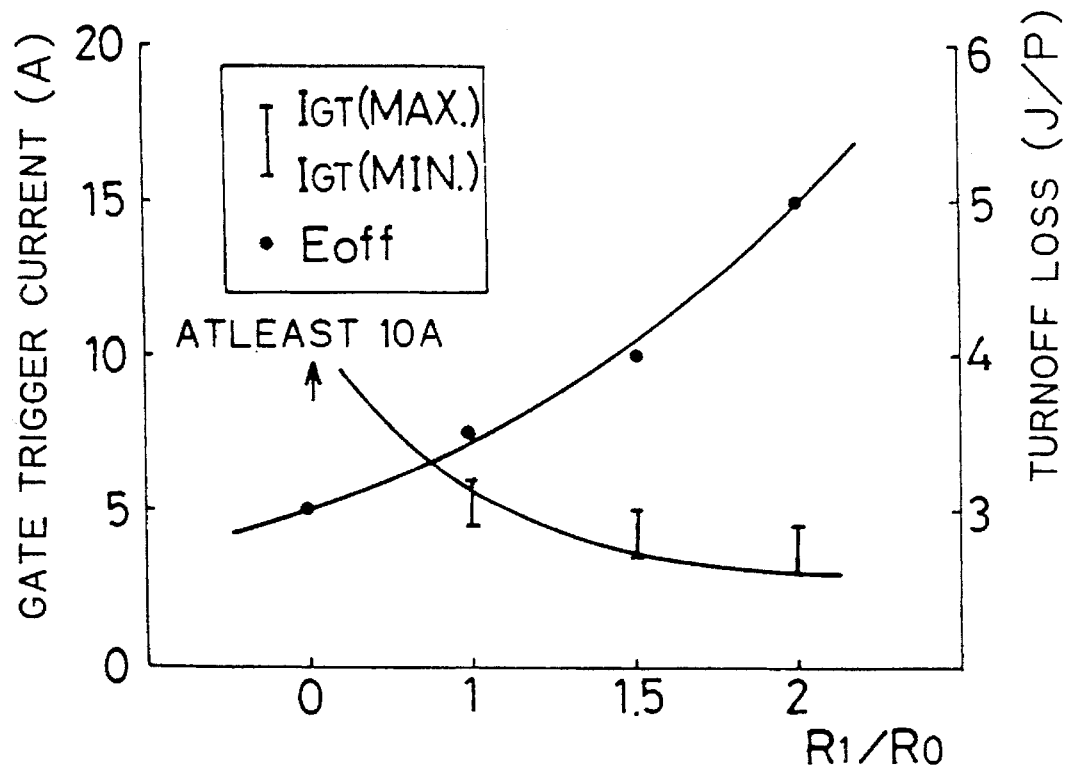
FIG. 6 is a graph showing the result of a validation test in relation to the GTO according to the first embodiment of the present invention.
Figure 7:
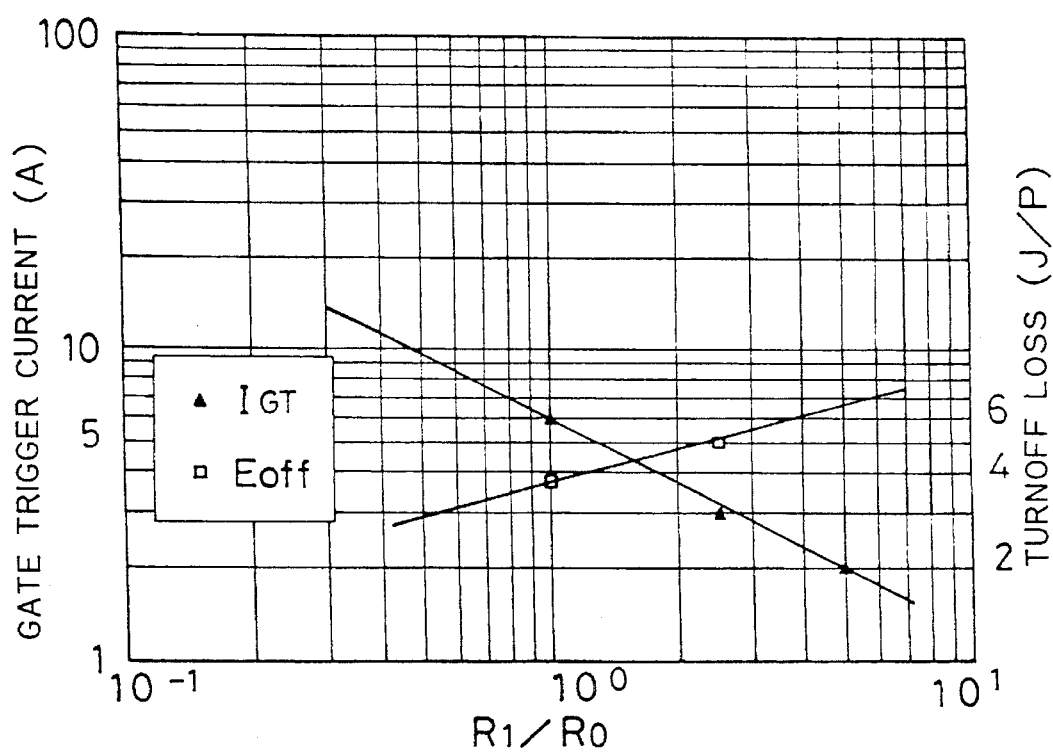
FIG. 7 is a graph showing the result of the validation test in relation to the GTO according to the first embodiment of the present invention.

FIGS. 6 and 7 show the results of the validation test. These figures are graphs showing dependency of the gate trigger current $I_{GT}$ on the ratio $R_1/R_0$ of the additional resistance $R_1$ to the sheet resistance $R_0$. The graphs also show actually measured values of power loss following turnoff operations, i.e., turnoff loss. A sample of the GTO 100 having zero resistance ratio $R_1/R_0$ comprises no additional resistive layer 104, and has the same structure as the GTO 50.

As understood from the graph shown in FIG. 6, the sample was not turned on under actual measurement conditions when the resistance ratio $R_1/R_0$ was zero, i.e., when no additional resistive layer 104 was provided, since the gate trigger current $I_{GT}$ was too large. It is estimated that the turnon current was at least in excess of 10 Å in this case. As shown in FIGS. 6 and 7, the gate trigger current $I_{GT}$ is increased following increase of the resistance ratio $R_1/R_0$. In particular, the gate trigger current $I_{GT}$ is already reduced to a practical value of about 5 Å corresponding to that of the conventional GTO provided with no n buffer layer 12, even if the resistance ratio $R_1/R_0$ is at a value "1".

Namely, the results of the test validated the aforementioned effect of reducing the gate trigger current $I_{GT}$ by the additional resistive layer 104. When the gate trigger current $I_{GT}$ is reduced, turnoff loss is reduced in response thereto. On the other hand, power loss following the turnoff operation, i.e., turnoff loss, is increased following increase of the resistance ratio $R_1/R_0$, as shown in FIGS. 6 and 7. However, the rate of increase of turnoff loss following increase of the resistance ratio $R_1/R_0$ is smaller than the rate of reduction of the gate trigger current $I_{GT}$, as shown in FIG. 7. Namely, change of the turnoff loss is looser than that of the gate trigger current $I_{GT}$.

Considering the effect of reducing the turnoff loss, the gate trigger current $I_{GT}$ is preferably minimized. In view of the requirement for reduction of the turnoff loss, therefore, it is desirable to maximize the resistance ratio $R_1/R_0$. In order to effectuate such reduction of the turnon loss, the resistance ratio $R_1/R_0$ is preferably at least the value "1". On the other hand, the turnoff loss is increased following increase of the resistance ratio $R_1/R_0$ although this increase is slight, and hence a preferable upper limit of the resistance ratio $R_1/R_0$ is defined in consideration of the turnoff loss. It can be inferred from a practical upper limit in relation to the turnoff loss that the resistance ratio $R_1/R_0$ is preferably not more than a value "5". Namely, it is concluded that the resistance ratio $R_1/R_0$ is preferably in the range of about 1 to 5.

2.4. Modification of First Embodiment

Figure 8:
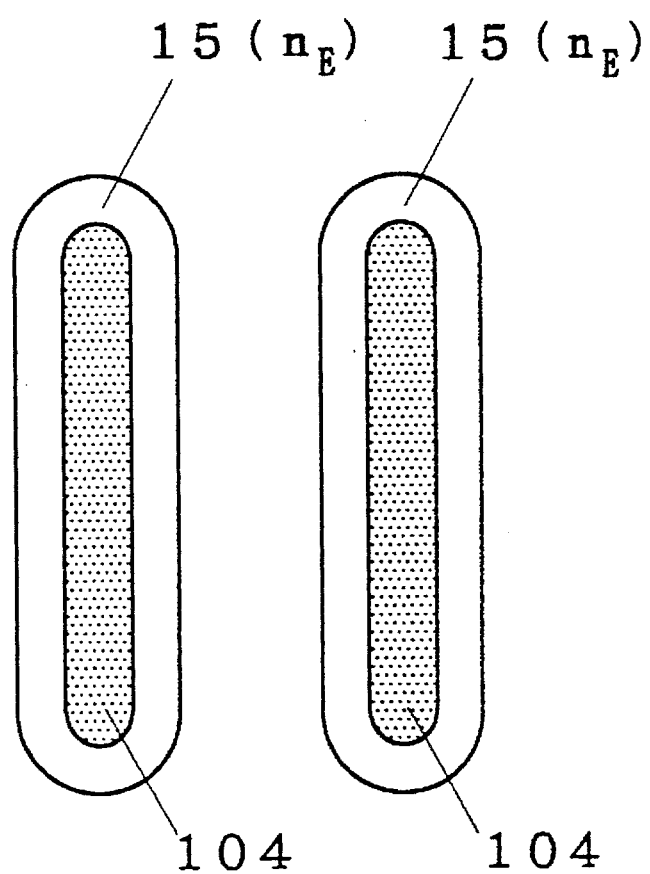
FIG. 8 is a partial plan view showing a modification of the GTO according to the first embodiment of the present invention.

In the aforementioned GTO 100, the n emitter layers 15 are radially arranged as shown in the plan view of FIG. 3 or 4. In place of such radial arrangement, n emitter layers 15 may be arranged in parallel with each other as shown in FIG. 8 in a plan view, for example. At this time, additional resistive layers 104 are also arranged in parallel with each other, to be positioned immediately under the n emitter layers 15. Also when the n emitter layers 15 and the additional resistive layers 104 are arranged in such a manner, it is possible to reduce the gate trigger current $I_{GT}$ and the turnoff loss similarly to the GTO 100.

3. Second Embodiment

Figure 9:
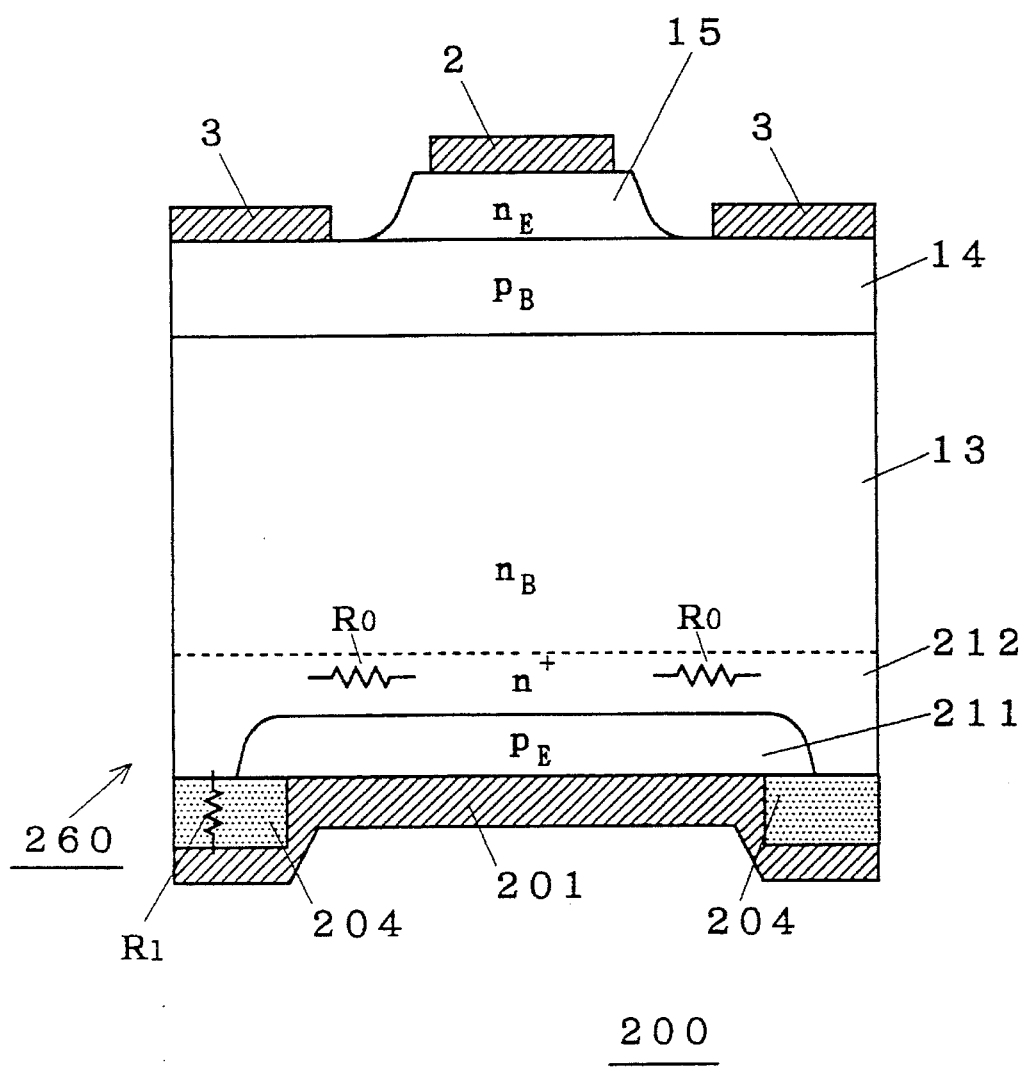
FIG. 9 is a sectional view showing a GTO according to a second embodiment of the present invention.

A GTO according to a second embodiment of the present invention is now described. FIG. 9 is a sectional view taken along the line X—X (FIG. 3) showing the GTO according to this embodiment.

In this GTO 200, an n buffer layer 212 is selectively exposed on a lower major surface of a substantially discoidal silicon semiconductor substrate 260 in portions corresponding to those immediately under gate electrodes 3. Additional resistive layers 204 which are formed by polysilicon films doped with an n-type impurity are additionally formed on the lower major surface of the semiconductor substrate 260, and connected to extend over the entire exposed surface of the n buffer layer 212 and partial regions of a lower surface of a p emitter layer 211 which are adjacent thereto.

An anode electrode 201 is connected to the lower surface of the p emitter layer 211 as well as to the additional resistive layers 204, while the n buffer layer 212 and the anode electrode 201 are connected with each other through the additional resistive layers 204. The connection between the anode electrode 201, the p emitter layer 211 and the additional resistive layers 204 is implemented by ohmic contact.

Figure 10:
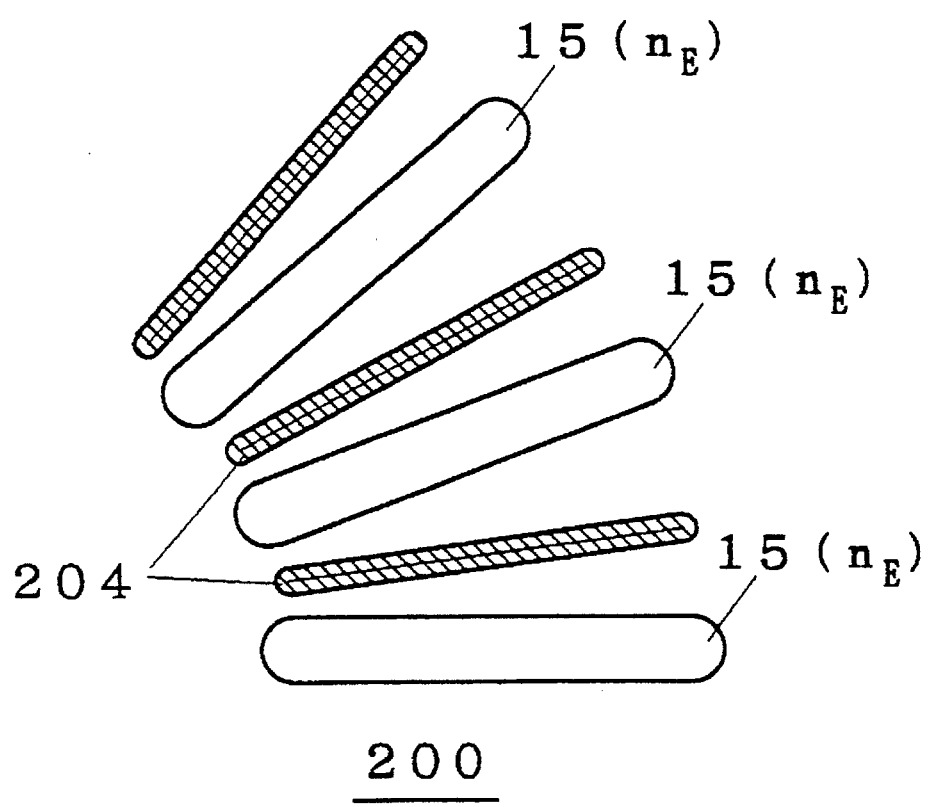
FIG. 10 is a partial plan view showing the GTO according to the second embodiment of the present invention.

FIG. 10 is a plan view of the GTO 200, illustrating n emitter layers 15 and the additional resistive layers 204 in an overlapped manner in particular. As understood from FIGS. 9 and 10, the additional resistive layers 204 are arranged not immediately under the n emitter layers 15 but immediately under the gate electrodes 3, dissimilarly to the additional resistive layers 104 of the GTO 100. Thus, connecting portions between the additional resistive layers 204 and the n buffer layers 201 are provided immediately under the gate electrodes 3, whereby holes can be readily injected from portions of the p emitter layer 211 corresponding to those immediately under the n emitter layers 15. This leads to reduction of a turnon time, thereby further reducing turnon loss as the result.

Figure 11:
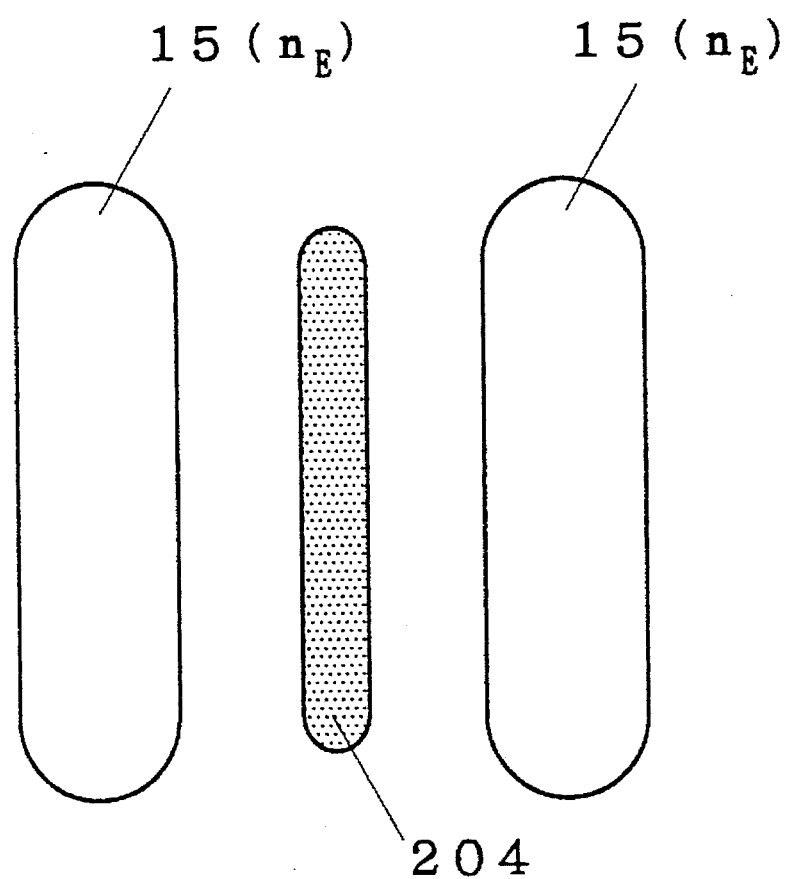
FIG. 11 is a partial plan view showing a modification of the GTO according to the second embodiment of the present invention.

In the aforementioned GTO 200, the n emitter layers 15 are radially arranged as shown in the plan view of FIG. 3 or 10. In place of such radial arrangement, n emitter layers 15 may be arranged in parallel with each other as shown in FIG. 11 in a plan view, for example. At this time, additional resistive layers 204 are also arranged in parallel with each other to be positioned immediately under gate electrodes 3. Also when the n emitter layers 15 and the additional resistive layers 204 are arranged in such a manner, an effect similar to that of the GTO 200 can be attained.

4. Third Embodiment

Figure 12:
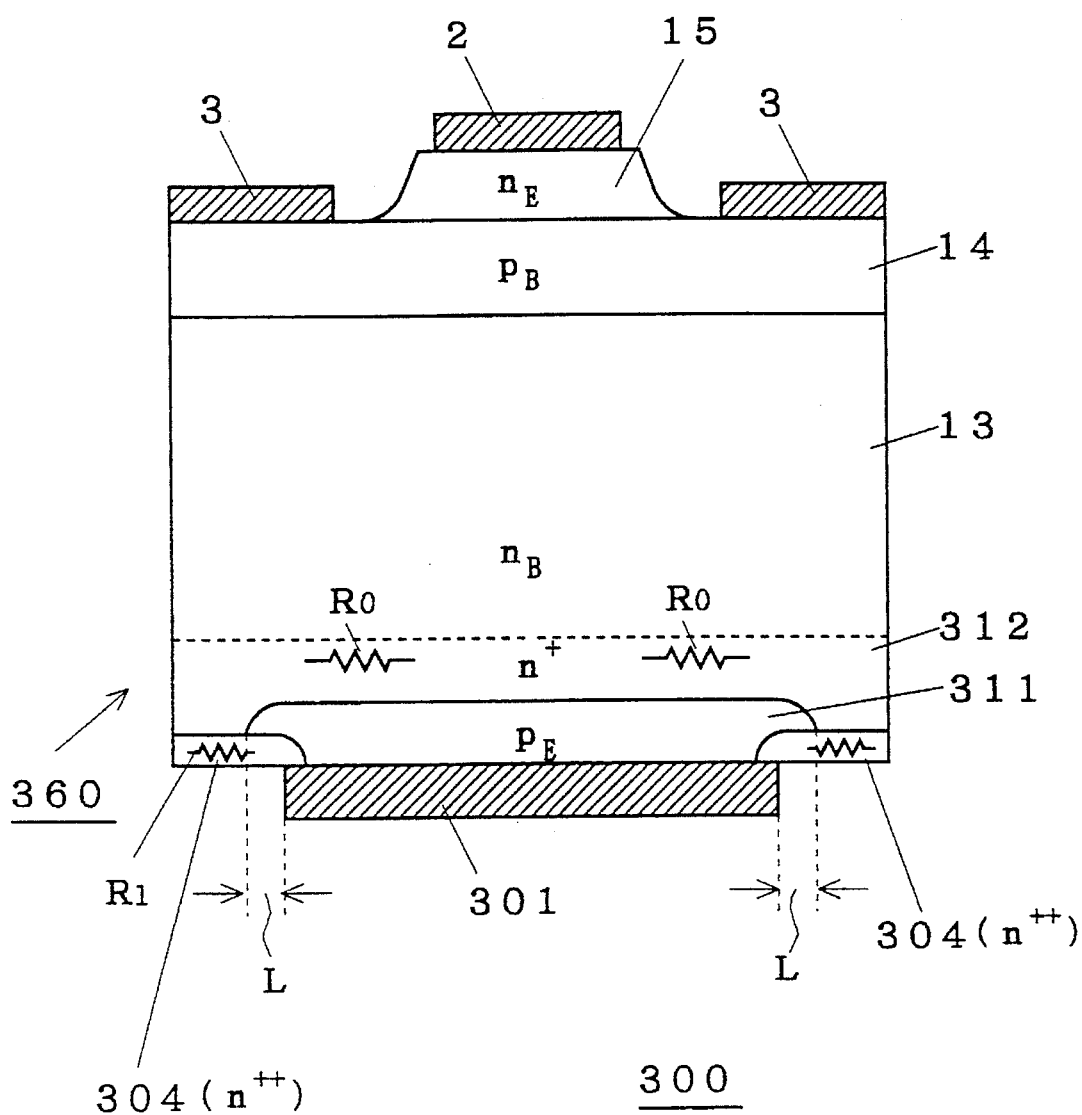
FIG. 12 is a sectional view showing a GTO according to a third embodiment of the present invention.

A GTO according to a third embodiment of the present invention is now described. FIG. 12 is a sectional view taken along the line X—X (FIG. 3) showing the GTO according to this embodiment.

In this GTO 300, an n buffer layer 312 is formed to be selectively exposed on a lower major surface of a substantially discoidal silicon semiconductor substrate 360 in portions corresponding to those immediately under gate electrodes 3 before formation of additional resistive layers 304. An n-type impurity of high concentration is selectively diffused in the lower major surface of the semiconductor substrate 360, thereby forming the additional resistive layers 304. The additional resistive layers 304 are formed over the entire exposed surface of the n buffer layer 312 and partial regions of a lower surface of a p emitter layer 311 which are adjacent thereto. In the additional resistive layers 304, concentration of the n-type impurity is higher than that in the n buffer layer 312.

An anode electrode 301 is formed on the lower major surface of the semiconductor substrate 360, to be connected to parts of lower surfaces of the additional resistive layers 304 and the lower surface of the p emitter layer 311. Ends of the anode electrode 301 are in positions retracted from those of the p emitter layer 311.

Thus, the n buffer layer 312 and the anode electrode 301 are connected with each other through transverse resistances of the additional resistive layers 304. Namely, the transverse resistances of the additional resistive layers 304 form additional resistances $R_1$ which are interposed between the n buffer layer 312 and the anode electrode 301.

Thus, the transverse resistances of the additional resistive layers 304 are utilized in the GTO 300, whereby high additional resistances $R_1$ can be readily obtained by setting the additional resistive layers 304 in small thicknesses. Since the additional resistive layers 304 contain the impurity in high concentration, further, practically required values of the additional resistances $R_1$ can be obtained by setting the additional resistive layers 304 in small thicknesses. In addition, the additional resistances $R_1$ are increased as distances L (FIG. 12) of retraction of the ends of the anode electrode 301 from those of the p emitter layer 311 are increased. Therefore, it is also possible to finely adjust the values of the additional resistances $R_1$ by adjusting the distances L of retraction. Namely, it is possible to readily obtain the additional resistances $R_1$ of desired values in the GTO 300 according to this embodiment.

5. Fourth Embodiment

Figure 13:
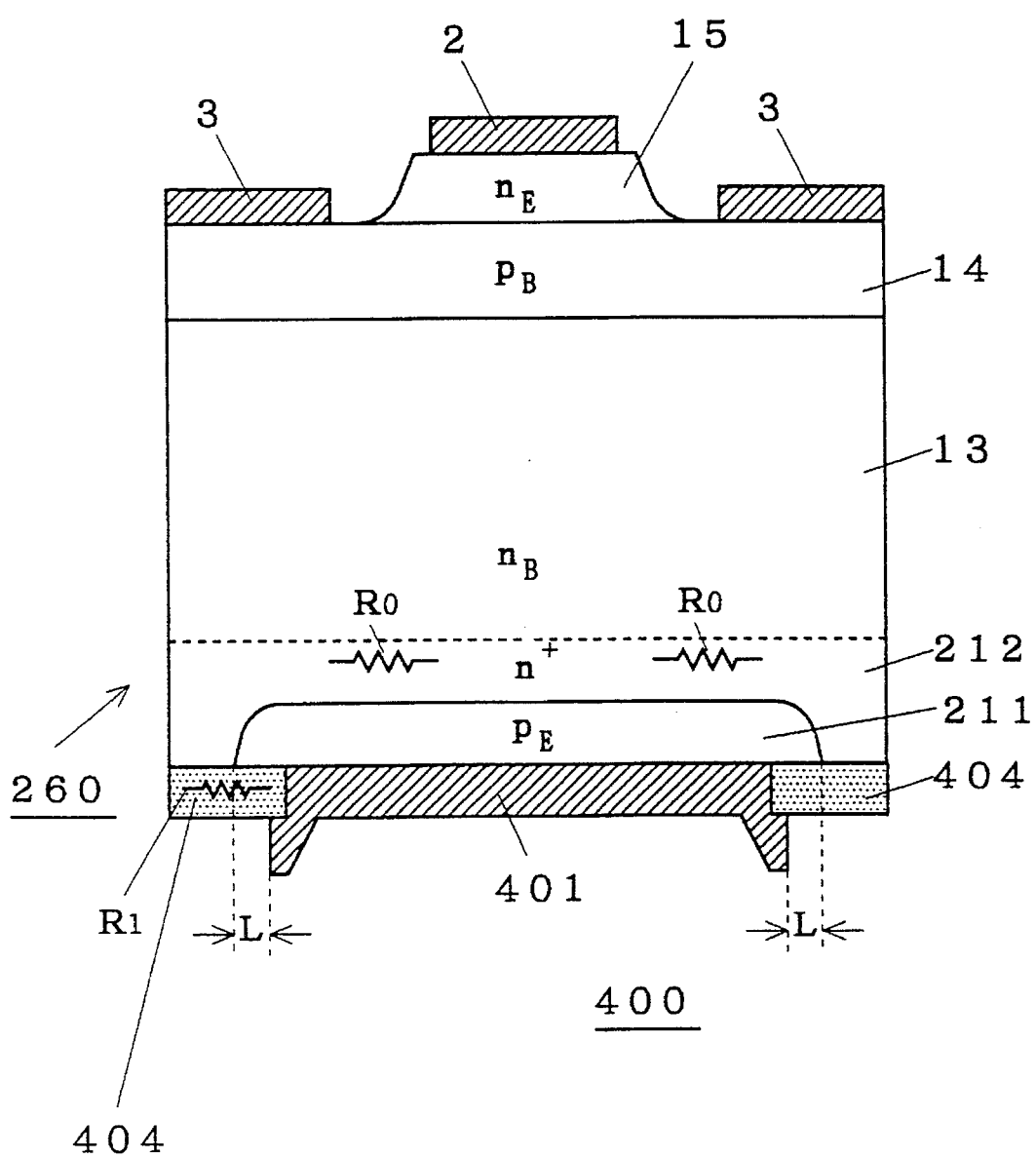
FIG. 13 is a sectional view showing a GTO according to a fourth embodiment of the present invention.

A GTO according to a fourth embodiment of the present invention is now described. FIG. 13 is a sectional view taken along the line X—X (FIG. 3) showing the GTO according to this embodiment. This GTO 400 is a modification of the GTO 200 according to the second embodiment. Similarly to the GTO 200, additional resistive layers 404 which are formed by polysilicon films doped with an n-type impurity are additionally formed on a lower major surface of a silicon semiconductor substrate 260, and connected over the entire lower surface of an n buffer layer 212 and partial regions of a lower surface of a p emitter layer 211 which are adjacent thereto.

An anode electrode 401 is formed to be connected to parts of lower surfaces of the additional resistive layers 404, and portions of the lower surface of the p emitter layer 311 which are not covered with the additional resistive layers 404. End portions of the anode electrode 401 are in positions retracted from those of the p emitter layer 211. Therefore, the n buffer layer 212 and the anode electrode 401 are connected with each other through transverse resistances of the additional resistive layers 404. Namely, the transverse resistances of the additional resistive layers 404 form additional resistances $R_1$ which are interposed between the n buffer layer 212 and the anode electrode 401.

Thus, the GTO 400 utilizes the transverse resistances of the additional resistive layers 404, whereby high additional resistances $R_1$ can be readily obtained by setting the additional resistive layers 404 in small thicknesses. Further, the additional resistances $R_1$ are increased as distances L (FIG. 13) of retraction of the end portions of the anode electrode 401 from those of the p emitter layer 211 are increased. Therefore, it is also possible to finely adjust the values of the additional resistances $R_1$ by adjusting the distances L of retraction. Namely, it is possible to readily obtain the additional resistances $R_1$ of desired values in the GTO 400 according to this embodiment.

b 6. Fifth Embodiment

Figure 14:
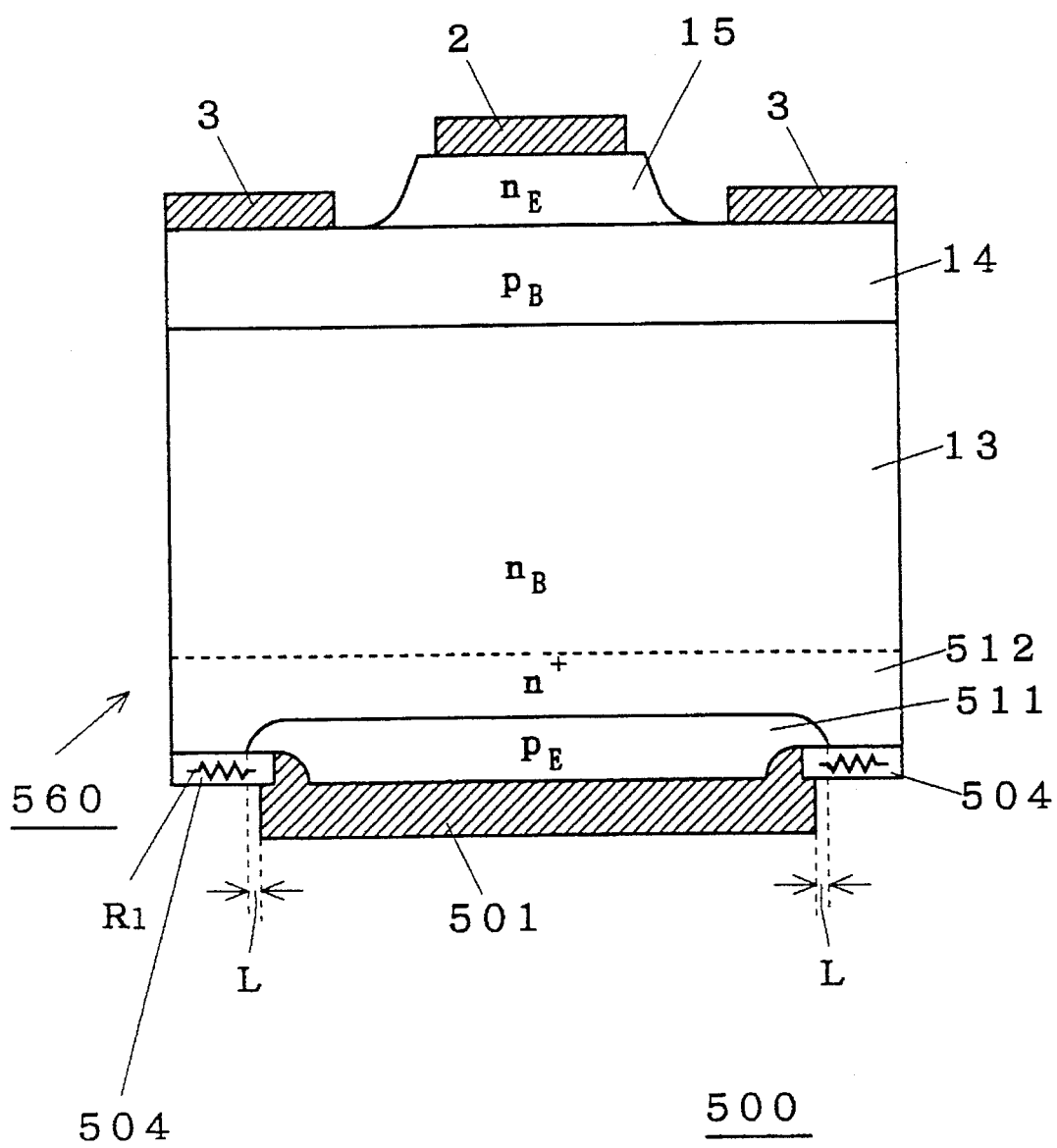
FIG. 14 is a sectional view showing a GTO according to a fifth embodiment of the present invention.

A GTO according to a fifth embodiment of the present invention is now described. FIG. 14 is a sectional view taken along the line X—X (FIG. 3) showing the GTO according to this embodiment. This GTO 500 is a modification of the GTO 400 according to the fourth embodiment.

In the GTO 500, a lower major surface of a substantially discoidal silicon semiconductor substrate 560 is selectively etched, for example, to selectively remove the lower major surface by constant depths. The selectively removed regions extend over an entire lower surface of an n buffer layer 512 and partial regions of a lower surface of a p emitter layer 511 which are adjacent thereto. Additional resistive layers 504 which are formed by polysilicon films doped with an n-type impurity are additionally provided in the selectively removed regions, and connected to the overall lower surface of the n buffer layer 512 and the partial regions of the lower surface of the p emitter layer 511 which are adjacent thereto.

Thicknesses of the additional resistive layers 504 are set to be coincident to the depths of the removed regions on the lower major surface of the semiconductor substrate 560. Therefore, lower surfaces of the additional resistive layers 504 are flush with that of the p emitter layer 511. An anode electrode 501 is formed to be connected to parts of the lower surfaces and single side surfaces of the additional resistive layers 504, and a portion of the lower surface of the p emitter layer 511 which is not covered with the additional resistive layers 504. End portions of the anode electrode 501 are in positions retracted from those of the p emitter layer 511.

Therefore, the n buffer layer 512 and the anode electrode 501 are connected with each other through transverse resistances of the additional resistive layers 504. Namely, the transverse resistances of the additional resistive layers 504 form additional resistances $R_1$ which are interposed between the n buffer layer 512 and the anode electrode 501. Thus, the GTO 500 utilizes the transverse resistances of the additional resistive layers 504, whereby it is possible to readily obtain the additional resistances $R_1$ of desired values, similarly to the GTO 400.

Further, the lower surfaces of the additional resistive layers 504 are flush with that of the p emitter layer 511, whereby no projections appear on the lower surface of the anode electrode 501 when the anode electrode 501 is formed in a uniform thickness. Also when the GTO 500 is applied to the pressure connection type unit 170 shown in FIG. 2, for example, therefore, the thermal buffer plate 171 comes into contact substantially with the overall surface of the anode electrode 501. As shown in a front sectional view of FIG. 15, therefore, it is possible to avoid stress concentration on a local part of the anode electrode 501 caused by pressing force acting between the thermal buffer plate 171 and the anode electrode 501.

Figure 15:
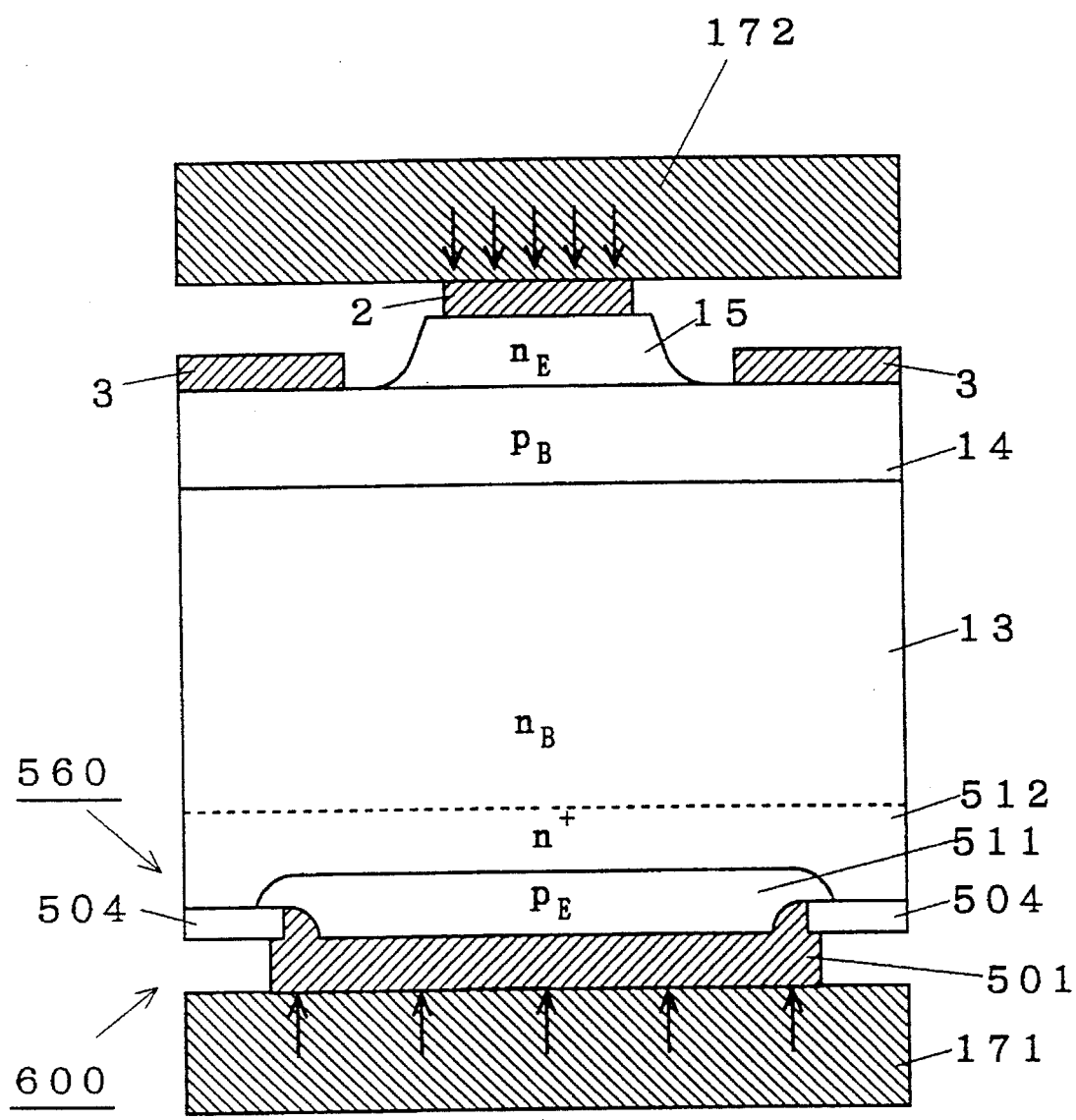
FIG. 15 is a sectional view showing the GTO according to the fifth embodiment of the present invention.

Namely, the GTO 500 is advantageously prevented from breakage caused by excessive stress. As shown in FIG. 15, another buffer plate 172 applies pressing force on a cathode electrode 2 which is provided protrusively from an upper surface of the semiconductor substrate 560. However, the widths of the additional resistive layers 504 are by far smaller than that of the n emitter layer 15 in general, whereby no projections appear on the anode electrode 501 following the additional resistive layers 504, and hence stress acting on the GTO 500 is extremely reduced.

Since no projections appear on the anode electrode 501, further, it is also possible to improve electric and thermal contact between the thermal buffer plate 171 and the anode electrode 501. Therefore, heat generation is reduced in the contact portion between these members, while it is also possible to attain excellent radiation properties for various types of heat loss generated in the GTO 500.

While the GTO 500 according to this embodiment is so formed as to utilize the transverse resistances of the additional resistive layers 504 as a modification of the fourth embodiment, the same may further be carried out a modification of the first embodiment in which the additional resistive layer 104 is arranged immediately under the n emitter layer 15. Namely, the lower major surface of the semiconductor substrate may be selectively removed in the GTO according to the first or second embodiment so that the additional resistive layers 104 and 204 are formed on the removed regions so that lower surfaces thereof are flush with the lower major surface of the semiconductor substrate. Also in this case, it is possible to attain the effects of avoiding stress concentration and improving the thermal and electric contact, similarly to the GTO 500 according to this embodiment.

Further, the lower surfaces of the additional resistive layers 504 may be upwardly retracted from that of the p emitter layer 511. Namely, the lower surfaces of the additional resistive layers 504 may not be outwardly protrusive beyond the lower surface of the p emitter layer 511. Also in this case, it is possible to attain effects which are similar to those of the GTO 500.

In addition, the thickness of the additional resistive layer 104 may be set at a large value in regions connected with the p emitter layer 11 in the first embodiment or the like, for example, so that portions connected with the additional resistive layer 104 are not protrusive. Also in this case, it is possible to attain effects which are similar to those of the GTO 500.

7. Sixth Embodiment

Figure 16:
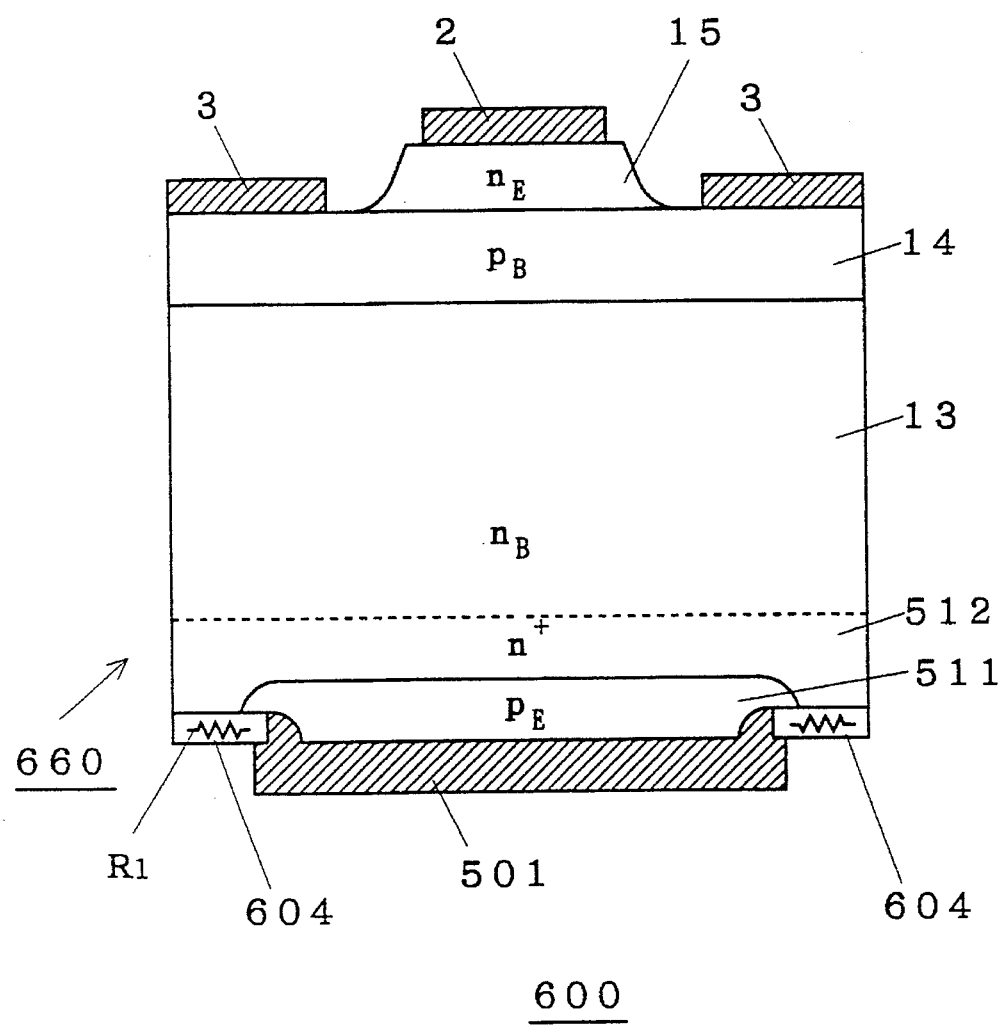
FIG. 16 is a sectional view showing a GTO according to a sixth embodiment of the present invention.

A GTO according to a sixth embodiment of the present invention is now described. FIG. 16 is a sectional view taken along the line X—X (FIG. 3) showing the GTO according to this embodiment. This GTO 600 is a modification of the GTO 500 according to the fifth embodiment.

In the GTO 500, a lower major surface of a substantially discoidal silicon semiconductor substrate 660 is selectively removed while additional resistive layers 604 are so formed that lower surfaces thereof are flush with the lower major surface of the semiconductor substrate 660, similarly to the GTO 500. However, the GTO 600 is characteristically different from the GTO 500 in a point that the additional resistive layers 604 containing an impurity are formed not as polysilicon layers but by epitaxial growth.

Therefore, the impurity contained in the additional resistive layers 604 is simultaneously introduced in the process of epitaxial growth. Consequently, influence by impurity concentration in an n buffer layer 512 is hardly exerted while it is possible to select the dosage of the impurity widely at desire. Namely, it is possible to readily obtain desired values of additional resistances $R_1$ over a wide range.

While the GTO 600 of this embodiment is illustrated as a modification of the fifth embodiment, the additional resistive layers may be formed by epitaxial growth in place of formation of the additional layers by polysilicon also in the first, second or fourth embodiment. Also in this case, it is possible to readily obtain desired values of the additional resistances $R_1$ over a wide range, similarly to the GTO 600 according to this embodiment.

8. Seventh Embodiment

Figure 17:
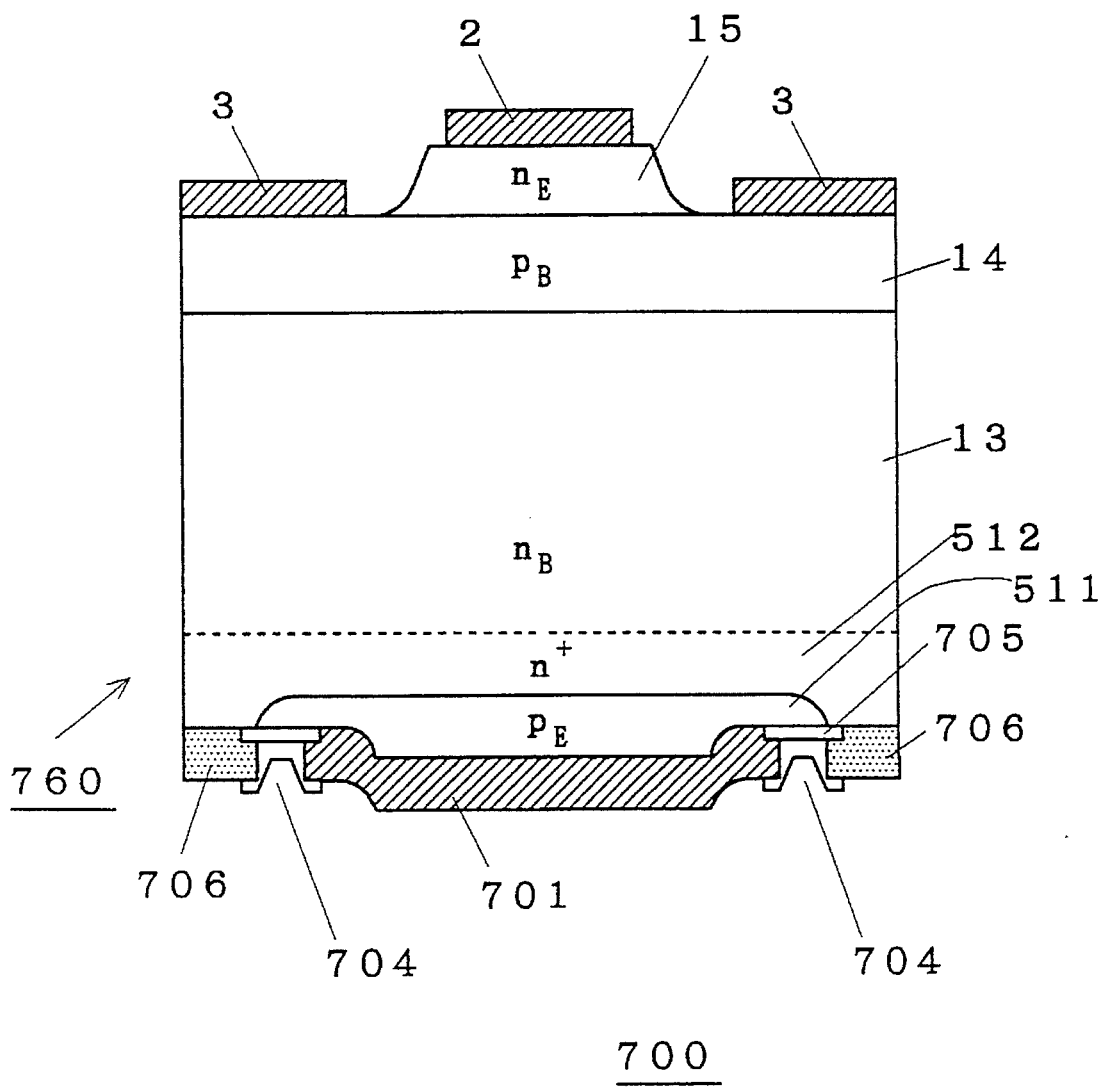
FIG. 17 is a sectional view showing a GTO according to a seventh embodiment of the present invention.

A GTO according to a seventh embodiment of the present invention is now described. FIG. 17 is a sectional view taken along the line X—X (FIG. 3) showing the GTO according to this embodiment.

In this GTO 700, a lower major surface of a substantially discoidal silicon semiconductor substrate 760 is selectively removed similarly to the GTO 500 according to the fifth embodiment. The selectively removed regions are positioned immediately under gate electrodes 3, and extend over the entire lower surface of an n buffer layer 512 and partial regions of a lower surface of a p emitter layer 511 which are adjacent thereto. Junctions between the n emitter layer 511 and the n buffer layer 512 exposed on the selectively removed regions and portions close thereto are covered with insulating films 705 such as oxide films, for example.

Electrodes 706 which are mainly made of aluminum are connected to regions not covered with the insulating films 705 on the lower surface of the n buffer layer 512. An anode electrode 701 is connected to regions not covered with the insulating films 705 on the lower surface of the p emitter layer 511, while clearances are defined between the anode electrode 701 and the electrodes 706. Film-shaped additional resistive layers 704 which are made of polysilicon, for example, are formed in the clearances, while these additional resistive layers 704 are connected to both of the anode electrode 701 and the electrodes 706.

Therefore, the n buffer layer 512 and the anode electrode 701 are connected with each other through transverse resistances of the additional resistive layers 704. Namely, the transverse resistances of the additional resistive layers 704 form additional resistances $R_1$ which are interposed between the n buffer layer 512 and the anode electrode 701.

Thus, the GTO 700 utilizes the transverse resistances of the additional resistive layers 704, whereby it is possible to readily obtain high additional resistances $R_1$ by setting the film-shaped additional resistive layers 704 in small thicknesses. Further, it is also possible to finely adjust the values of the additional resistances $R_1$ by adjusting the widths of the clearances between the anode electrode 701 and the electrodes 706. Namely, it is possible to readily obtain the additional resistances $R_1$ in desired values in the GTO according to this embodiment.

The insulating films 705 enable utilization of the transverse resistances of the additional resistive layers 704 by electrically insulating the additional resistive layers 704 from the p emitter layer 511 and the n buffer layer 512, while the same also function to protect the junctions.

21

9. Eighth Embodiment

Figure 18:
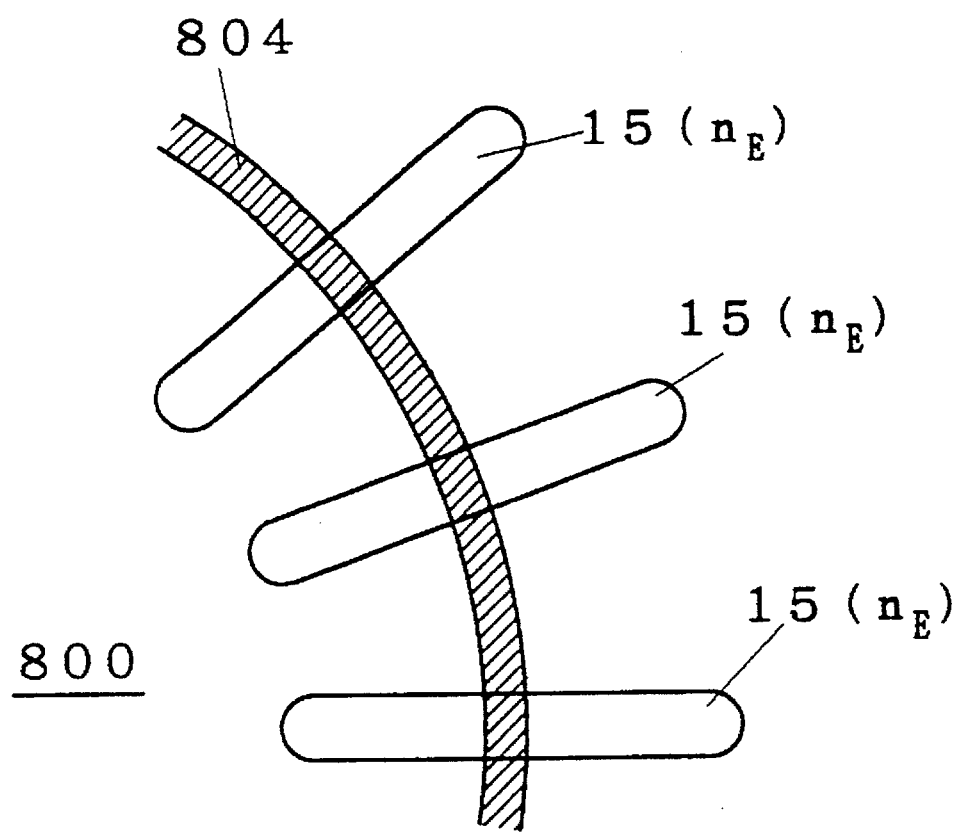
FIG. 18 is a partial plan view showing a GTO according to an eighth embodiment of the present invention.

A GTO according to an eighth embodiment of the present invention is now described. FIG. 18 is a plan view of the GTO 800 according to this embodiment, illustrating n emitter layers 15 and an additional resistive layer 804 in an overlapped manner, in particular. This GTO 800 is characteristically different from the remaining embodiments in a point that the additional resistive layer 804 is provided in the form of a concentric strip along the circumference of a semiconductor substrate to intersect with the n emitter layers 15 around central portions thereof. Thus, the additional resistive layer 804 is necessarily arranged immediately under the n emitter layers 15 in proximity the central portions thereof, whereby current concentration in a turnoff time is prevented similarly to the GTO 100 according to the first embodiment.

Further, the additional resistive layer 804 is formed to intersect with the radially formed n emitter layers 15, whereby it is possible to readily form the additional resistive layer 804 immediately under the n emitter layers 15 in proximity to the central portions thereof without accurately aligning the n emitter layers 15 and the additional resistive layer 804. Namely, no strict accuracy is required for alignment of mask patterns for forming the same.

Figure 19:
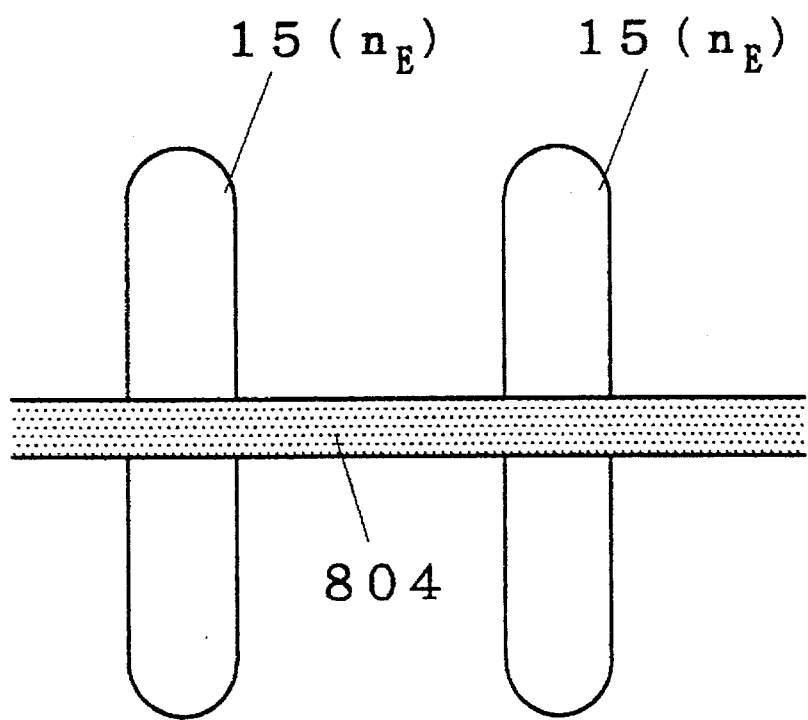
FIG. 19 is a partial plan view showing a modification of the GTO according to the eighth embodiment of the present invention.

In place of the radial arrangement shown in the plan view of FIG. 3 or 18, the n emitter layers 15 may alternatively be arranged in parallel with each other as shown in a plan view of FIG. 19, for example. In this case, the additional resistive layer 804 may also be arranged in the form of a strip intersecting with the n emitter layers 15. Also in such arrangement of the n emitter layers 15 and the additional resistive layer 804, an effect similar to that of the GTO 800 can be attained.

10. Ninth Embodiment

Figure 20:
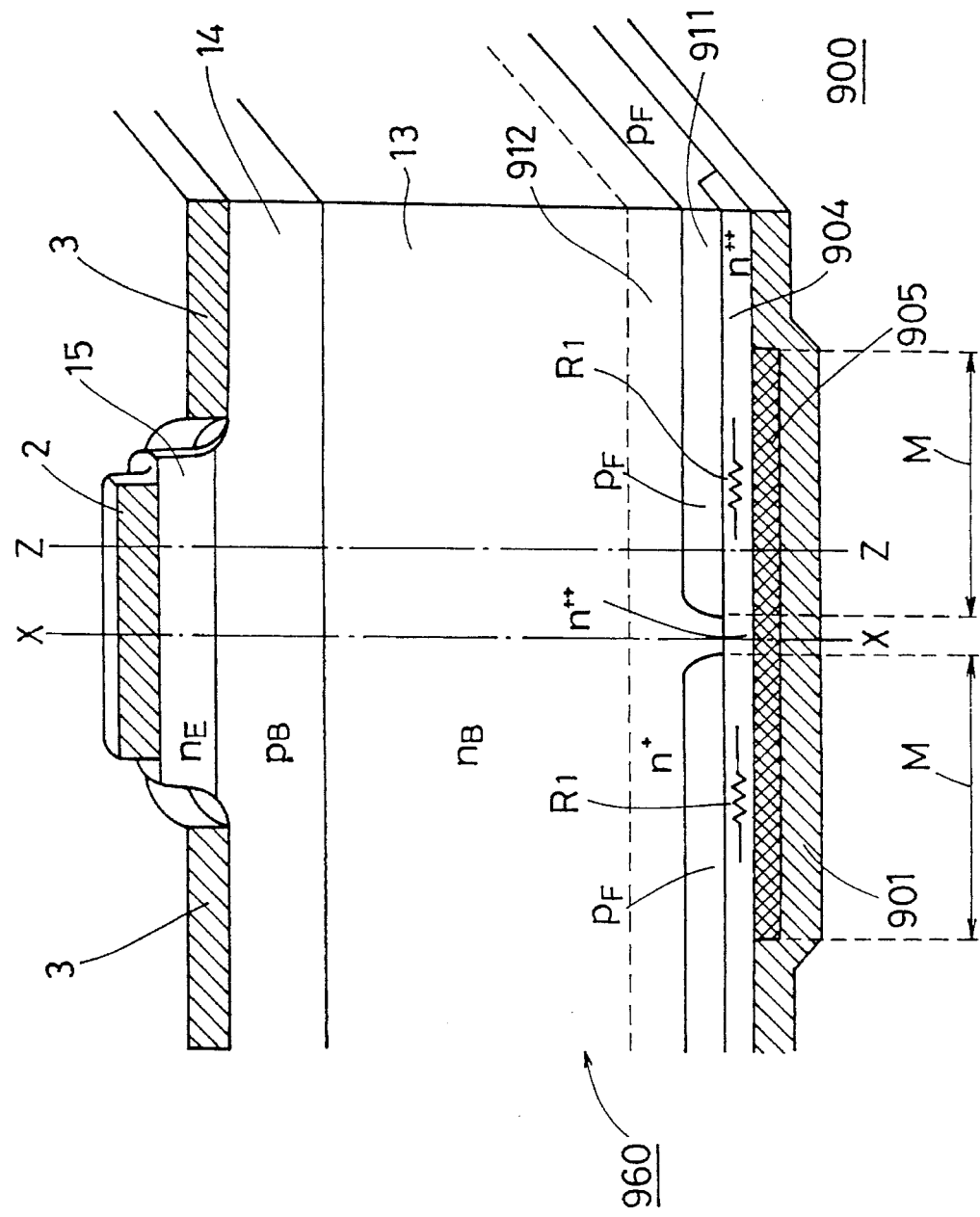
FIG. 20 is a sectional view showing a GTO according to a ninth embodiment of the present invention.
Figure 21:
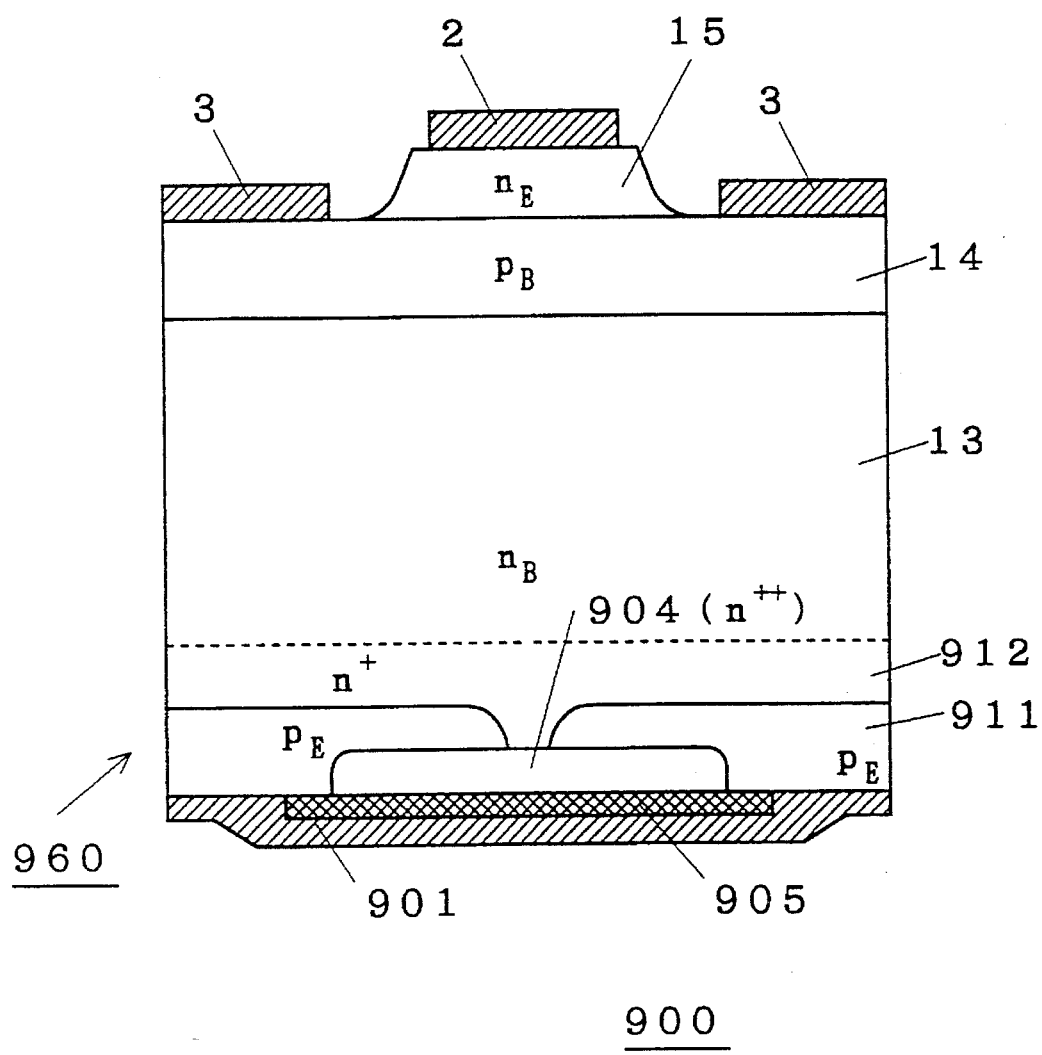
FIG. 21 is a sectional view showing the GTO according to the ninth embodiment of the present invention.
Figure 22:
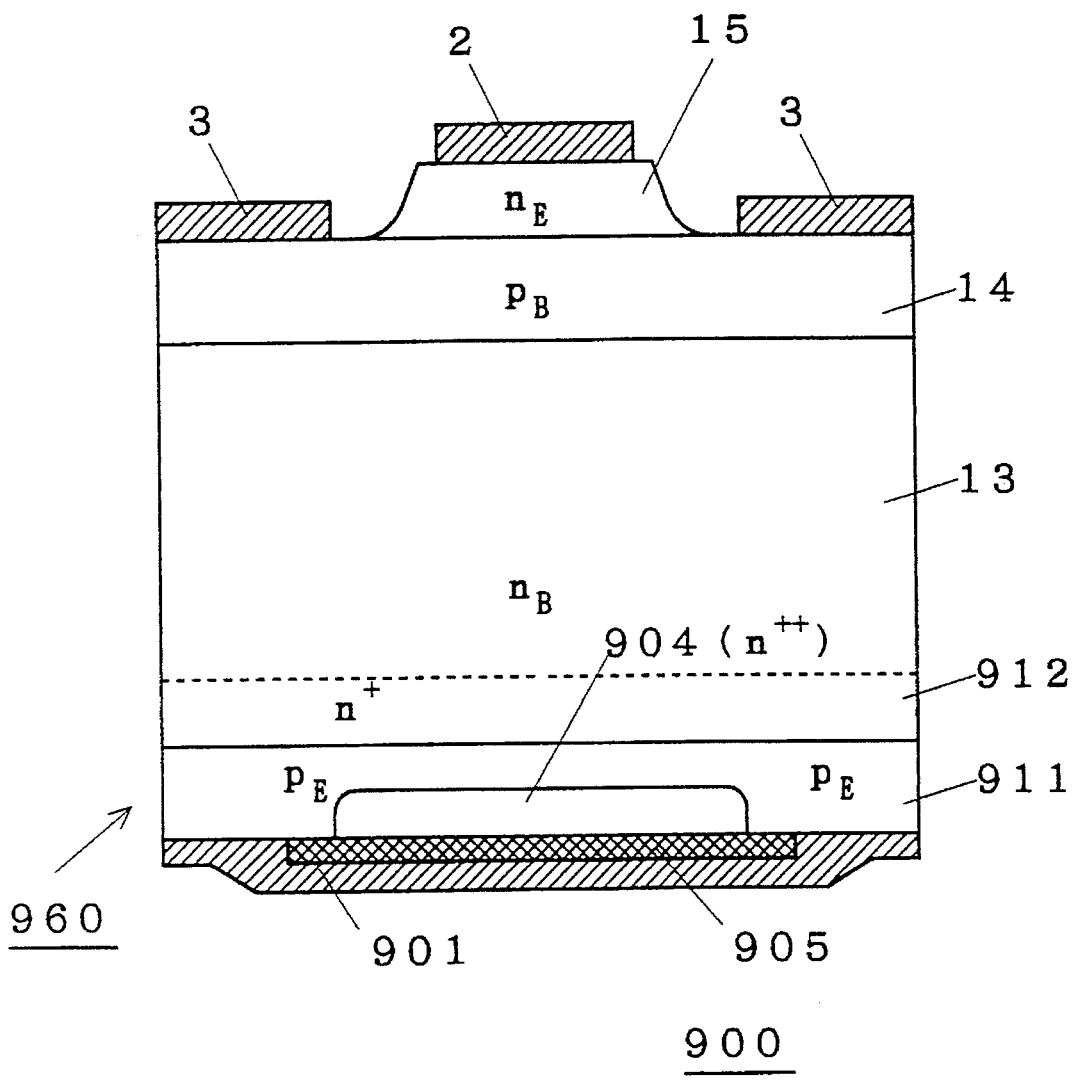
FIG. 22 is a sectional view showing the GTO according to the ninth embodiment of the present invention.
Figure 23:
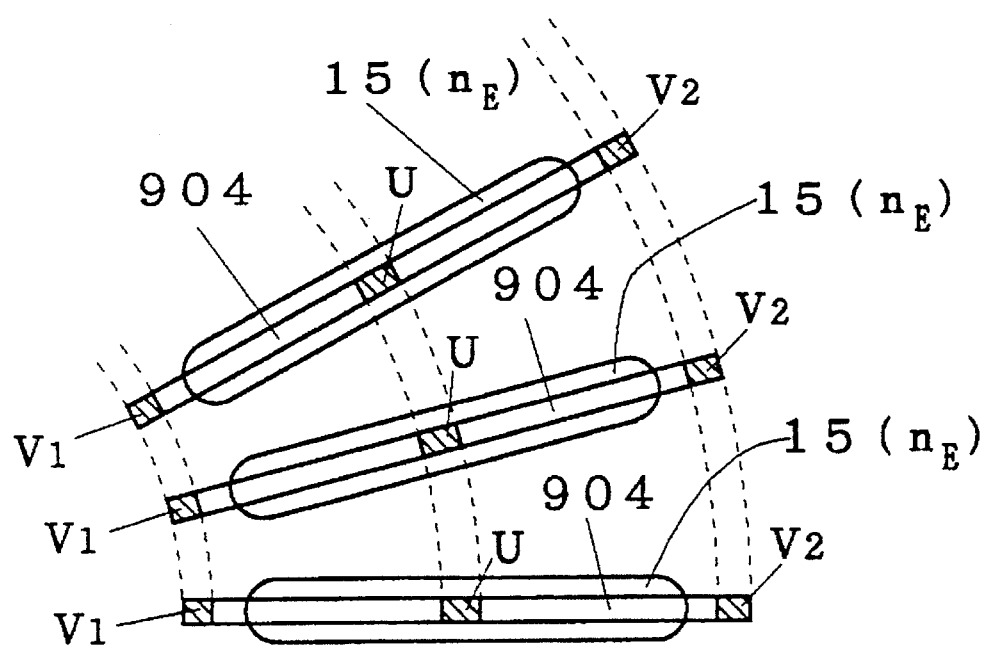
FIG. 23 is a partial plan view showing the GTO according to the ninth embodiment of the present invention.

A GTO according to a ninth embodiment of the present invention is now described. FIG. 20 is a sectional view taken along a line Y—Y (FIG. 3) showing the GTO according to this embodiment. On the other hand, FIGS. 21 and 22 are sectional views taken along lines X—X (FIGS. 3 and 20) and Z—Z (FIGS. 3 and 20) showing this GTO respectively. Further, FIG. 23 is a plan view of the GTO according to this embodiment, illustrating n emitter layers 15 and additional resistive layers 904 described later in an overlapped manner, in particular. With reference to these figures, the structure and the operation of the GTO according to this embodiment are described.

In this GTO 900, an n-type impurity of high concentration is selectively introduced into a lower major surface of a substantially discoidal silicon semiconductor substrate 960, so that the additional resistive layers 904 are selectively formed as $n^{++}$ semiconductor layers. These additional resistive layers 904 are formed as islands extending along the longitudinal directions of n emitter layers 15. Upper surfaces of the additional resistive layers 904 and a lower surface of an n buffer layer 912 are connected with each other in portions U corresponding to those immediately under central portions of the n emitter layers 15. Upper and side surfaces of the additional resistive layers 904 excluding the connecting portions U are enclosed with adjacent p emitter layers 911. The connecting portions with respect to the n buffer layer 912 are positioned on central portions of the additional resistive layers 904.

Further, an insulating film 905 is selectively formed on the lower major surface of the semiconductor substrate 960, to cover the lower surfaces of the additional resistive layers 904 excluding both end portions $V_1$ and $V_2$. The insulating film 905 is formed by an oxide film, for example. An anode electrode 901 is formed on a lower surface of the p emitter layer 911 which is exposed on the lower major surface of the semiconductor substrate 960, as well as to portions of the lower surfaces of the additional resistive layers 904 which are not covered with the insulating film 905, i.e., the both end portions $V_1$ and $V_2$. Namely, the anode electrode 901 and the p emitter layer 911 are connected with each other through the additional resistive layers 904. The connection between the anode electrode 901, the p emitter layer 911 and the additional resistive layers 904 is implemented by ohmic contact.

The GTO 900 is formed in the aforementioned manner, whereby transverse resistances across the central portions U and the both end portions $V_1$ and $V_2$ in the additional resistive layers 904 form additional resistances $R_1$ which are interposed between the n buffer layer 912 and the anode electrode 901. Therefore, it is possible to readily obtain high additional resistances $R_1$ by setting the additional resistive layers 904 in small thicknesses. Further, the additional resistive layers 904 contain the impurity in high concentration, whereby it is possible to obtain practically required values of the additional resistances $R_1$ by setting the additional resistive layers 904 in small thicknesses.

The additional resistances $R_1$ are increased as longitudinal distances M (FIG. 20) between the connecting portions U with the n buffer layer 912 and the connecting portions $V_1$ and $V_2$ with the anode electrode 901 in the additional resistive layers 904 are increased. Therefore, it is also possible to finely adjust the values of the additional resistances $R_1$ by adjusting the distances M. Further, the additional resistance layers 904 are formed to extend along the longitudinal directions of the n emitter layers 15, whereby the values of the distances M can be set over a wide range. Thus, it is possible to adjust the values of the additional resistances $R_1$ over a wide range.

In general, a current from the p emitter layer 911 tends to concentrate in the central portions of the n emitter layers 15 in a turnoff time, and this serves as a factor increasing turnoff loss. In the GTO 900, however, the additional resistive layers 904 which are $n^{++}$ semiconductor layers appear immediately under the central portions of the n emitter layers 15 in the connecting portions U, whereby current concentration in the turnoff time is relaxed similarly to the first embodiment.

Figure 24:
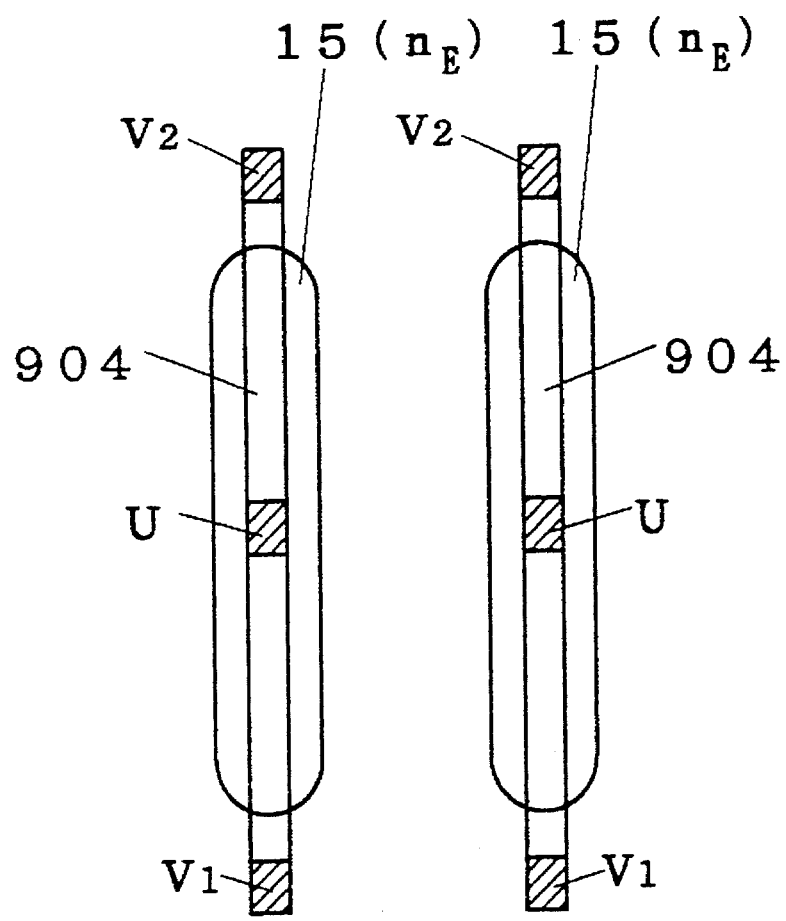
FIG. 24 is a partial plan view showing a modification of the GTO according to the ninth embodiment of the present invention.

In place of the radial arrangement of the n emitter layers 15 shown in the plan view of FIG. 3 or 23, the n emitter layers 15 may alternatively be arranged in parallel with each other as shown in a plan vie of FIG. 24, for example. In this case, the additional resistive layers 904 may also be arranged in parallel with each other along the n emitter layers 15 respectively. Also when the n emitter layers 15 and the additional resistive layers 904 are arranged in such a manner, an effect similar to that of the GTO 900 can be attained.

11. Tenth Embodiment

Figure 25:
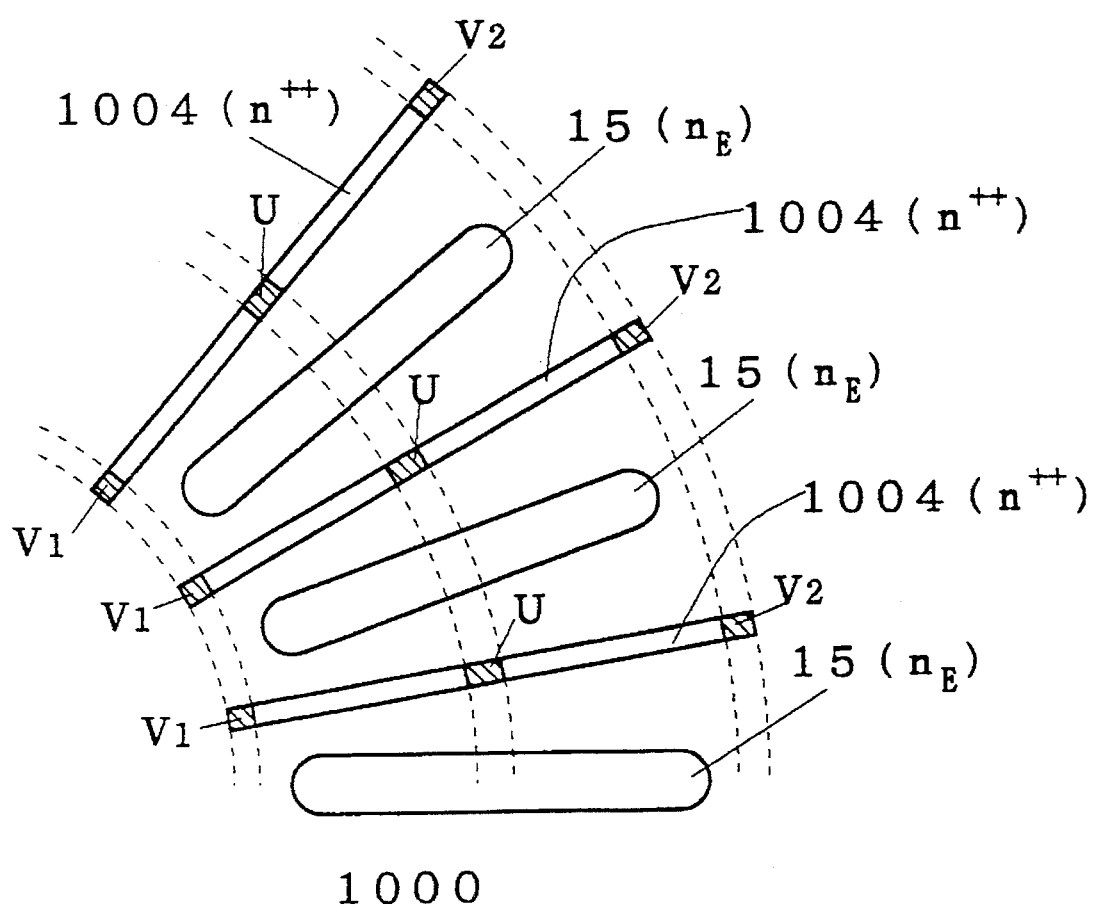
FIG. 25 is a partial plan view showing a GTO according to a tenth embodiment of the present invention.

A GTO according to a tenth embodiment of the present invention is now described. FIG. 25 is a plan view showing the GTO 1000 according to this embodiment, illustrating n emitter layers 15 and additional resistive layers 1004 in an overlapped manner in particular. This GTO 1000 is a modification of the GTO 900 according to the ninth embodiment.

This GTO 1000 is characteristically different from the ninth embodiment in a point that the additional resistive layers 1004 which are formed as $n^{++}$ semiconductor layers are arranged immediately under gate electrodes 3, in place of immediately under the n emitter layers 15. Consequently, both of connecting portions U with an n buffer layer 912 and connecting portions V₁ and V₂ with an anode electrode 901 are positioned immediately under the gate electrodes 3 in the additional resistive layers 1004.

Thus, the connecting portions U between the additional resistive layers 1004 and the n buffer layer 912 are provided immediately under the gate electrodes 3, whereby holes can be readily injected from portions corresponding to those immediately under the emitter layers 15 in the p emitter layer 911, similarly to the second embodiment.

Figure 26:
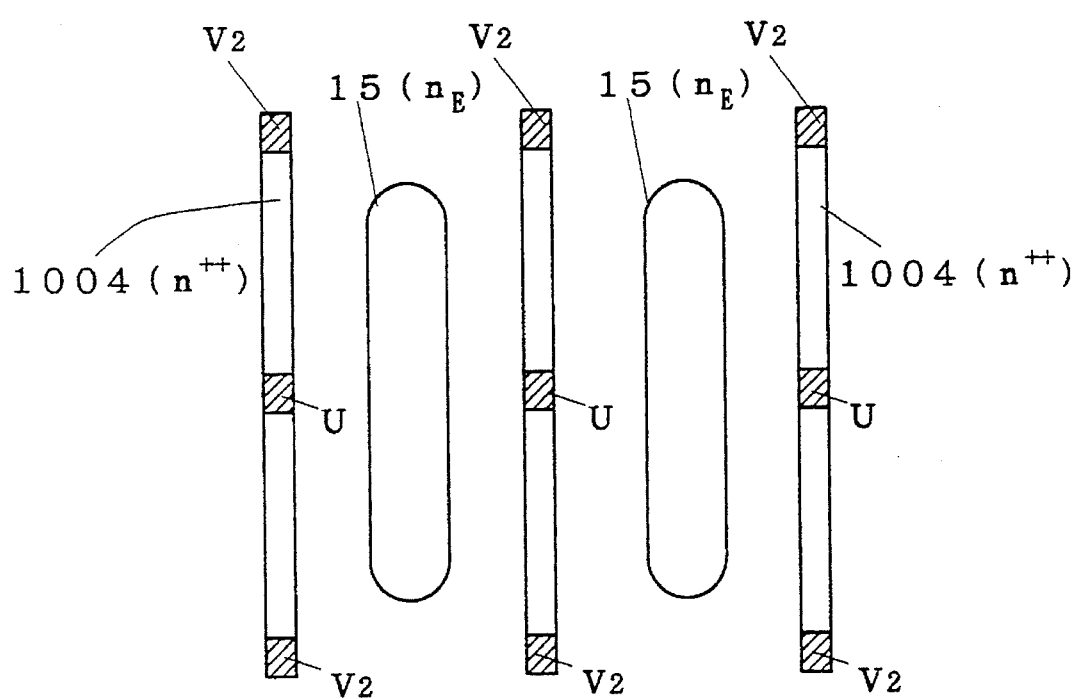
FIG. 26 is a partial plan view showing a modification of the GTO according to the tenth embodiment of the present invention.

In place of the radial arrangement of the n emitter layers 15 shown in the plan view of FIG. 3 or 25, the n emitter layers 15 may alternatively be arranged in parallel with each other as shown in a plan view of FIG. 26, for example. In this case, the additional resistive layers 1004 may also be arranged in parallel with the n emitter layers 15. Also when the n emitter layers 15 and the additional resistive layers 1004 are arranged in such a manner, an effect similar to that of the GTO 1000 can be attained.

Figure 27:
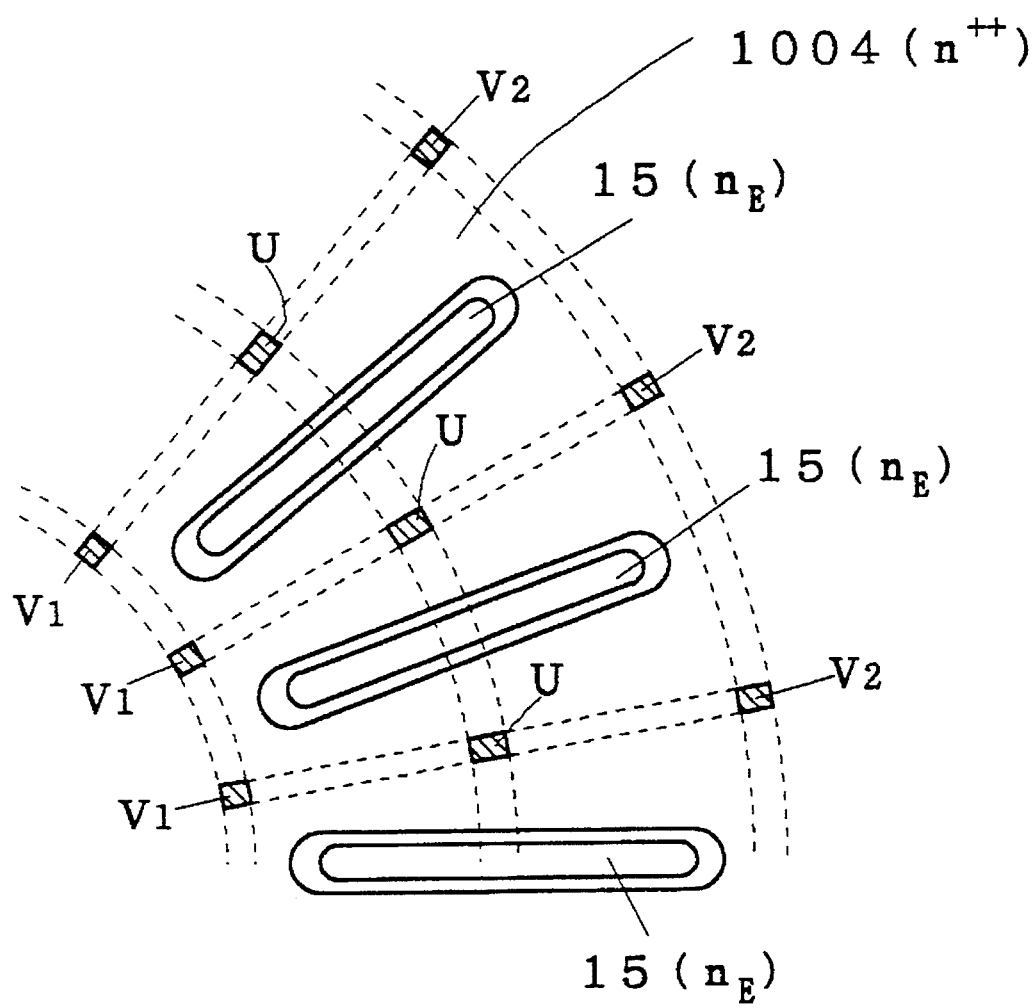
FIG. 27 is a partial plan view showing another modification of the GTO according to the tenth embodiment of the present invention.

As shown in a plan view of FIG. 27, further, the additional resistive layers 1004 may be formed to enclose regions corresponding to those immediately under the n emitter layers 15. In this case, the additional resistive layers 1004 are formed substantially over entire surfaces of the regions corresponding to those immediately under the gate electrodes 3. Connecting portions U with the n buffer layer 912 and connecting portions V₁ and V₂ with the anode electrode 901 in the additional resistive layers 1004 are separated from each other with distances, similarly to FIG. 25. Also according to this structure, it is possible to attain an effect similar to that of the embodiment shown in FIG. 25.

12. Eleventh Embodiment

Figure 28:
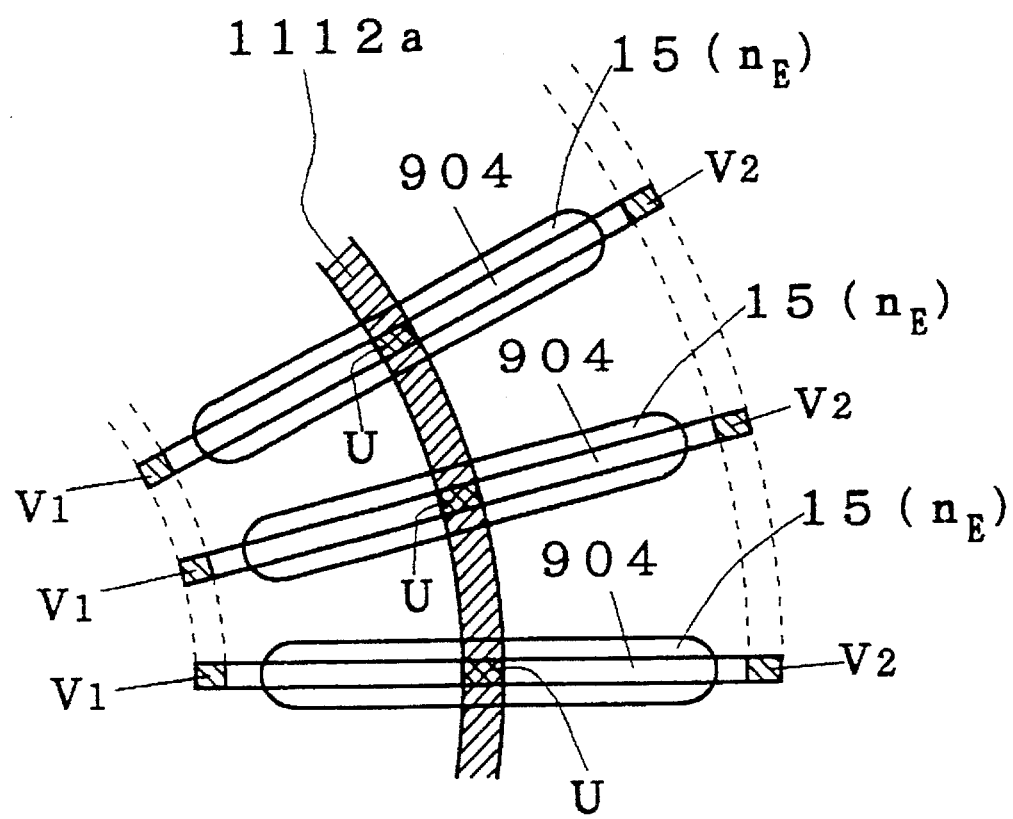
FIG. 28 is a partial plan view showing a GTO according to an eleventh embodiment of the present invention.
Figure 29:
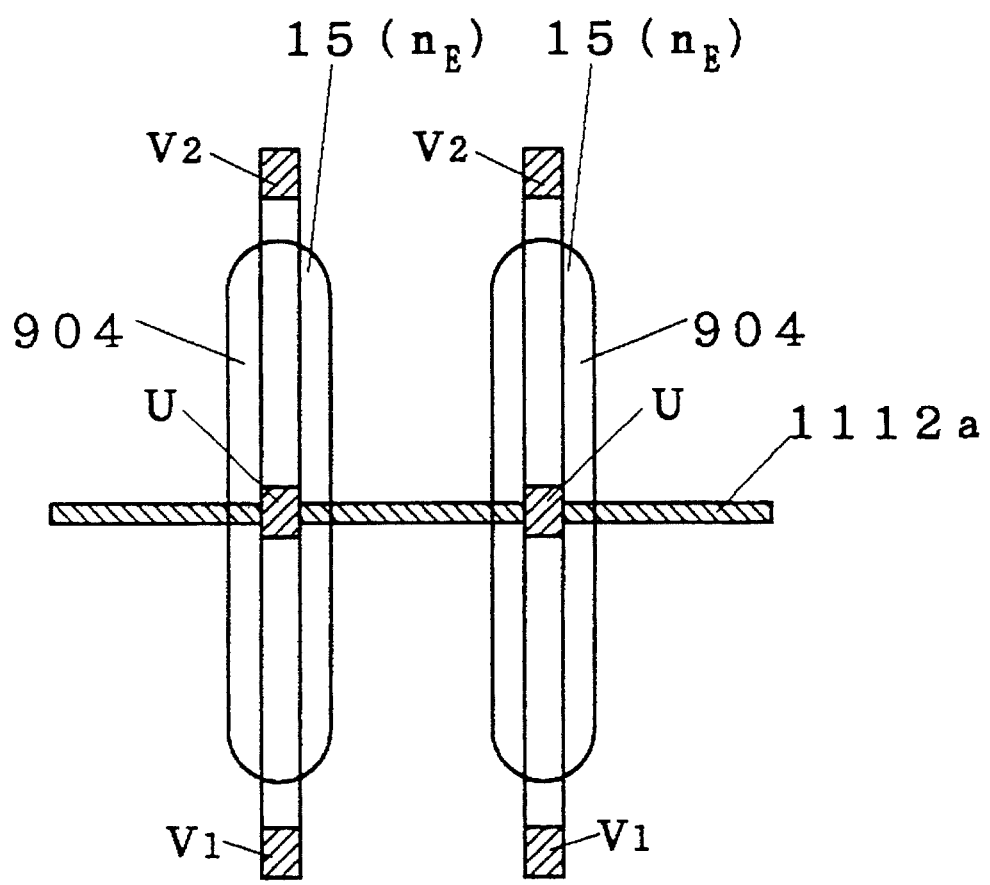
FIG. 29 is a partial plan view showing a modification of the GTO according to the eleventh embodiment of the present invention.

A GTO according to an eleventh embodiment of the present invention is now described. FIG. 28 is a plan view showing a GTO 1100 according to this embodiment, illustrating n emitter layers 15 and additional resistive layers 904 in an overlapped manner in particular. This GTO 1100 is another modification of the GTO 900 according to the ninth embodiment.

This GTO 1100 is characteristically different from the GTO 900 according to the ninth embodiment in a point that an exposed surface 1112a of an n buffer layer on a lower major surface of a semiconductor substrate is arranged concentrically along the circumference of the semiconductor substrate to intersect with the n emitter layers 15 around central portions thereof. The additional resistive layers 904 are arranged immediately under the n emitter layers 15 along the longitudinal directions thereof, similarly to the ninth embodiment. Therefore, connecting portions U between the additional resistive layers 904 and the n buffer layer are positioned immediately under portions close to the central portions of the n emitter layers 15, similarly to the ninth embodiment. Thus, it is possible to attain an effect of preventing current concentration in a turnoff time.

Further, the exposed surface 1112a of the n buffer layer is formed as a strip intersecting with the radially arranged additional resistive layers 904, whereby it is possible to readily form the connecting portions U without accurately aligning the additional resistive layers 904 with the exposed surface 1112a. Namely, no strict accuracy is required for alignment of mask patterns.

In place of the radial arrangement of the n emitter layers 15 shown in the plan view of FIG. 3 or 28, the n emitter layers 15 may alternatively be arranged in parallel with each other, for example, as shown in a plan view of FIG. 28. In this case, the exposed surface 1112a of the n buffer layer may also be arranged in the form of a strip intersecting with the n emitter layers 15. Also when the n emitter layers 15 and the exposed surface 1112a are arranged in such a manner, an effect similar to that of the GTO 1100 can be attained.

13. Twelfth Embodiment

An exemplary method of fabricating the inventive GTO is now described. FIGS. 30 to 36 are fabrication step diagrams showing the fabrication method according to this embodiment. The method of this embodiment is suitable for fabricating the GTO 300 according to the third embodiment.

Figure 30:
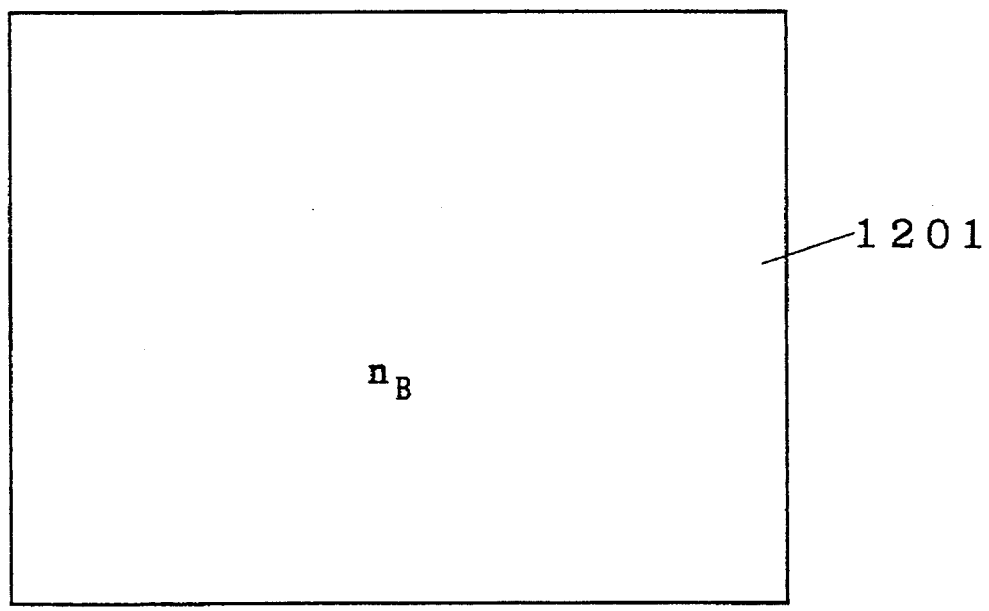
FIG. 30 illustrates a step of fabricating the GTO according to the third embodiment of the present invention.

In order to fabricate the GTO 300, a discoidal silicon semiconductor substrate 1201 containing an n-type impurity is first prepared as shown in FIG. 30.

Figure 31:
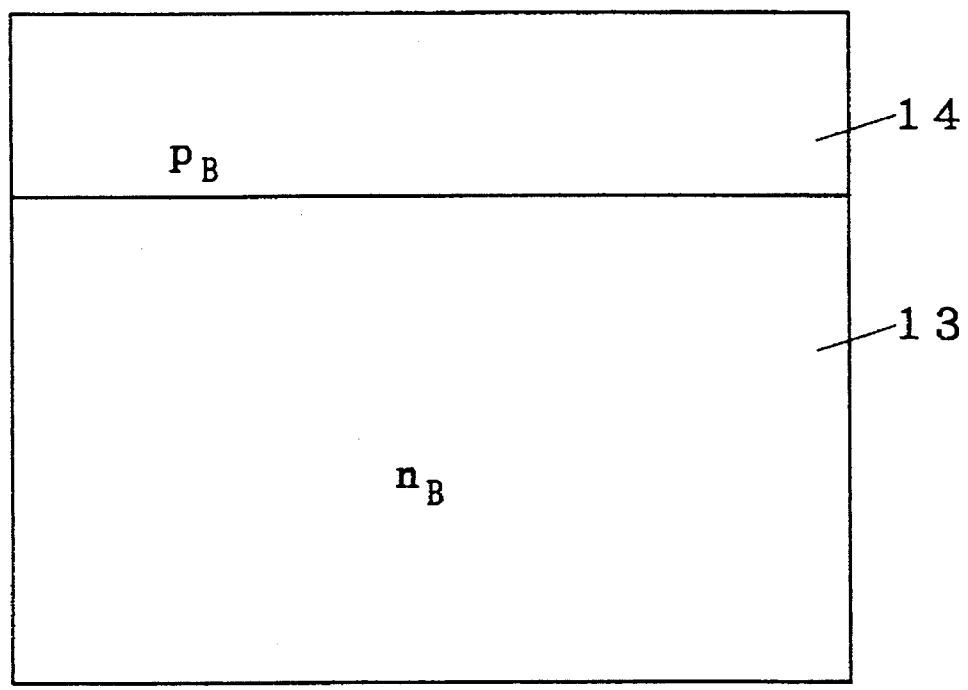
FIG. 31 illustrates a step of fabricating the GTO according to the third embodiment of the present invention.

As shown in FIG. 31, a p-type impurity is then introduced into an upper surface of the semiconductor substrate 1201, thereby bringing the semiconductor substrate 1201 into such a structure that a p base layer 14 is stacked on an n base layer 13.

Figure 32:
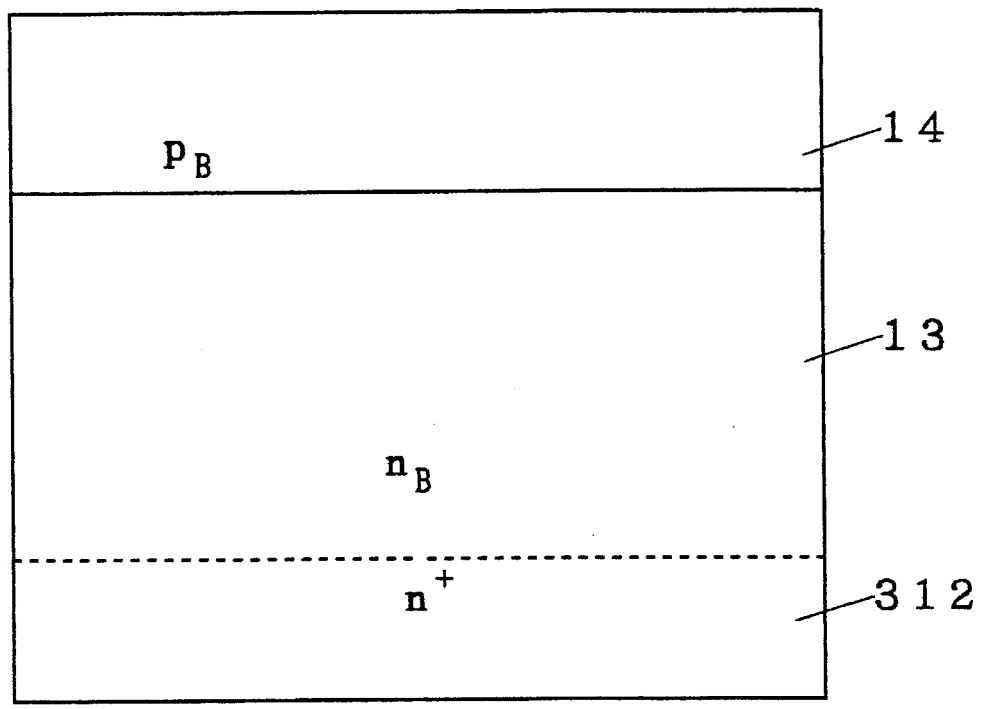
FIG. 32 illustrates a step of fabricating the GTO according to the third embodiment of the present invention.

As shown in FIG. 32, an n-type impurity is then introduced into a lower surface of the n base layer 13 in high concentration, thereby forming an n buffer layer 312.

Figure 33:
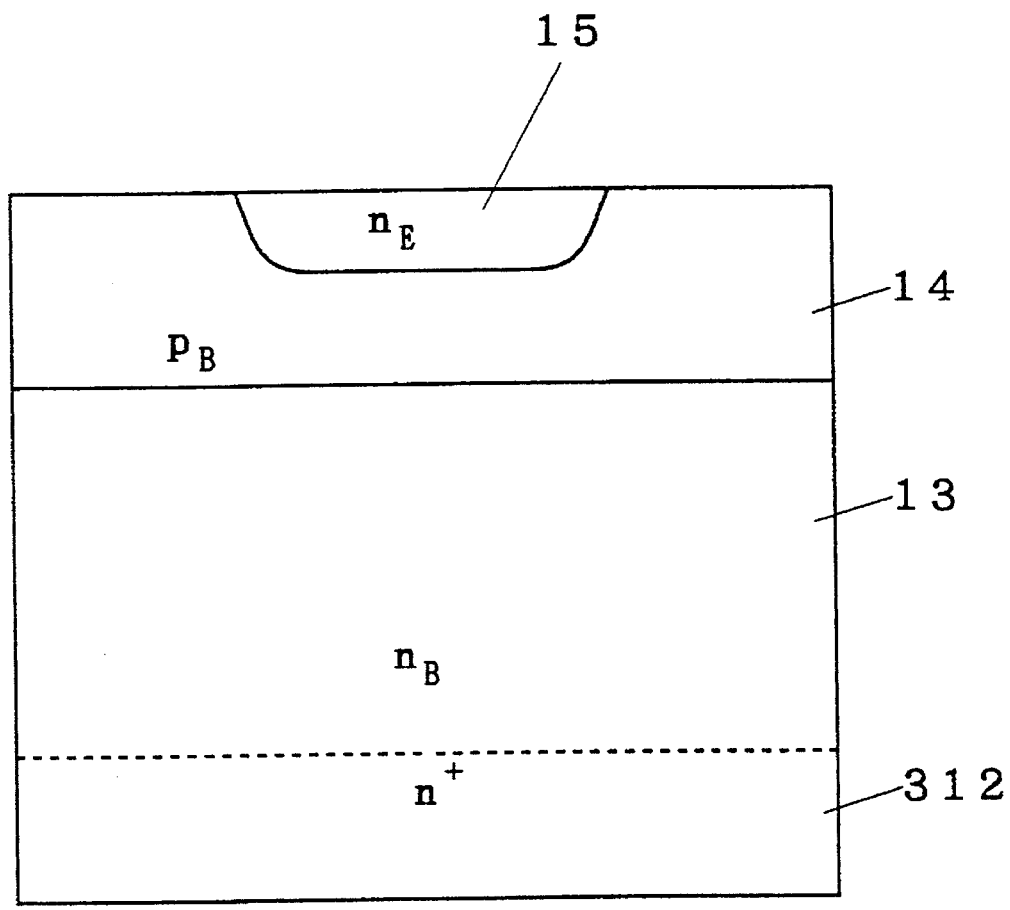
FIG. 33 illustrates a step of fabricating the GTO according to the third embodiment of the present invention.

As shown in FIG. 33, an n-type impurity is then selectively introduced into an upper surface of the p base layer 14, thereby forming each n emitter layer 15. The n emitter layer 15 is formed to extend in one direction (direction perpendicular to the plane of FIG. 33) along the upper surface of the p base layer 14.

Figure 34:
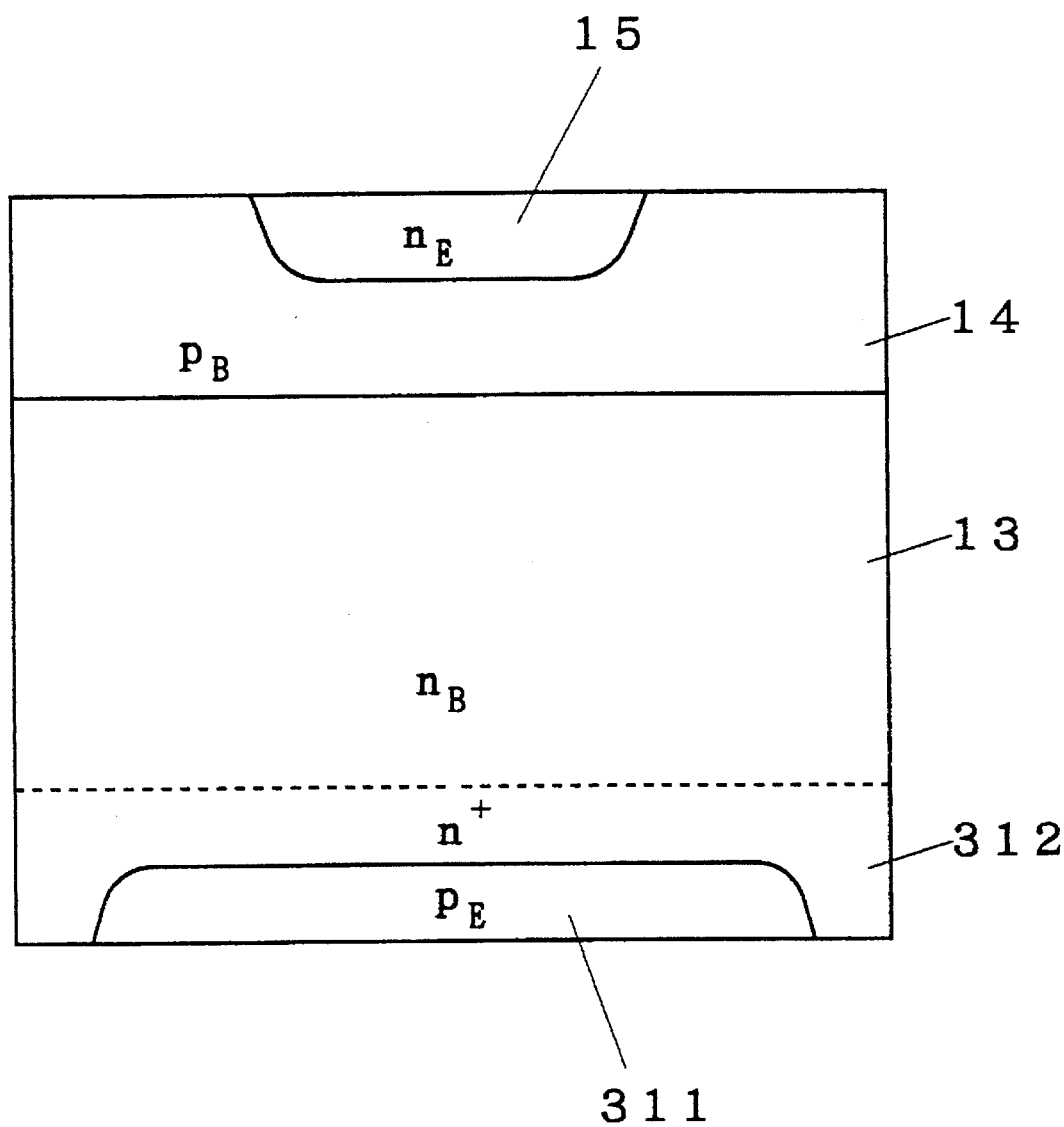
FIG. 34 illustrates a step of fabricating the GTO according to the third embodiment of the present invention.

As shown in FIG. 34, a p-type impurity is then selectively introduced into a lower surface of the n buffer layer 312, thereby forming a p emitter layer 311. The p emitter layer 311 is formed to cover a region corresponding to that immediately under the n emitter layer 15 in the lower major surface of the semiconductor substrate 1201. Consequently, the n buffer layer 312 is selectively exposed on the lower major surface of the semiconductor substrate 1201 in a portion displaced from the region corresponding to that immediately under the n emitter layer 15.

Figure 35:
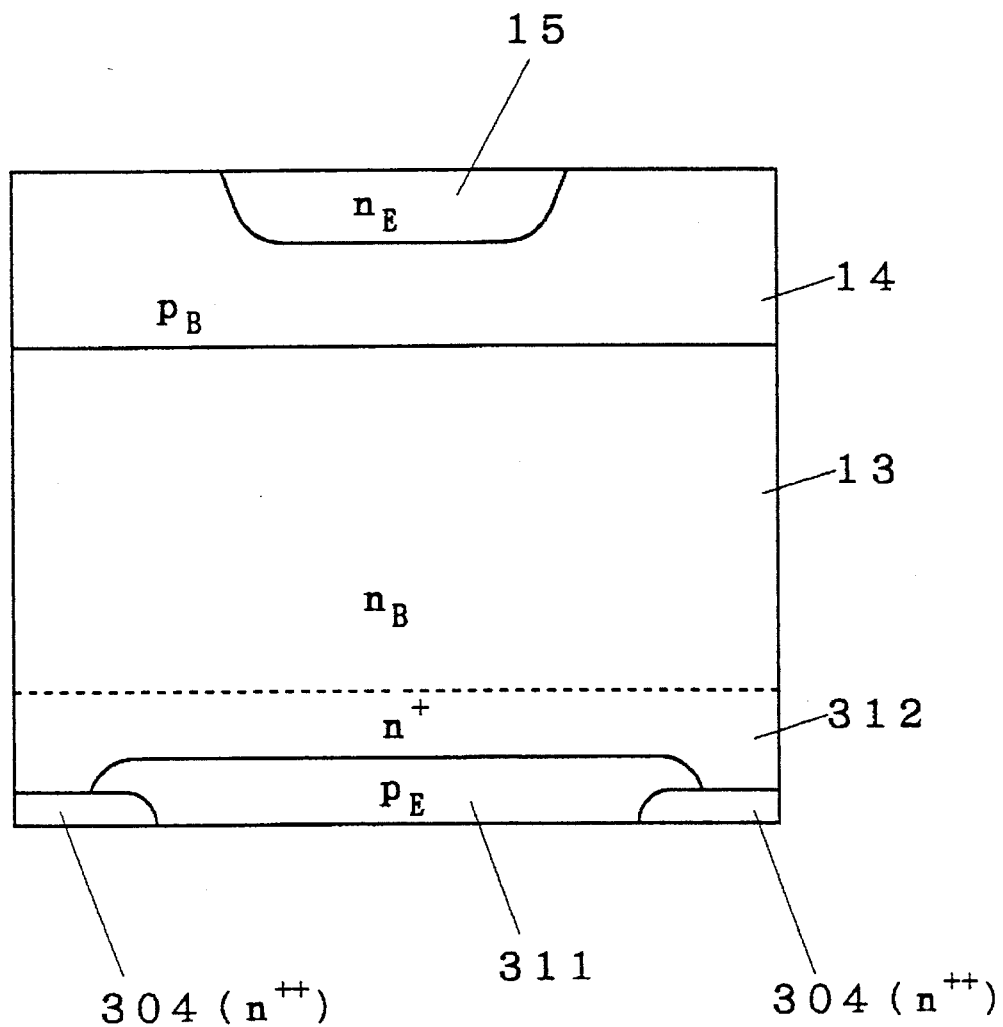
FIG. 35 illustrates a step of fabricating the GTO according to the third embodiment of the present invention.

As shown in FIG. 35, an n-type impurity of high concentration is then selectively introduced into the lower major surface of the semiconductor substrate 1201, thereby forming additional resistive layers 304 as $n^{++}$ semiconductor layers. The additional resistive layers 304 are formed over the entire exposed surface of the n buffer layer 312 and partial regions of the lower surface of the p emitter layer 311 which are adjacent thereto.

In order to introduce the n-type impurity of high concentration, an oxide film is selectively formed on the lower major surface of the semiconductor substrate 1201 excluding regions for introducing the impurity, CVD is executed with supply of $POCl_4$ gas for depositing an oxide film of phosphorus, and thereafter a driving step is carried out to diffuse the phosphorus in the semiconductor substrate 1201. It is possible to form the additional resistive layers 304 in small thicknesses at desired degrees through this step. Thereafter the phosphorus oxide film and the oxide film employed as a screen film are removed, to obtain the semiconductor substrate 1201 in the structure shown in FIG. 35.

Figure 36:
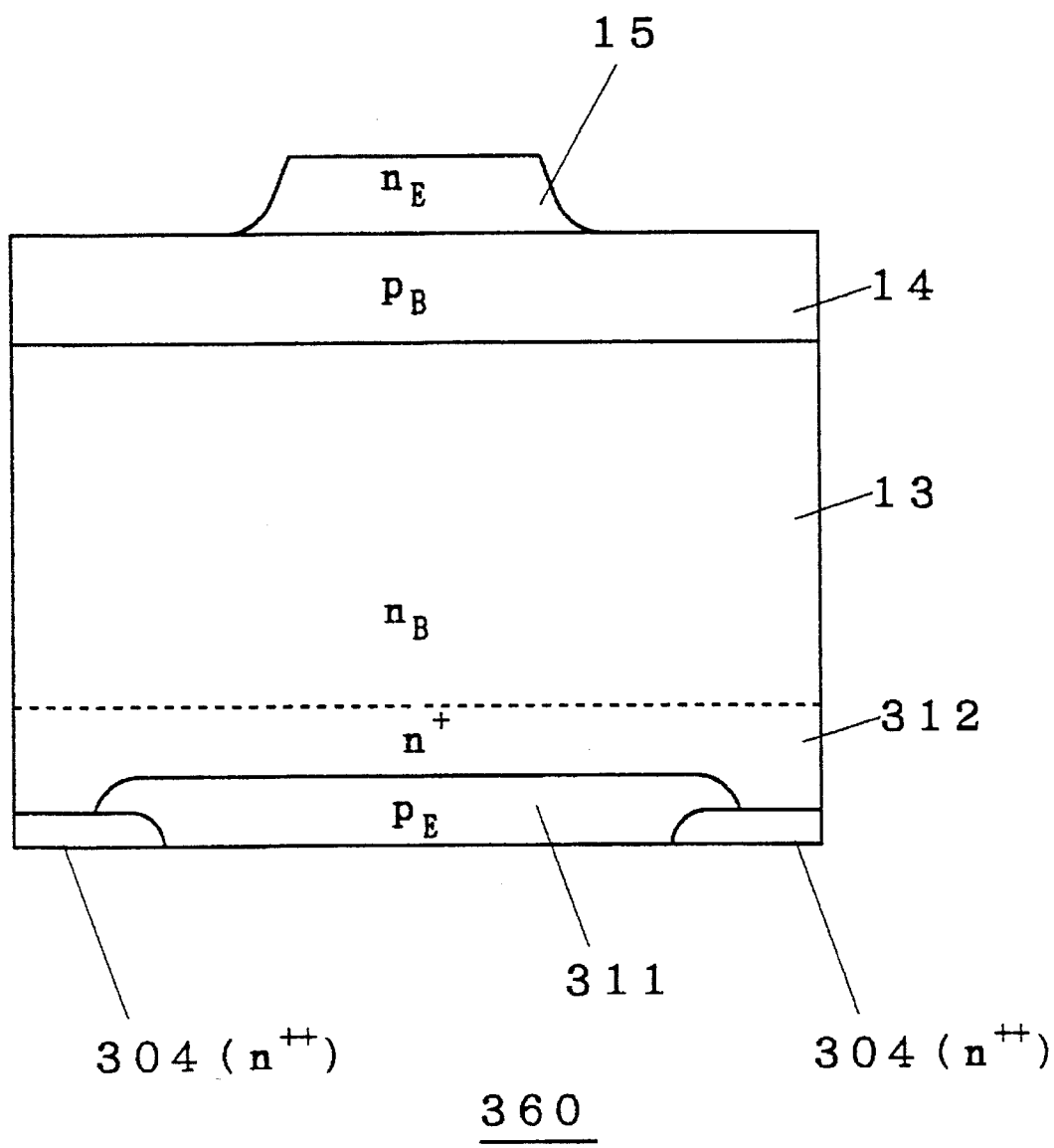
FIG. 36 illustrates a step of fabricating the GTO according to the third embodiment of the present invention.

As shown in FIG. 36, selective etching is then carried out to selectively remove the upper major surface of the semiconductor substrate 1201, thereby retracting the exposed surface of the p base layer 14 from the upper surface of the n emitter layer 15. Consequently, the semiconductor substrate 360 shown in FIG. 12 is obtained.

Referring again to FIG. 12, the anode electrode 301 is selectively formed on the lower major surface of the semiconductor substrate 360. The anode electrode 301 is formed to be connected to parts of the lower surfaces of the additional resistive layers 304 and the lower surface of the p emitter layer 311, while end portions thereof are retracted from those of the p emitter layer 311. Further, the cathode electrode 2 and the gate electrodes 3 are formed on the upper surfaces of the n emitter layer 15 and the p base layer 14 respectively. The GTO 300 is completed through the aforementioned steps.

14. Thirteenth Embodiment

Figure 37:
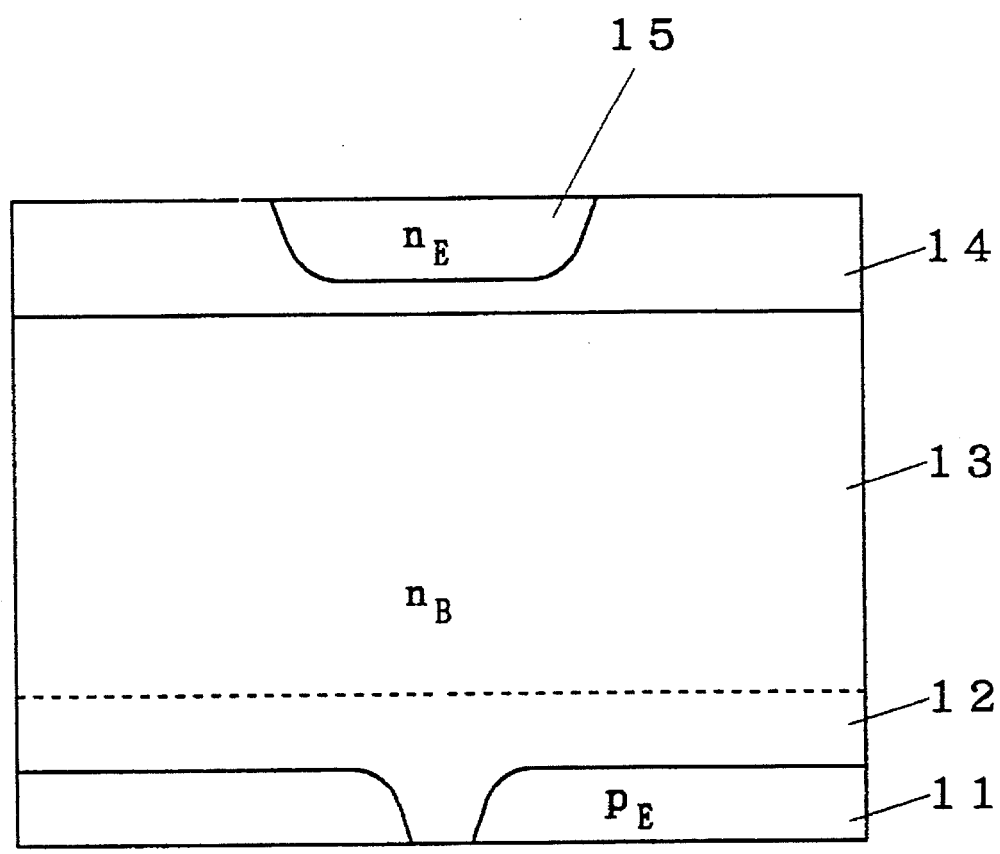
FIG. 37 illustrates a step of fabricating the GTO according to the first embodiment of the present invention.
Figure 38:
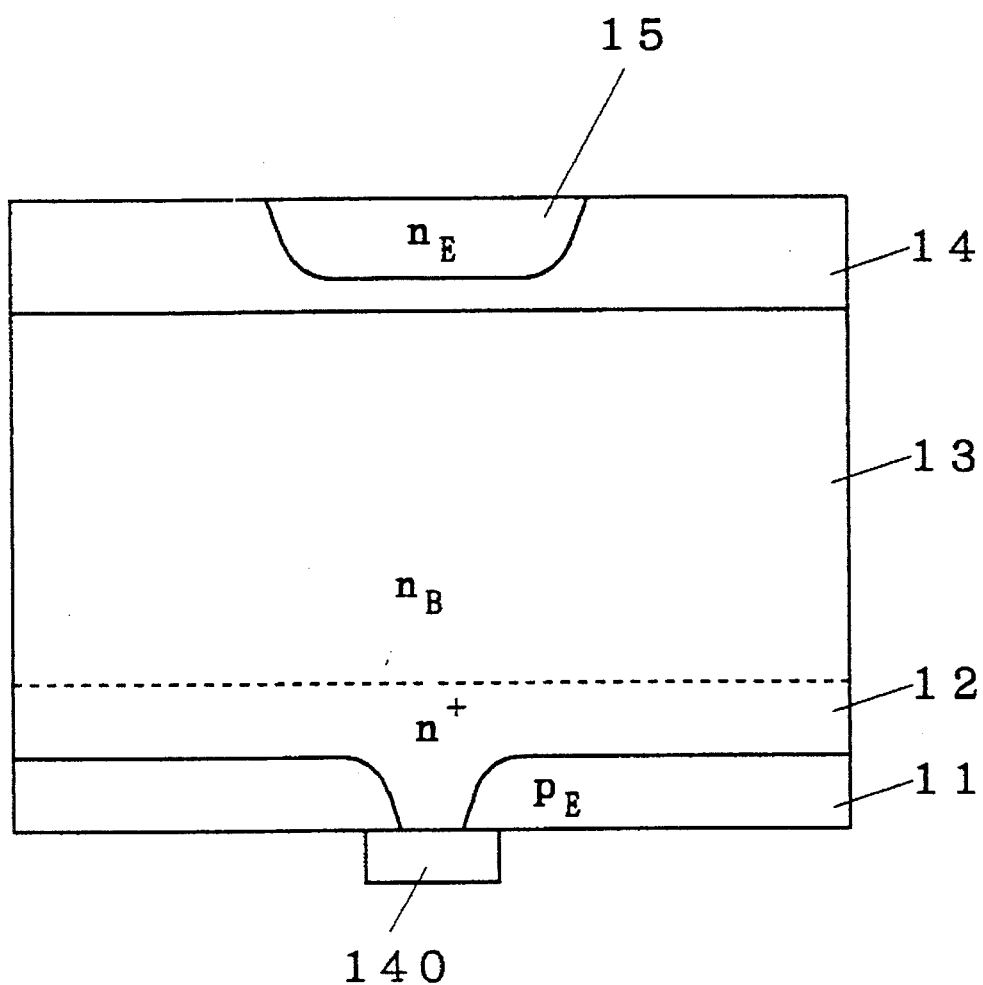
FIG. 38 illustrates a step of fabricating the GTO according to the first embodiment of the present invention.
Figure 39:
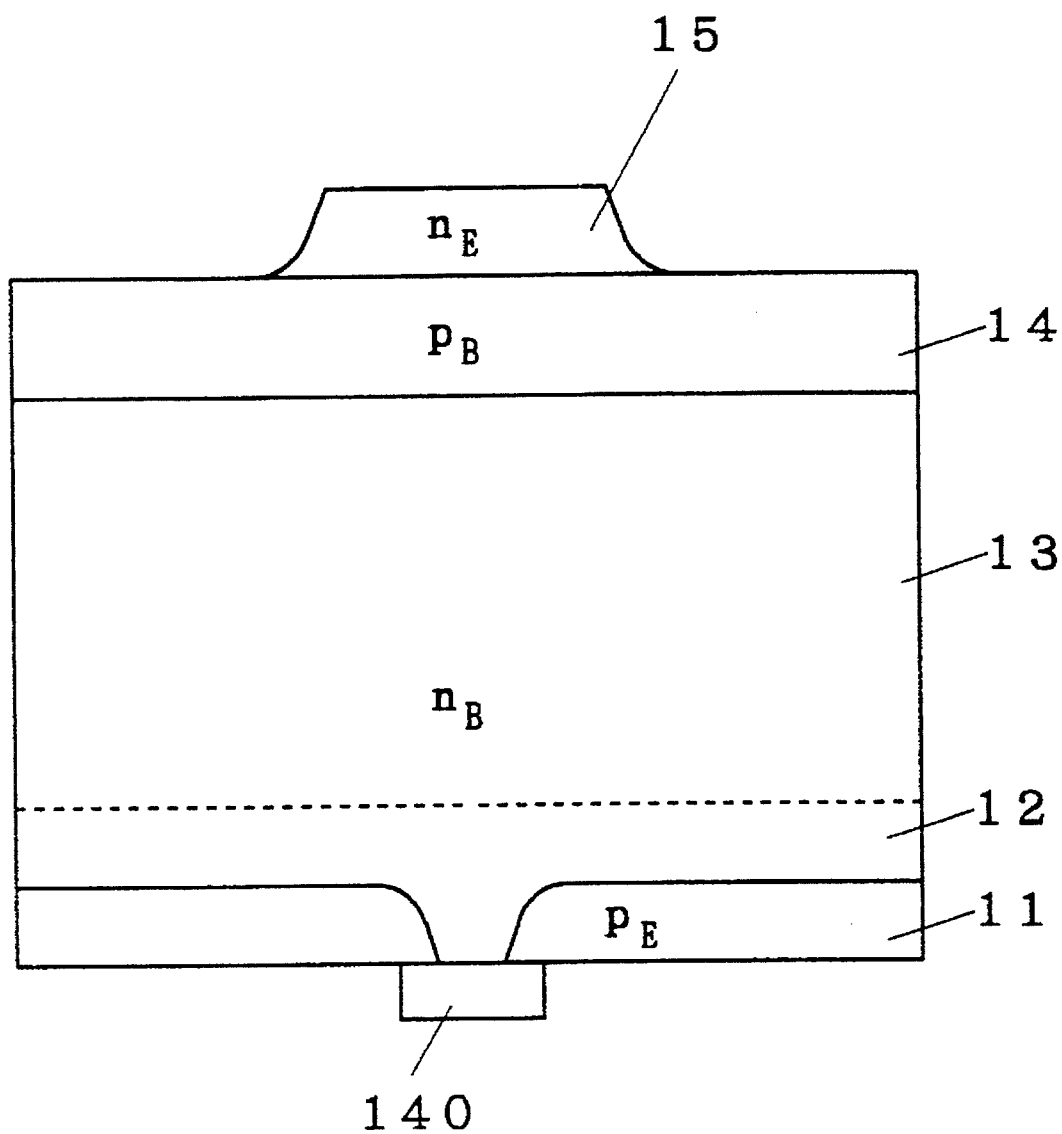
FIG. 39 illustrates a step of fabricating the GTO according to the first embodiment of the present invention.

A fabrication method which is suitable for the GTO 100 according to the first embodiment is now described. FIGS. 37 to 39 are fabrication step diagrams showing the fabrication method according to this embodiment. In order to fabricate the GTO 100, the steps shown in the step diagrams of FIGS. 30 to 33 are executed in advance of execution of the steps shown in FIGS. 37 to 39.

Thereafter the step shown in FIG. 37 is executed to selectively introduce a p-type impurity into a lower surface of the n buffer layer 312 (12), thereby forming a p emitter layer 11. The p emitter layer 11 is so formed that the n buffer layer 12 is selectively exposed on the lower major surface of the semiconductor substrate 1201 (160) in a portion corresponding to that immediately under the n emitter layer 15 to extend along the longitudinal direction of the n emitter layer 15.

As shown in FIG. 38, a polysilicon additional resistive layer 104 which is doped with an n-type impurity is then selectively formed on the lower major surface of the semiconductor substrate 160. The additional resistive layer 104 is formed to extend over the entire exposed surface of the n buffer layer 12 and portions of the lower surface of the p emitter layer 11 which are adjacent thereto. The formation of the additional resistive layer 104 is executed by forming a polysilicon film which is doped with an n-type impurity through CVD (chemical vapor deposition) on the lower major surface of the semiconductor substrate 160 and thereafter selectively removing this polysilicon film by photolithography. Therefore, it is possible to readily form the additional resistive layer 104 in a desired shape and a desired thickness. Further, it is possible to readily set resistivity of the additional resistive layer 104 by adjusting the 1561 dosage.

As shown in FIG. 39, selective etching is then performed to selectively remove the upper major surface of the semiconductor substrate 160, thereby retracting the exposed surface of the p base layer 14 from the upper surface of the n emitter layer 15.

Referring again to FIG. 1, the anode electrode 101 is formed to cover the lower surface of the semiconductor substrate 160 including the additional resistive layer 104. Further, the cathode electrode 2 and the gate electrodes 3 on the upper surfaces of the n emitter layer 15 and the p base layer 14 respectively. The GTO 100 is completed through the aforementioned steps.

15. Fourteenth Embodiment

A fabrication method which is suitable for fabricating the GTO 200 according to the second embodiment is now described. In order to fabricate the GTO 200, the steps shown in FIGS. 30 to 34 are first carried out.

Figure 40:
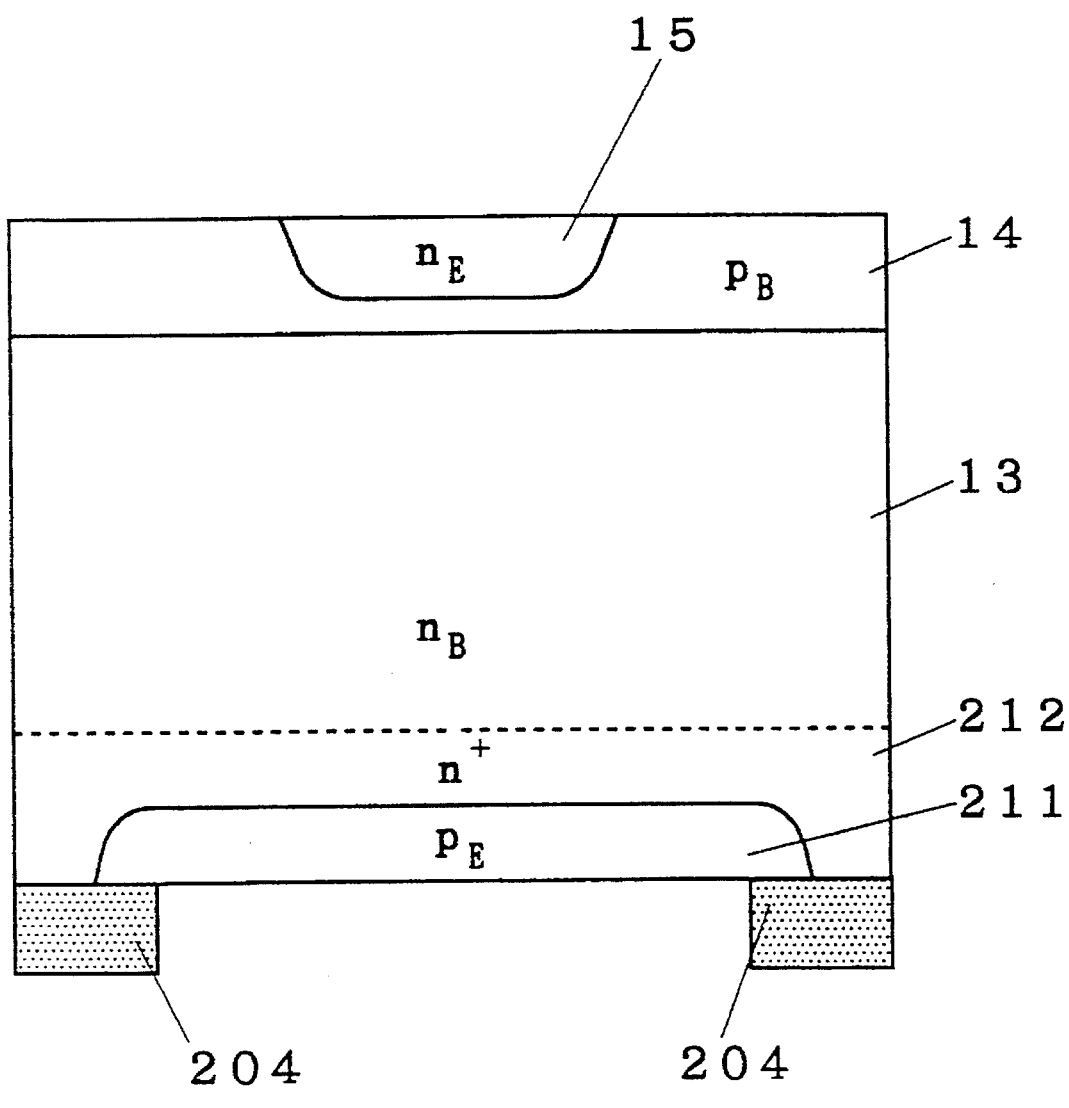
FIG. 40 illustrates a step of fabricating the GTO according to the second embodiment of the present invention.

Then, a step shown in a step diagram of FIG. 40 is carried out with no execution of the step shown in FIG. 35. Namely, additional resistive layers 204 formed by polysilicon films which are doped with an n-type impurity are selectively formed on the lower major surface of the semiconductor substrate 260. The additional resistive layers 204 are formed to extend over the entire exposed surface of the n buffer layer 212 and partial regions of the lower surface of the p emitter layer 211 which are adjacent thereto. The formation of the additional resistive layer 104 is executed by forming a polysilicon film which is doped with an n-type impurity by CVD (chemical vapor deposition) on the lower major surface of the semiconductor substrate 260 and thereafter selectively removing the polysilicon film by photolithography. Therefore, it is possible to readily adjust the shapes, the thicknesses and the resistivity of the additional resistive layers 204.

Similarly to the step shown in FIG. 36, selective etching is thereafter performed to selectively remove the upper major surface of the semiconductor substrate 160, thereby retracting the exposed surface of the p base layer 14 from the upper surface of the n emitter layer 15.

Referring again to FIG. 9, the anode electrode 201 is formed to cover the lower surface of the semiconductor substrate 260 including the additional resistive layers 204. Further, the cathode electrode 2 and the gate electrodes 3 are formed on the upper surfaces of the n emitter layer 15 and the n base layer 14 respectively. The GTO 200 is completed through the aforementioned steps.

16. Fifteenth Embodiment

A fabrication method which is suitable for fabricating the GTO 400 according to the fourth embodiment is now described. The method of fabricating the GTO 400 is characteristically different from the method described with reference to the fourteenth embodiment, in a step of forming the anode electrode 401. Referring to FIG. 13, the anode electrode 401 is formed to cover not the overall surfaces but parts of the additional resistive layers 404, while end portions thereof are selectively formed to be retracted from those of the p emitter layer 211. In other words, the anode electrode 401 is selectively formed to be connected with the additional resistive layers 404 in portions separated around the exposed surface of the n buffer layer 212.

17. Sixteenth Embodiment

A fabrication method which is suitable for fabricating the GTO 500 according to the fifth embodiment is now described. In order to fabricate the GTO 500, the steps shown in FIGS. 30 to 34 are first carried out.

Figure 41:
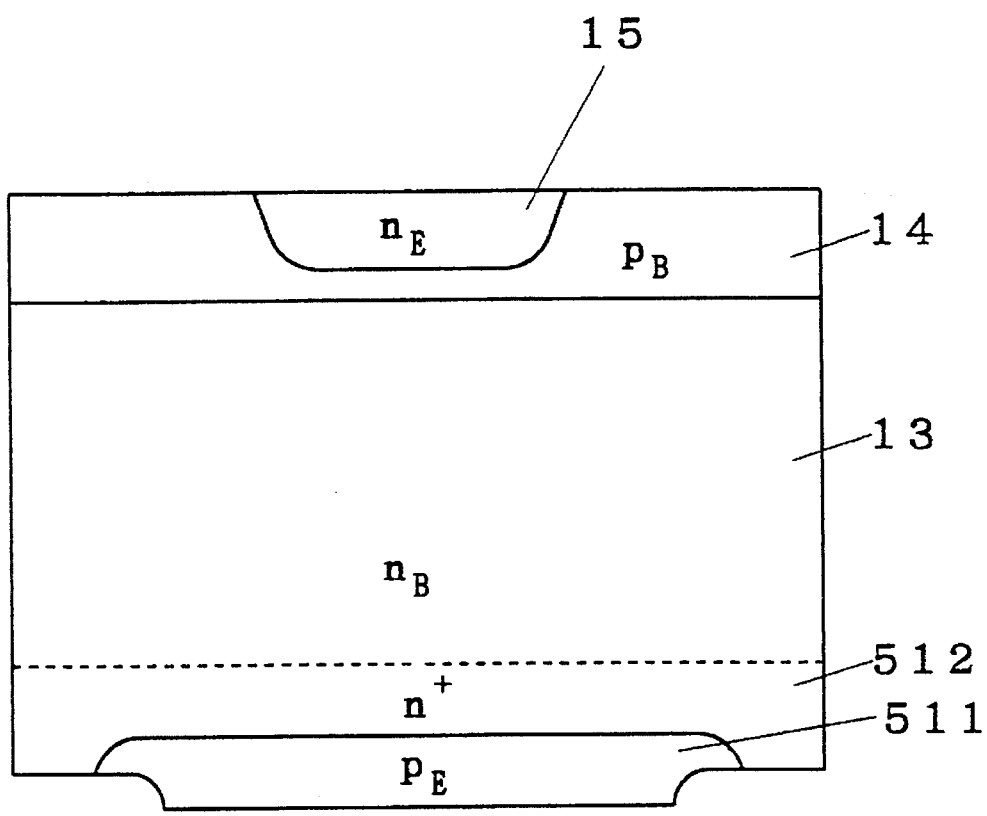
FIG. 41 illustrates a step of fabricating the GTO according to the fifth embodiment of the present invention.

Thereafter a step shown in FIG. 41 is carried out without executing the step shown in FIG. 35. Namely, selective etching treatment is performed on the lower major surface of the semiconductor substrate 560, thereby selectively removing the lower major surface by a constant depth. Such selectively removed regions extend over the entire surface of the n buffer layer 512 and partial regions of the lower surface of the p emitter layer 511 which are adjacent thereto.

Figure 42:
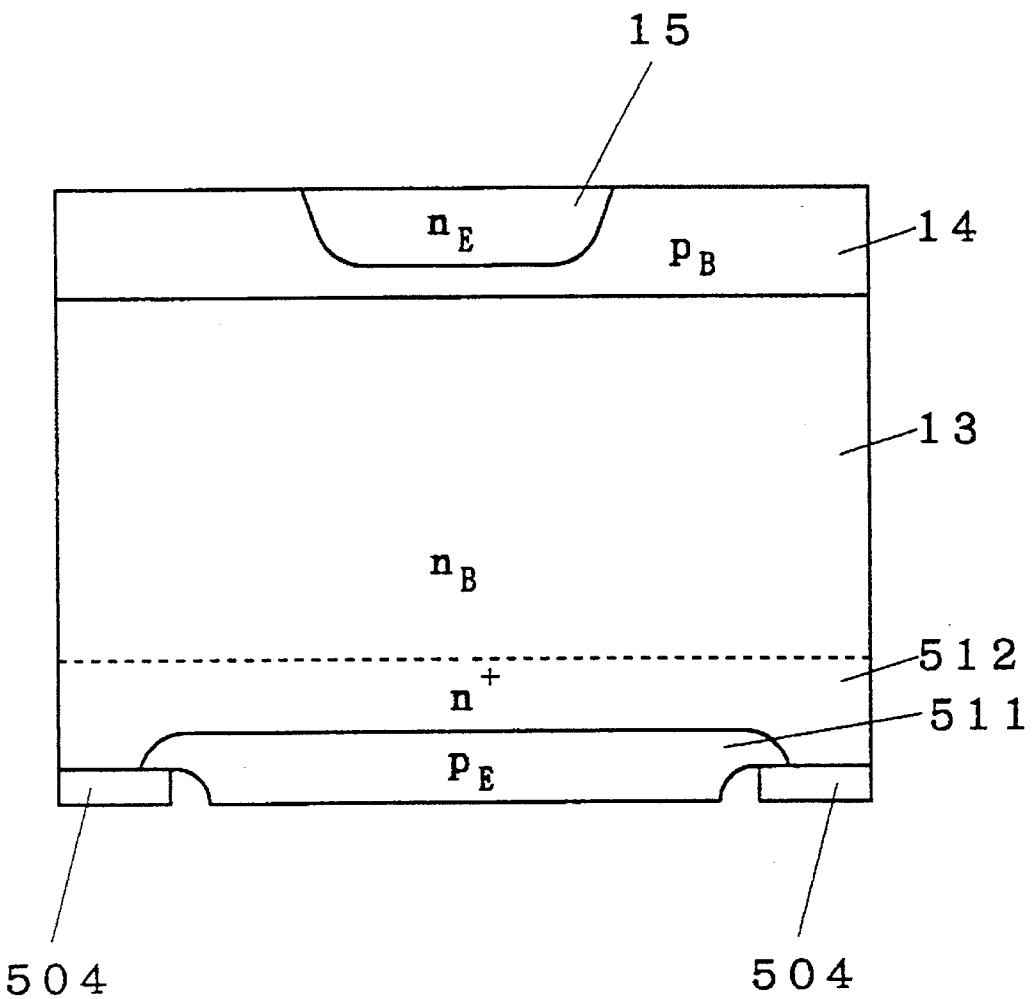
FIG. 42 illustrates a step of fabricating the GTO according to the fifth embodiment of the present invention.

As shown in FIG. 42, additional resistive layers 504 formed by polysilicon films which are doped with an n-type impurity are thereafter deposited on the selectively removed regions of the lower major surface of the semiconductor substrate 560. Consequently, the additional resistive layers 504 are connected to the entire surface of the n buffer layer 512 and partial regions of the lower surface of the p emitter layer 511 which are adjacent thereto.

The formation of the additional resistive layers 504 is executed by forming a polysilicon film which is doped with the n-type impurity by CVD (chemical vapor deposition) on the lower surface of the semiconductor substrate 560 and thereafter selectively removing the polysilicon film by photolithography. The thicknesses for depositing the additional resistive layers 504 are adjusted to be coincident to the depths of the removed portions on the lower major surface of the semiconductor substrate 560. Therefore, the lower surfaces of the additional resistive layers 504 are flush with that of the p emitter layer 511.

Thereafter selective etching is performed similarly to the step shown in FIG. 36 to selectively remove the upper major surface of the semiconductor substrate 560, thereby retracting the exposed surface of the p base layer 14 from the upper surface of the n emitter layer 15.

Referring again to FIG. 14, the anode electrode 501 is then formed to be connected to parts of the lower surfaces and single side surfaces of the additional resistive layers 504 and a portion of the lower surface of the p emitter layer 511 which is not covered with the additional resistive layers 504. Further, the anode electrode 501 is so formed that its end portions are retracted from those of the p emitter layer 511. In addition, the cathode electrode 2 and the gate electrodes 3 are formed on the upper surfaces of the n emitter layer 15 and the p base layer 14 respectively. The GTO 500 is completed through the aforementioned steps.

18. Seventeenth Embodiment

A fabrication method which is suitable for fabricating the GTO 600 according to the sixth embodiment is now described. The method of fabricating the GTO 600 is characteristically different from the method described with reference to the sixteenth embodiment, in a step of forming the additional resistive layers 604. Referring to FIG. 42, the additional resistive layers 504 (604) containing the impurity are formed not as polysilicon layers but by epitaxial growth. Therefore, it is possible to readily set impurity concentration in the additional resistive layers 604 regardless of the concentration in the n buffer layer 512, as well as to set values of the additional resistances $R_1$ over a wide range.

In order to form the additional resistive layers 604 by epitaxial growth, a screen film such as an oxide film may be formed on a region of the lower surface of the semiconductor substrate excluding those for forming the additional resistive layers 604, to thereafter execute CVD or the like. Thereafter the screen film is removed.

19. Eighteenth Embodiment

A fabrication method which is suitable for fabricating the GTO 700 according to the seventh embodiment is now described. In order to fabricate the GTO 700, the steps shown in FIGS. 30 to 34 and 41 are successively carried out.

Figure 43:
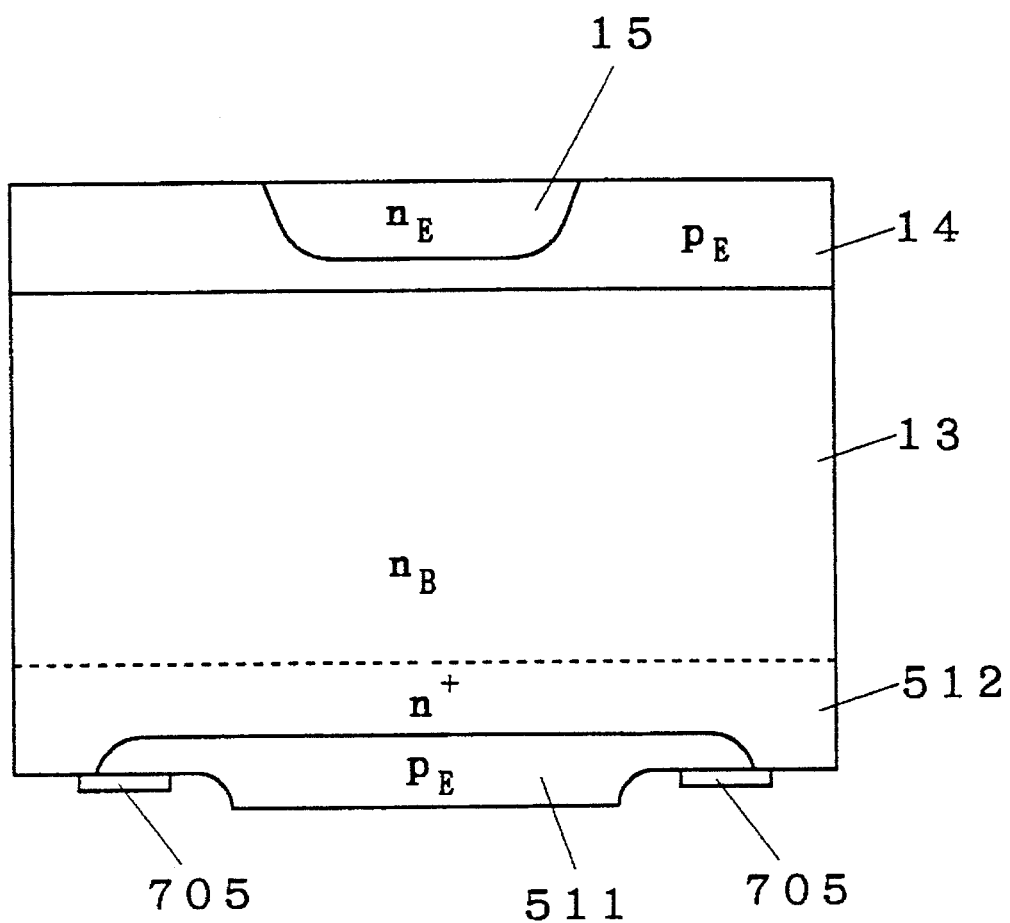
FIG. 43 illustrates a step of fabricating the GTO according to the seventh embodiment of the present invention.

Thereafter a step shown in FIG. 43 is executed to deposit oxide films for covering the junctions between the p emitter layer 511 and the n buffer layer 512 exposed on the regions which are selectively removed in the step shown in FIG. 41 and portions close thereto, thereby forming insulating films 705.

Thereafter selective etching is performed similarly to the step shown in FIG. 36 to selectively remove the upper major surface of the semiconductor substrate 760, thereby retracting the exposed surface of the p base layer 14 from the upper surface of the n emitter layer 15.

Figure 44:
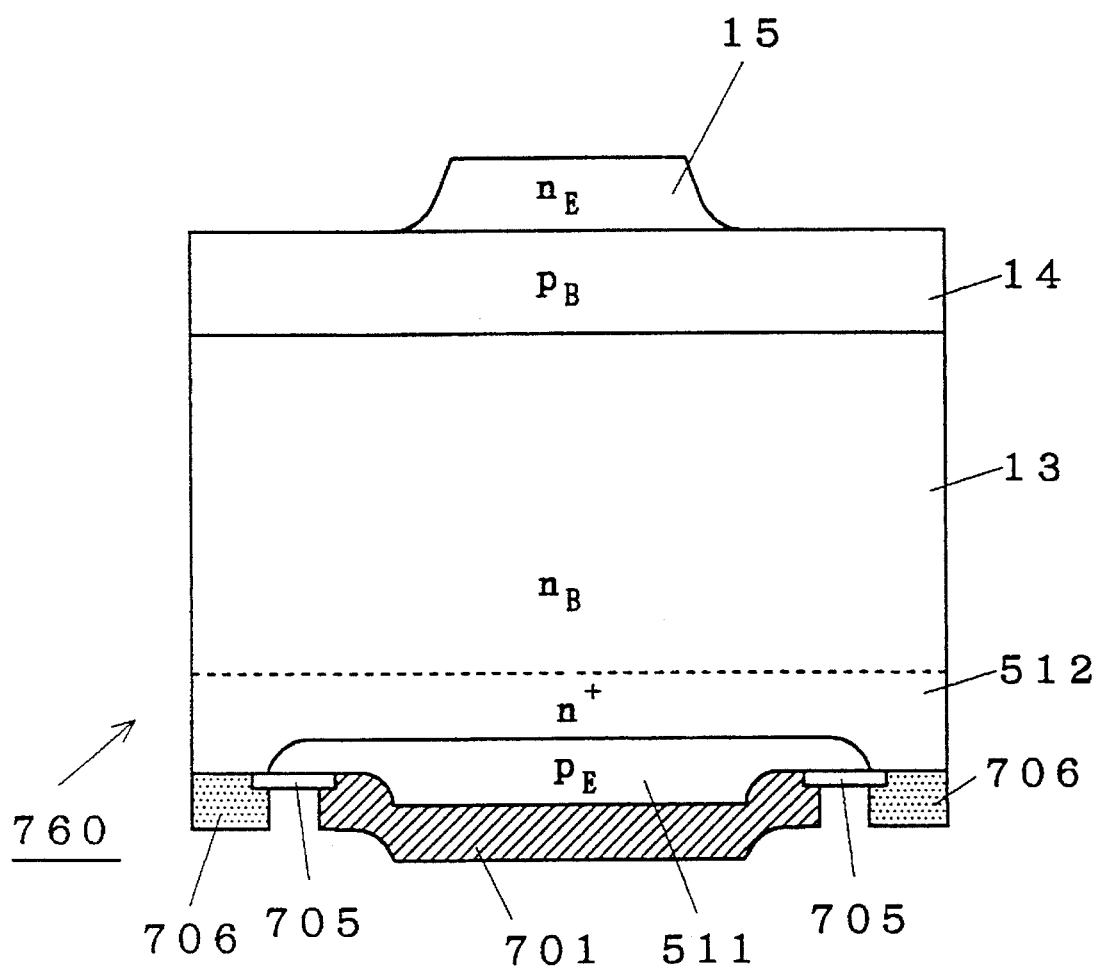
FIG. 44 illustrates a step of fabricating the GTO according to the seventh embodiment of the present invention.

Then, a step shown in FIG. 44 is carried out to form electrodes 706 which are mainly made of aluminum on regions of the lower surface of the n buffer layer 512 which are not covered with the insulating films 705, while forming an anode electrode 701 on a region of the lower surface of the p emitter layer 511 which is not covered with the insulating films 705. These electrodes are separated from each other, to define clearances on the insulating films 705.

In order to form these electrodes, a metal layer of aluminum or the like may be deposited on the overall lower surface of the semiconductor substrate 560, for example, so that selective etching is thereafter performed on portions deposited on the insulating films 705 for removing the same.

Figure 45:
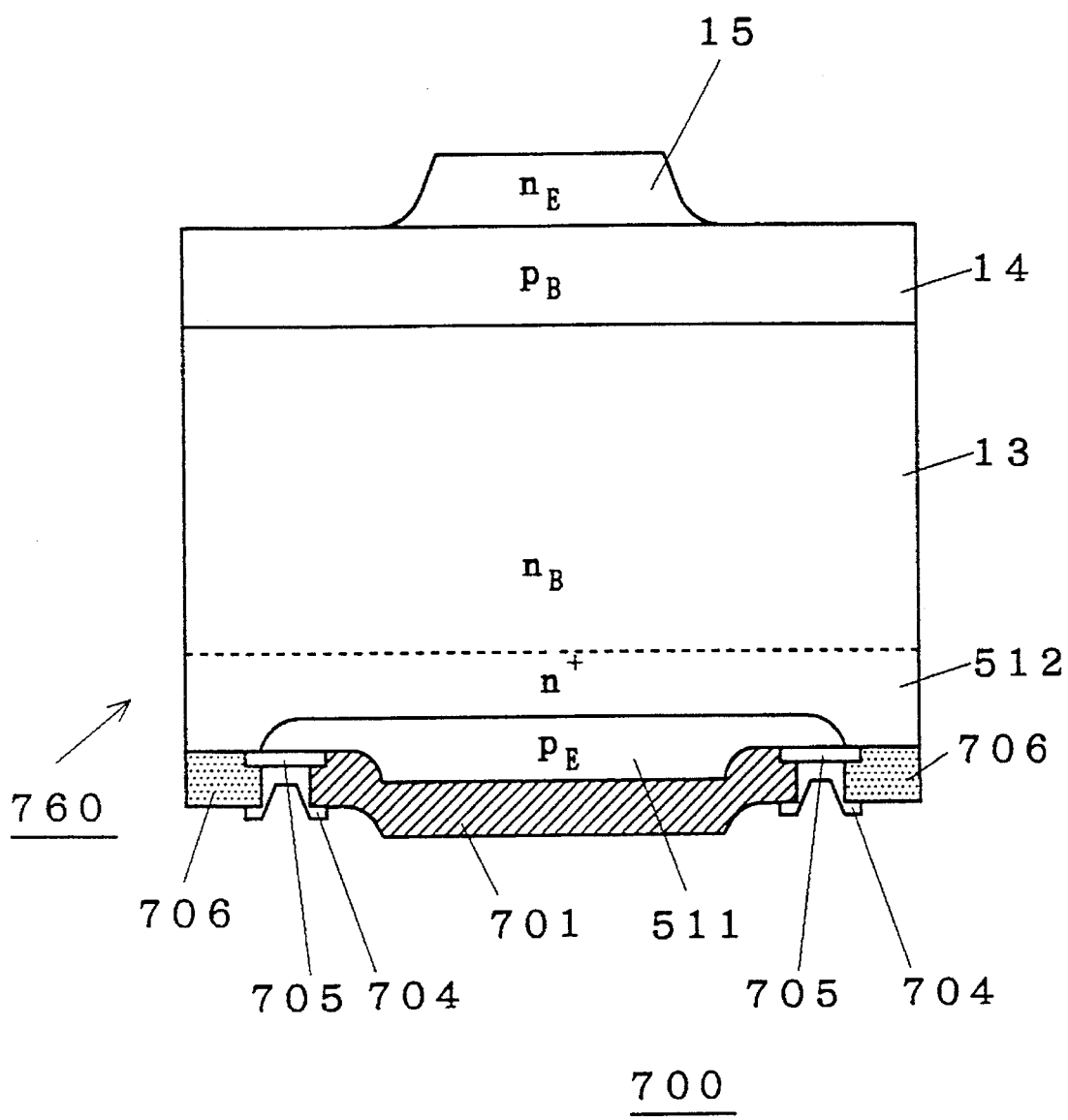
FIG. 45 illustrates a step of fabricating the GTO according to the seventh embodiment of the present invention.

As shown in FIG. 45, polysilicon films containing an impurity are then deposited on the clearances between the anode electrode 701 and the electrodes 706, thereby forming the additional resistive layers 704.

Referring again to FIG. 17, the cathode electrode 2 and the gate electrodes 3 are formed on the upper surfaces of the n emitter layer 15 and the p base layer 14 respectively. The GTO 700 is completed through the aforementioned steps.

20. Nineteenth Embodiment

A fabrication method which is suitable for fabricating the GTO 800 according to the eighth embodiment of the present invention is now described. The GTO 800 is obtained on the basis of the method of fabricating the GTO according to each embodiment, by providing the connecting portion between each additional resistive layer and each n buffer layer in the form of a strip intersecting with each n emitter layer 15 in a portion close to its central portion along its longitudinal direction. In the thirteenth embodiment for fabricating the GTO 100, for example, the connecting portion between the additional resistive layer 104 and each n buffer layer may be provided in the form of strips intersecting with each n emitter layer 15 in a portion close to its central portion in place of the formation along the n emitter layer 15.

In the method according to this embodiment, the additional resistive layer 804 is thus formed to intersect with each n emitter layer 15, whereby it is possible to readily form the additional resistive layer 104 immediately under the n emitter layer 15 with no precise alignment between arrangement of a mask pattern for forming the n emitter layer 15 in the step shown in FIG. 33 and that of a mask pattern for forming the p emitter layer 11 in the step shown in FIG. 37 or that of a mask pattern for forming the additional resistive layer 104 in the step shown in FIG. 38, for example. Namely, no strict accuracy is required for alignment of the mask patterns for forming these elements.

21. Twentieth Embodiment

A fabrication method which is suitable for fabricating the GTO 900 according to the ninth embodiment is now described. FIGS. 46 to 53 are fabrication step diagrams showing the fabrication method according to this embodiment. Among these figures, FIGS. 46 to 49 are sectional views taken along the line X—X (FIG. 3) similarly to FIG. 21, while FIGS. 50 to 53 are sectional views taken along the line Z—Z (FIG. 3) similarly to FIG. 22.

In order to fabricate the GTO 900, the steps shown in FIGS. 30 to 33 are executed similarly to the method of fabricating the GTO 100, in advance of the steps shown in FIGS. 46 to 53.

Thereafter the step shown in FIG. 37 is carried out to selectively introduce a p-type impurity into the lower surface of the n buffer layer 312 (912), thereby forming the p emitter layers 11 (911). The p emitter layers 911 are so formed that the n buffer layer 912 is selectively exposed on the lower major surface of the semiconductor substrate 1201 (960) in a portion corresponding to that immediately under the n emitter layer 15. Dissimilarly to the steps for fabricating the GTO 100, however, the p emitter layers 911 are so formed that the n buffer layer 912 is not in the form of extending along the longitudinal direction of the n emitter layer 15 but exposed in a portion corresponding to that immediately under the central portion of the n emitter layer 15.

Figure 46:
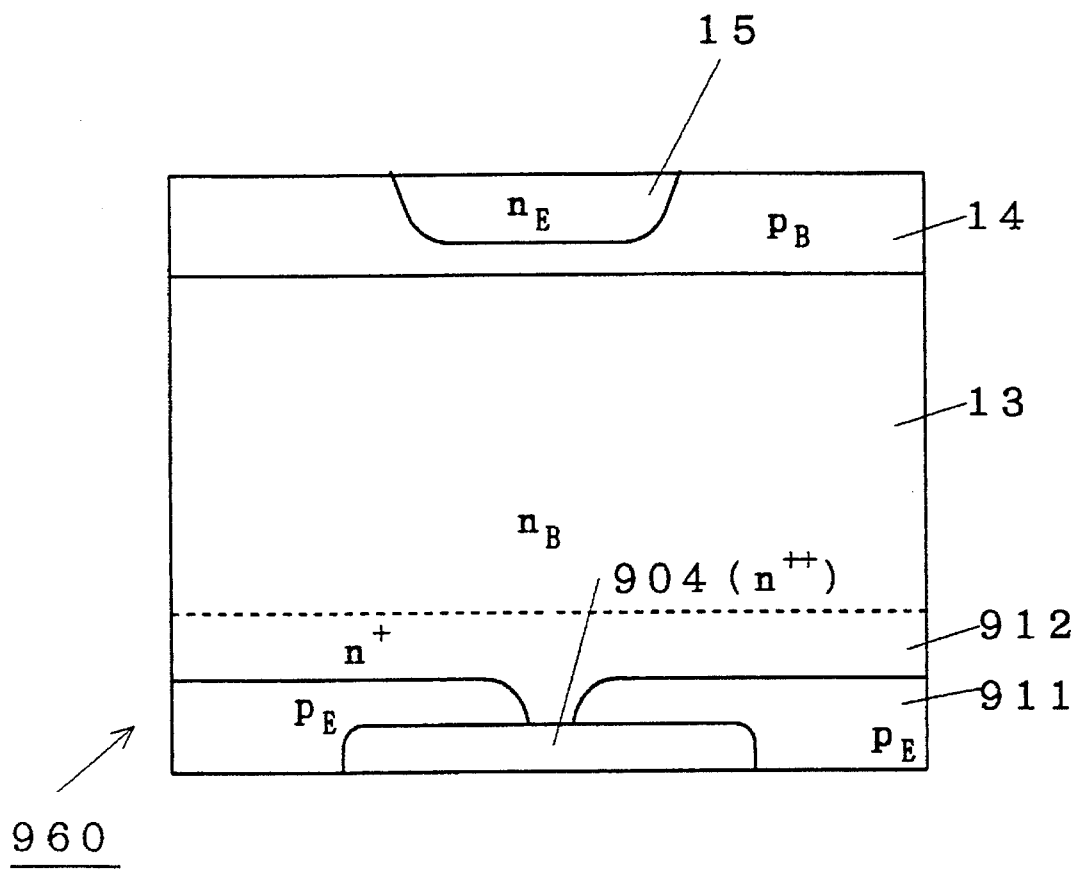
FIG. 46 illustrates a step of fabricating the GTO according to the ninth embodiment of the present invention.
Figure 50:
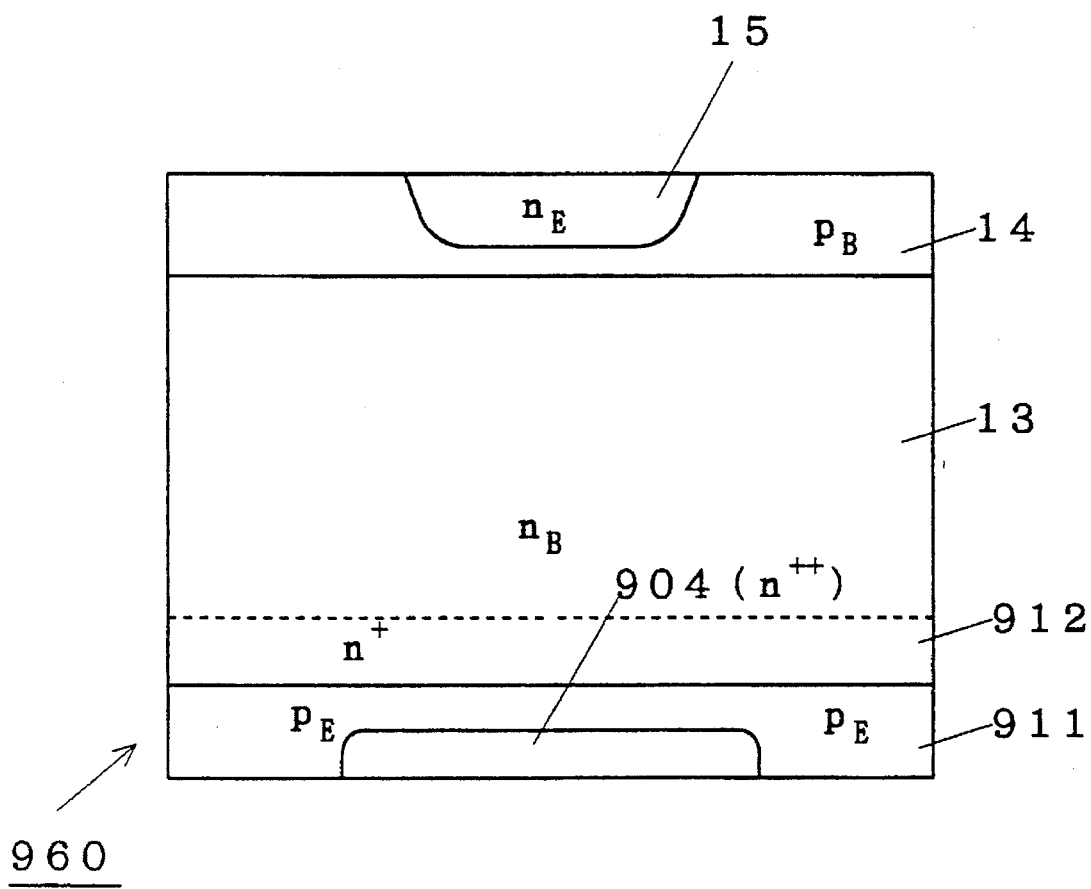
FIG. 50 illustrates a step of fabricating the GTO according to the ninth embodiment of the present invention.

As shown in FIGS. 46 and 50, an n-type impurity of high concentration is then selectively introduced into the lower major surface of the semiconductor substrate 960, thereby forming an additional resistive layer 904 as an n$^{++}$ semiconductor layer. This additional resistive layer 904 is provided in the form of an island extending along the longitudinal direction of the n emitter layer 15. Further, the additional resistive layer 904 is formed to cover the exposed surface of the n buffer layer 912, so that this exposed surface is positioned at the central portion of the additional resistive layer 904. Consequently, the upper surface of the additional resistive layer 904 and the lower surface of the n buffer layer 912 are connected with each other in the portion corresponding to that immediately under the central portion of the n emitter layer 15, while the upper and side surfaces of the additional resistive layer 904 excluding this connecting portion are enclosed with the adjacent p emitter layers 911.

Figure 47:
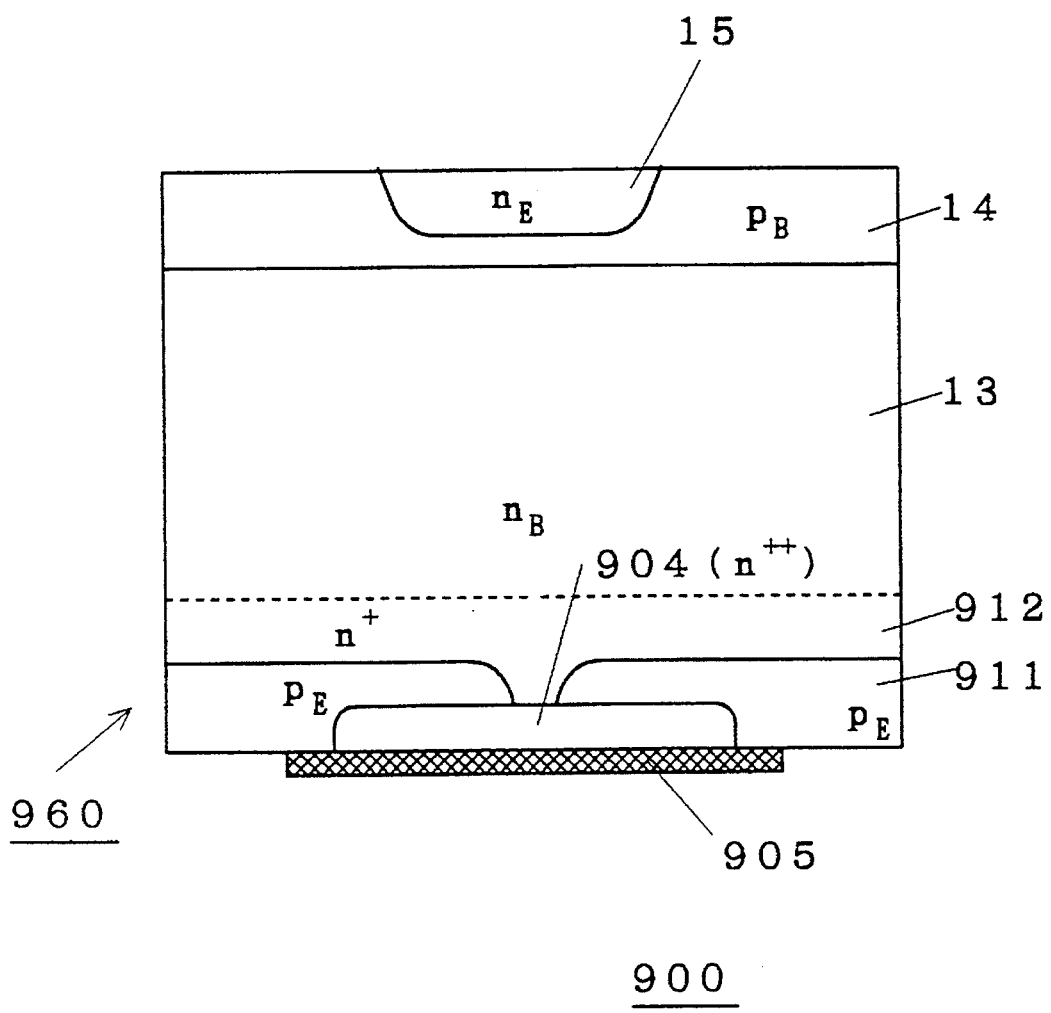
FIG. 47 illustrates a step of fabricating the GTO according to the ninth embodiment of the present invention.
Figure 51:
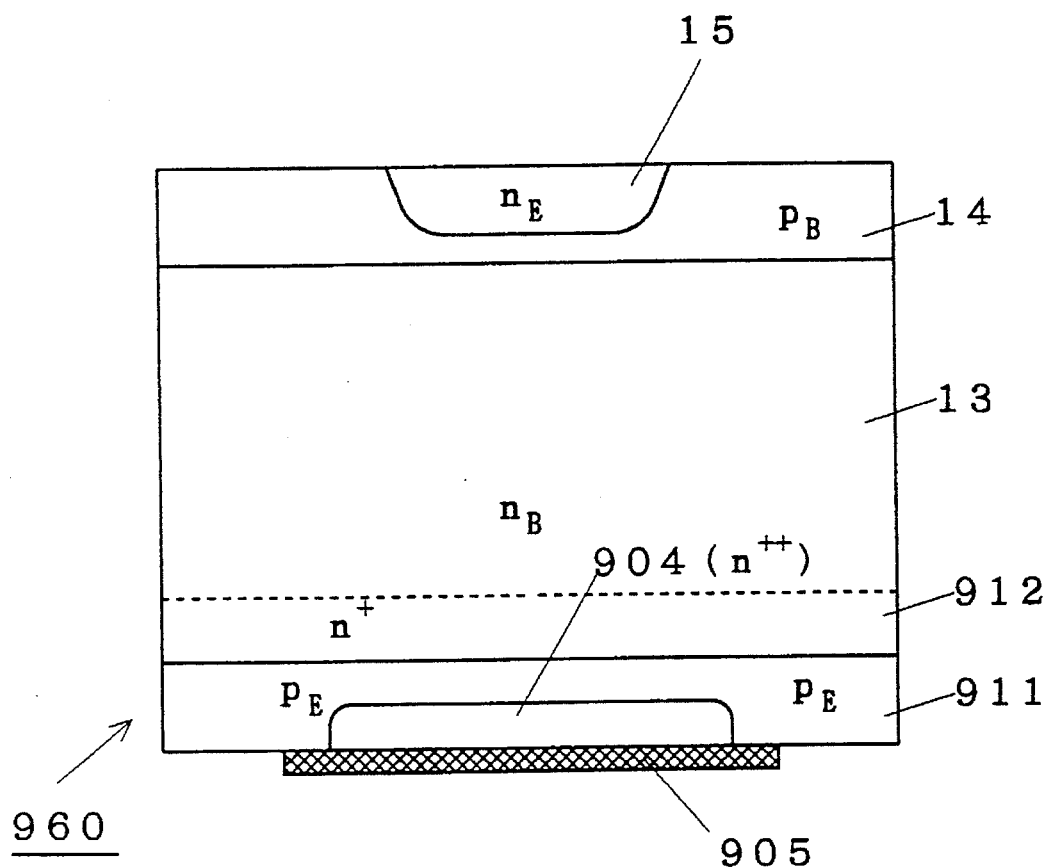
FIG. 51 illustrates a step of fabricating the GTO according to the ninth embodiment of the present invention.

As shown in FIGS. 47 and 51, an oxide film is then selectively deposited to cover the lower surface of the additional resistive layer 904 excluding both end portions, thereby forming an insulating film 905. In order to selectively deposit the oxide film, this oxide film may be deposited on the lower major surface of the semiconductor substrate 960 so that selective etching is thereafter performed for removing this oxide film, for example.

Figure 48:
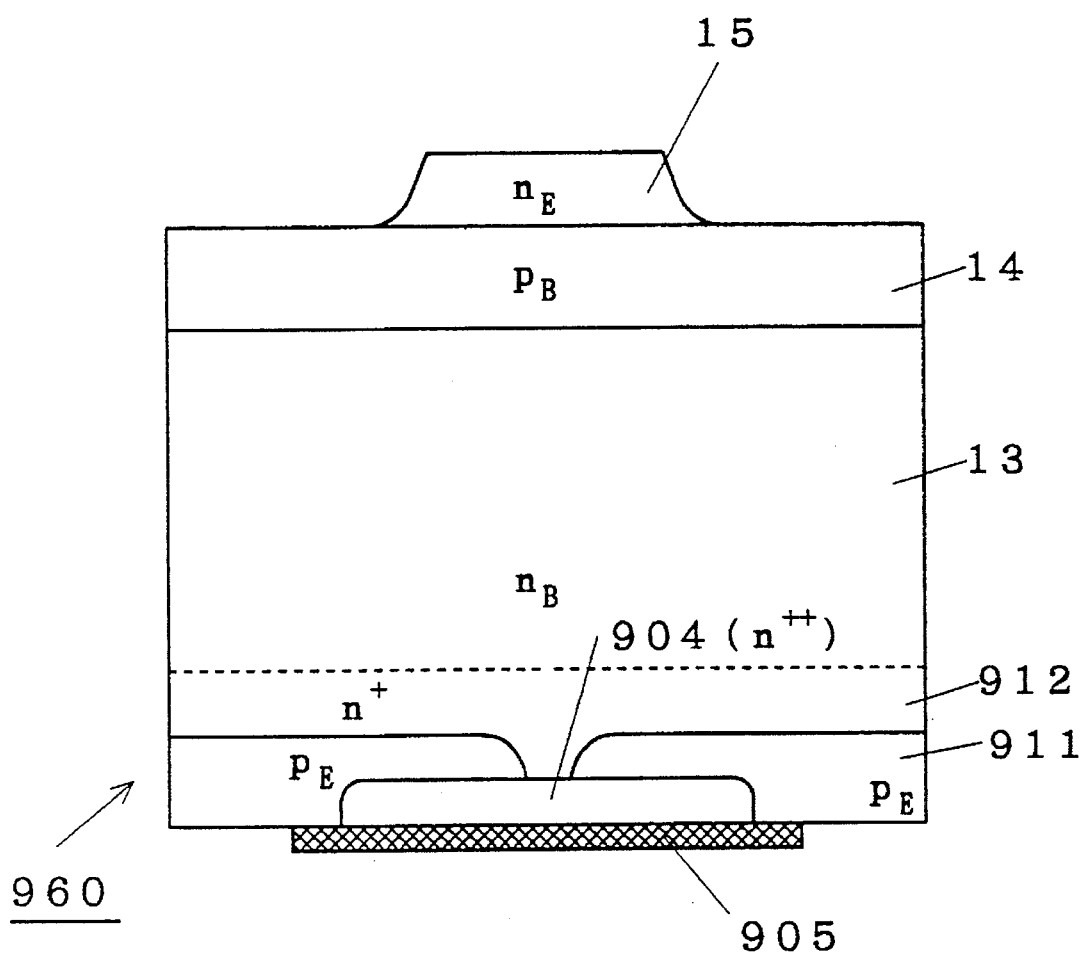
FIG. 48 illustrates a step of fabricating the GTO according to the ninth embodiment of the present invention.

As shown in FIGS. 48 and 52, selective etching is performed to selectively remove the upper major surface of the semiconductor substrate 960, thereby retracting the exposed surface of the p base layer 14 from the upper surface of the n emitter layer 15.

Figure 49:
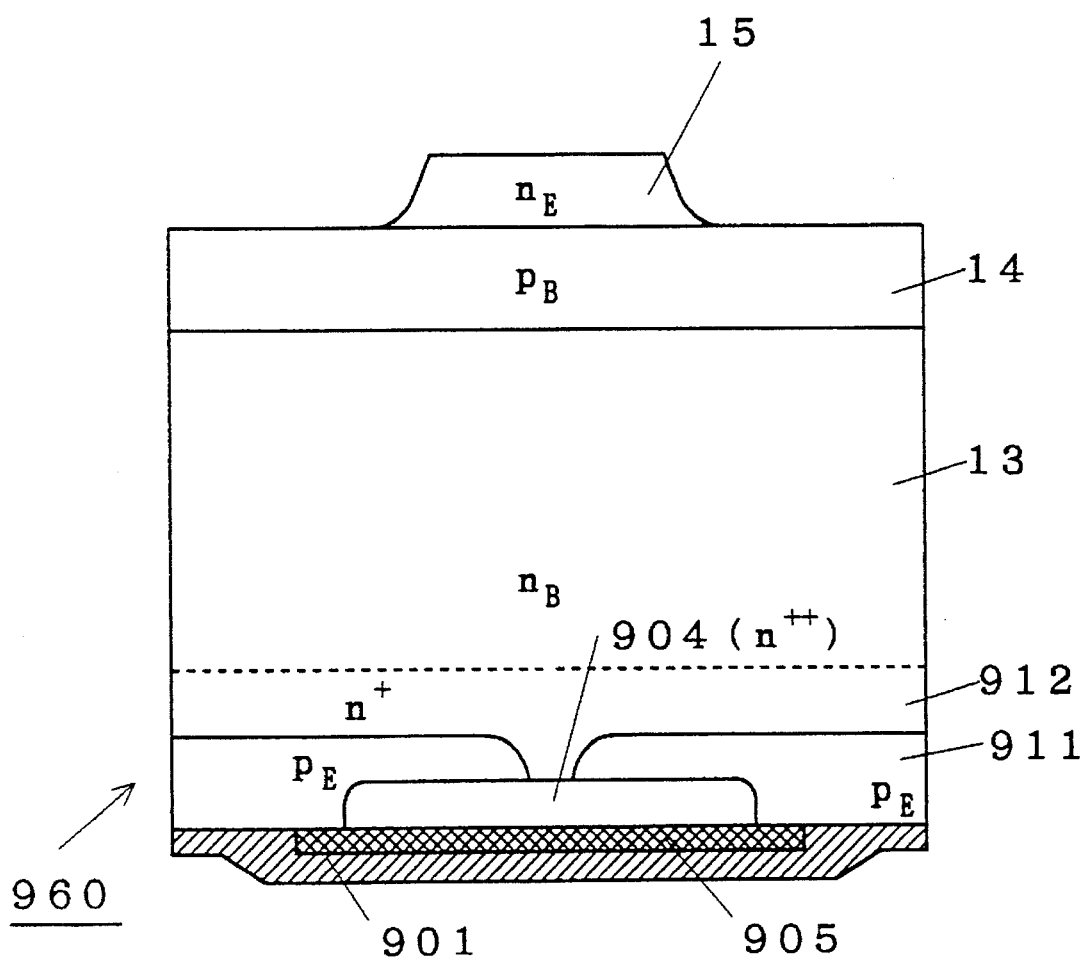
FIG. 49 illustrates a step of fabricating the GTO according to the ninth embodiment of the present invention.
Figure 53:
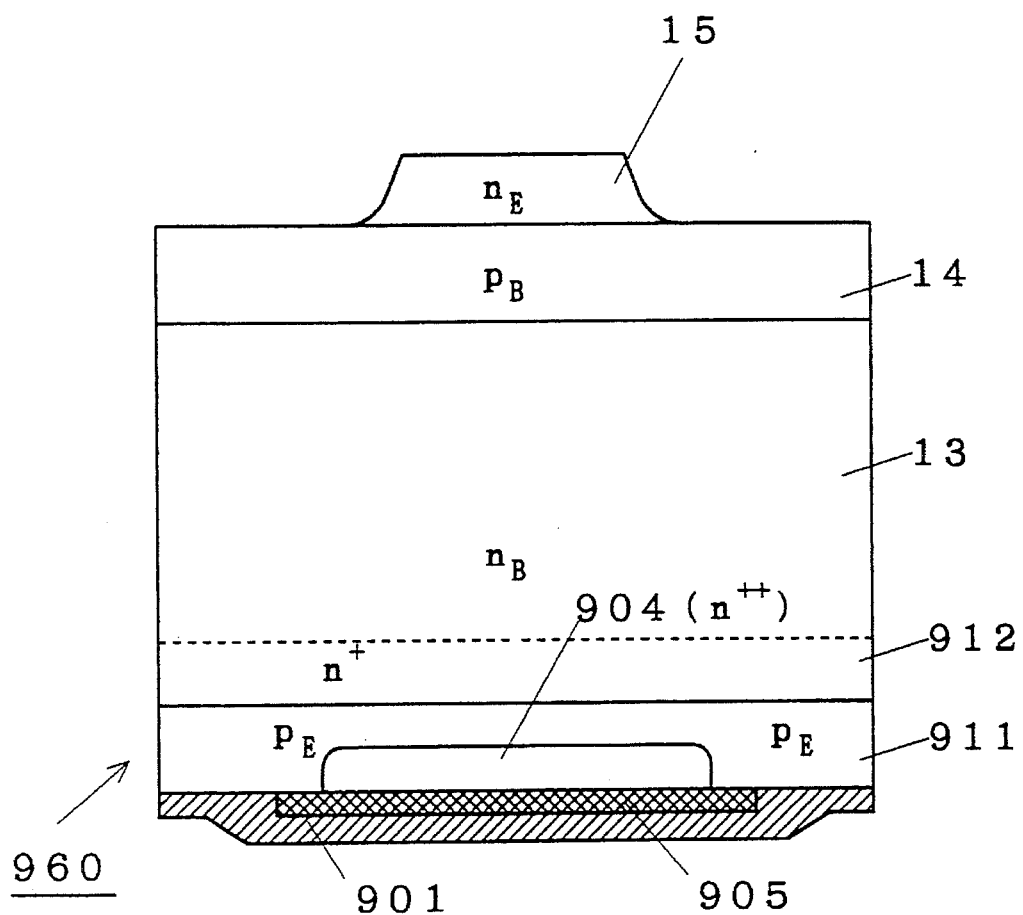
FIG. 53 illustrates a step of fabricating the GTO according to the ninth embodiment of the present invention.

As shown in FIGS. 49 and 53, a conductive metal such as aluminum is then deposited on the overall lower surface of the semiconductor substrate 960 including the insulating film 905, thereby forming an anode electrode 901. Consequently, the anode electrode 901 is connected to portions of the p emitter layers 911 which are not covered with the insulating film 905 and both end portions of the insulating film 905.

Referring again to FIGS. 20 to 22, the cathode electrode 2 and the gate electrodes 3 are formed on the upper surfaces of the n emitter layer 15 and the p base layer 14 respectively. The GTO 900 is completed through the aforementioned steps.

22. Twenty-First Embodiment

A fabrication method which is suitable for fabricating the GTO 1000 according to the tenth embodiment is now described. In order to fabricate the GTO 1000, the steps shown in FIGS. 30 to 33 are first carried out similarly to the twentieth embodiment, and then the step shown in FIG. 34 is executed in place of that shown in FIG. 37. Thereafter the steps shown in FIGS. 46 to 53 are carried out. At this time, the position of the exposed surface of the n buffer layer 912 is different from that in the twentieth embodiment, while the additional resistive layer 904 is provided in a form covering the exposed surface of the n buffer layer 912 in its central portion and extending along the n emitter layer 15. Therefore, the additional resistive layer 904 is formed on a position displaced from that immediately under the n emitter layer 15. Further, the insulating film 905 is formed to cover the lower surface of the additional resistive layer 904 excluding both end portions.

Thereafter the anode electrode 901, the cathode electrode 2 and the gate electrodes 3 are formed to complete the GTO 1000.

23. Twenty-Second Embodiment

Finally, a fabrication method which is suitable for fabricating the GTO 1100 according to the eleventh embodiment is described. The GTO 1100 is obtained on the basis of the method of fabricating the GTO 900 described with reference to the twentieth embodiment, by forming the p emitter layers 911 so that the n buffer layer 912 is exposed in the form of a strip intersecting with the n emitter layer 15 in a portion close to its central portion along its longitudinal direction on the lower major surface of the semiconductor substrate 960.

Therefore, it is possible to readily form the connecting portion between the n buffer layer 912 and the additional resistive layer 904 with no requirement for precise alignment between arrangement of a mask pattern for forming the p emitter layers 911 in the step shown in FIG. 37 and that of a mask pattern for forming the additional resistive layer 904 in the steps shown in FIGS. 46 and 50, for example. Namely, no strict accuracy is required for alignment of the mask patterns for forming these elements.

While the invention has been shown and described in detail, the foregoing description is in all aspects illustrative and not restrictive. It is therefore understood that numerous modifications and variations can be devised without departing from the scope of the invention.

What is claimed is:

1. A gate turnoff thyristor, comprising:

a semiconductor substrate having upper and lower surfaces, including a first emitter layer, a first base layer, a second base layer and a second emitter layer being successively stacked from said lower surface side with conductivity types being different from each other, and further including a buffer layer, being located between said first emitter layer and said first base layer, containing an impurity of the same conductivity type as said first base layer in higher concentration than said first base layer;

a first main electrode being connected to said lower surface of said semiconductor substrate, a second main electrode being connected to said upper surface of said semiconductor substrate, and a gate electrode being connected to said second base layer; and a resistive layer interposed between said semiconductor substrate and said first main electrode,
    said buffer layer being locally connected with said first main electrode through said resistive layer.

2. The gate turnoff thyristor in accordance with claim 1, wherein the ratio of resistance in said resistive layer to sheet resistance in said buffer layer is in the range of 1 to 5.

3. The gate turnoff thyristor in accordance with claim 1, wherein said buffer layer and said resistive layer are connected with each other around a portion immediately under a central portion of said second emitter layer.

4. The gate turnoff thyristor in accordance with claim 1, wherein said gate electrode is arranged to be opposed to said first main electrode, said buffer layer and said resistive layer being connected with each other in a portion immediately under said gate electrode.

5. The gate turnoff thyristor in accordance with claim 1, wherein said resistive layer substantially consists of a polycrystalline semiconductor containing an impurity.

6. The gate turnoff thyristor in accordance with claim 1, wherein said resistive layer extends over the junction between said buffer layer and said first emitter layer to be connected to a partial region of said first emitter layer being adjacent to said junction, said first main electrode being connected with said resistive layer in a portion being retracted from said junction toward said first emitter layer.

7. The gate turnoff thyristor in accordance with claim 6, wherein said resistive layer contains an impurity in higher concentration than said buffer layer, and substantially consists of a semiconductor layer being isometric with said semiconductor substrate.

8. A gate turnoff thyristor, comprising:

a semiconductor substrate having upper and lower surfaces, including a first emitter layer, a first base layer, a second base layer and a second emitter layer being successively stacked from said lower surface side with conductivity types being different from each other, and further including a buffer layer, being located between said first emitter layer and said first base layer, containing an impurity of the same conductivity type as said first base layer in higher concentration than said first base layer; and a first main electrode being connected to said lower surface of said semiconductor substrate, a second main electrode being connected to said upper surface of said semiconductor substrate, and a gate electrode being connected to said second base layer, said semiconductor substrate further including a resistive layer, said resistive layer extending over the junction between said buffer layer and said first emitter layer to be connected to a partial region of said first emitter layer being adjacent to said junction, said first main electrode being connected with said resistive layer in a portion being retracted from said junction toward said first emitter layer, said buffer layer being locally connected with said first main electrode through said resistive layer.

9. The gate turnoff thyristor in accordance with claim 8, wherein the surface of said first main electrode is not outwardly protrusive beyond a region being connected to said first emitter layer in a portion being connected to said resistive layer.

10. The gate turnoff thyristor in accordance with claim 9, wherein a connection surface between said resistive layer and said first main electrode is not protrusive from that between said first emitter layer and said first main electrode.

11. The gate turnoff thyristor in accordance with claim 8, wherein said second emitter layer is formed in a shape unidirectionally extending along said upper surface of said semiconductor substrate, said buffer layer and said resistive layer being connected with each other in a portion immediately under that around a central portion of said second emitter layer along a strip region being perpendicular to the longitudinal direction of said second emitter layer.

12. The gate turnoff thyristor in accordance with claim 1, wherein an insulating film is formed over the junction between said buffer layer and said first emitter being exposed on said surface of said semiconductor substrate and in the vicinity thereof, and a conductive layer is connected to a surface of said buffer layer to be separated from said first main electrode with a clearance on a surface of said insulating film, said resistive layer being so formed as to connect said first main electrode and said conductive layer with each other in said clearance.

13. The gate turnoff thyristor in accordance with claim 8, wherein said resistive layer contains an impurity of the same conductivity type with said buffer layer in higher concentration than said buffer layer and substantially consists of a semiconductor layer being selectively formed on said lower surface of said semiconductor substrate in a unidirectionally extending shape, said resistive layer being connected with said buffer layer only in its central portion while being connected with said first main electrode only in its both end portions.

14. The gate turnoff thyristor in accordance with claim 13, wherein said second emitter layer is formed in a shape unidirectionally extending along said upper surface of said semiconductor substrate, and said buffer layer is formed to be exposed on said lower surface of said semiconductor substrate in a portion immediately under that around a central portion of said second emitter layer along a strip region being perpendicular to the longitudinal direction of said second emitter layer, said resistive layer being formed in a portion being immediately under said second emitter layer along the longitudinal direction of said second emitter layer.

15. A gate turnoff thyristor, comprising:

a semiconductor substrate having upper and lower surfaces, including a first emitter layer, a first base layer, a second base layer and a second emitter layer being successively stacked from said lower surface side with conductivity types being different from each other, and further including a buffer layer, being located between said first emitter layer and said first base layer, containing an impurity of the same conductivity type as said first base layer in higher concentration than said first base layer; and a first main electrode being connected to said lower surface of said semiconductor substrate, a second main electrode being connected to said upper surface of said semiconductor substrate, and a gate electrode being connected to said second base layer, said semiconductor substrate further including a resistive layer, said buffer layer being locally connected with said first main electrode through said resistive layer, wherein an insulating film is formed over the junction between said buffer layer and said first emitter being exposed on said surface of said semiconductor substrate and in the vicinity thereof, and a conductive layer is connected to a surface of said buffer layer to be separated from said first main electrode with a clearance on a surface of said insulating film, said resistive layer being so formed as to connect said first main electrode and said conductive layer with each other in said clearance.

16. The gate turnoff thyristor in accordance with claim 1, wherein the resistance value of said resistive layer across said buffer layer and said first main electrode is about several 10 Å.

17. The gate turnoff thyristor in accordance with claim 1, further comprising:

a first thermal compensator being in contact with said first main electrode, a second thermal compensator being in contact with said second main electrode, a first external electrode being in contact with said first thermal compensator, a second external electrode being in contact with said second thermal compensator, an envelope supporting said first and second external electrodes for outwardly exposing outer end surfaces of said first and second external electrodes and storing said semiconductor substrate and said first and second thermal compensators, and an external gate electrode having an end being outwardly exposed from said envelope and another end being connected to said gate electrode, said first and second external electrodes substantially consisting of copper, said first and second thermal compensators substantially consisting of conductors having thermal expansion coefficients being at intermediate values of those of said semiconductor substrate and said first and second external electrodes.

\* \* \* \* \*